United States Patent
Ohta

(10) Patent No.: US 7,289,371 B2
(45) Date of Patent: Oct. 30, 2007

(54) SEMICONDUCTOR MEMORY DEVICE AND ELECTRONIC EQUIPMENT

(75) Inventor: Yoshiji Ohta, Kashiwara (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 18 days.

(21) Appl. No.: 11/401,369

(22) Filed: Apr. 11, 2006

(65) Prior Publication Data

US 2006/0239071 A1    Oct. 26, 2006

(30) Foreign Application Priority Data

Apr. 12, 2005 (JP) ............................. P2005-114460
May 10, 2005 (JP) ............................. P2005-137528
Oct. 5, 2005 (JP) ............................. P2005-292564

(51) Int. Cl.
*G11C 7/00* (2006.01)
*G11C 8/00* (2006.01)

(52) U.S. Cl. ........................... 365/189.01; 365/185.24; 365/189.07; 365/236; 365/204

(58) Field of Classification Search .......... 365/189.01, 365/185.24, 200, 189.07, 204, 236
See application file for complete search history.

(56) References Cited

U.S. PATENT DOCUMENTS 6,687,155 B2 *  2/2004  Nagasue .................. 365/185.03
6,912,160 B2     6/2005  Yamada

FOREIGN PATENT DOCUMENTS

JP        2002-279789 A        9/2002
JP        2004-273093 A        9/2004

* cited by examiner

*Primary Examiner*—Son Dinh
(74) *Attorney, Agent, or Firm*—Birch, Stewart, Kolasch & Birch, LLP

(57) ABSTRACT

A semiconductor memory device has a memory cell array in which a plurality of nonvolatile memory cells are arranged. The memory device also has word lines, bit lines connected with the memory cells by a virtual grounding scheme, a row decoder, shift registers, a write voltage control circuit for controlling voltages to be applied to bit lines, and a write voltage applying circuit for applying voltages to the bit lines. The write voltage control circuit controls the write voltage applying circuit such that when writing data 1 to a memory cell, different voltages V0 and VP are applied to two bit lines associated with the memory cell, while a same voltage V0 or VP is applied to the two bit lines when writing data 0 to the memory cell.

28 Claims, 38 Drawing Sheets

Write of Data "1011001010···"

Write of Data "00···"

Write of Data "01···"

Write of Data "10···"

Write of Data "11···"

Write of Data "00···"

Write of Data "01···"

Write of Data "10···"

Write of Data "11···"

Fig.10

| Input Data | First Conversion Data (First Write) | Second Conversion Data (Second Write) |
|---|---|---|
| 0 0 0 0 | 0 0 0 0 | 0 0 0 0 |
| 0 0 0 1 | 0 0 0 1 | 0 0 0 0 |
| 0 0 1 0 | 0 0 1 0 | 0 0 0 0 |
| 0 0 1 1 | 0 0 1 1 | 0 0 0 0 |
| 0 1 0 0 | 0 1 0 0 | 0 0 0 0 |
| 0 1 0 1 | 0 0 0 1 | 0 1 0 0 |
| 0 1 1 0 | 0 1 1 0 | 0 0 0 0 |
| 0 1 1 1 | 0 1 1 1 | 0 0 0 0 |
| 1 0 0 0 | 1 0 0 0 | 0 0 0 0 |
| 1 0 0 1 | 1 0 0 1 | 0 0 0 0 |
| 1 0 1 0 | 0 0 1 0 | 1 0 0 0 |
| 1 0 1 1 | 1 0 0 0 | 0 0 1 1 |
| 1 1 0 0 | 1 1 0 0 | 0 0 0 0 |
| 1 1 0 1 | 0 0 0 1 | 1 1 0 0 |
| 1 1 1 0 | 1 1 1 0 | 0 0 0 0 |
| 1 1 1 1 | 1 1 1 1 | 0 0 0 0 |

Fig. 11

| Input Data | First Conversion Data (First Write) | Second Conversion Data (Second Write) | Third Conversion Data (Third Write) |
|---|---|---|---|
| 000000 | 000000 | 000000 | 000000 |
| 000001 | 000001 | 000000 | 000000 |
| 000010 | 000010 | 000000 | 000000 |
| 000011 | 000011 | 000000 | 000000 |
| 000100 | 000100 | 000000 | 000000 |
| 000101 | 000001 | 000100 | 000000 |
| 000110 | 000110 | 000000 | 000000 |
| 000111 | 000111 | 000000 | 000000 |
| 001000 | 001000 | 000000 | 000000 |
| 001001 | 001001 | 000000 | 000000 |
| 001010 | 000010 | 001000 | 000000 |
| 001011 | 001000 | 000011 | 000000 |
| 001100 | 001100 | 000000 | 000000 |
| 001101 | 000001 | 001100 | 000000 |
| 001110 | 001110 | 000000 | 000000 |
| 001111 | 001111 | 000000 | 000000 |
| 010000 | 010000 | 000000 | 000000 |
| 010001 | 000001 | 010000 | 000000 |
| 010010 | 010010 | 000000 | 000000 |
| 010011 | 010011 | 000000 | 000000 |
| 010100 | 000100 | 010000 | 000000 |
| 010101 | 000001 | 000100 | 010000 |
| 010110 | 000110 | 010000 | 000000 |
| 010111 | 010000 | 000111 | 000000 |
| 011000 | 011000 | 000000 | 000000 |
| 011001 | 011001 | 000000 | 000000 |
| 011010 | 000010 | 011000 | 000000 |
| 011011 | 000011 | 011000 | 000000 |
| 011100 | 011100 | 000000 | 000000 |
| 011101 | 000001 | 011100 | 000000 |
| 011110 | 011110 | 000000 | 000000 |
| 011111 | 011111 | 000000 | 000000 |

Fig.12

| Input Data | First Conversion Data (First Write) | Second Conversion Data (Second Write) | Third Conversion Data (Third Write) |
|---|---|---|---|
| 1 0 0 0 0 0 | 1 0 0 0 0 0 | 0 0 0 0 0 0 | 0 0 0 0 0 0 |
| 1 0 0 0 0 1 | 1 0 0 0 0 1 | 0 0 0 0 0 0 | 0 0 0 0 0 0 |
| 1 0 0 0 1 0 | 0 0 0 0 1 0 | 1 0 0 0 0 0 | 0 0 0 0 0 0 |
| 1 0 0 0 1 1 | 0 0 0 0 1 1 | 1 0 0 0 0 0 | 0 0 0 0 0 0 |
| 1 0 0 1 0 0 | 1 0 0 1 0 0 | 0 0 0 0 0 0 | 0 0 0 0 0 0 |
| 1 0 0 1 0 1 | 1 0 0 0 0 1 | 0 0 0 1 0 0 | 0 0 0 0 0 0 |
| 1 0 0 1 1 0 | 1 0 0 1 1 0 | 0 0 0 0 0 0 | 0 0 0 0 0 0 |
| 1 0 0 1 1 1 | 1 0 0 1 1 1 | 0 0 0 0 0 0 | 0 0 0 0 0 0 |
| 1 0 1 0 0 0 | 0 0 1 0 0 0 | 1 0 0 0 0 0 | 0 0 0 0 0 0 |
| 1 0 1 0 0 1 | 0 0 1 0 0 1 | 1 0 0 0 0 0 | 0 0 0 0 0 0 |
| 1 0 1 0 1 0 | 0 0 0 0 1 0 | 0 0 1 0 0 0 | 1 0 0 0 0 0 |
| 1 0 1 0 1 1 | 0 0 0 0 1 1 | 0 0 1 0 0 0 | 1 0 0 0 0 0 |
| 1 0 1 1 0 0 | 0 0 1 1 0 0 | 1 0 0 0 0 0 | 0 0 0 0 0 0 |
| 1 0 1 1 0 1 | 1 0 0 0 0 1 | 0 0 1 1 0 0 | 0 0 0 0 0 0 |
| 1 0 1 1 1 0 | 1 0 0 0 0 0 | 0 0 1 1 1 0 | 0 0 0 0 0 0 |
| 1 0 1 1 1 1 | 1 0 0 0 0 0 | 0 0 1 1 1 1 | 0 0 0 0 0 0 |
| 1 1 0 0 0 0 | 1 1 0 0 0 0 | 0 0 0 0 0 0 | 0 0 0 0 0 0 |
| 1 1 0 0 0 1 | 0 0 0 0 0 1 | 1 1 0 0 0 0 | 0 0 0 0 0 0 |
| 1 1 0 0 1 0 | 1 1 0 0 1 0 | 0 0 0 0 0 0 | 0 0 0 0 0 0 |
| 1 1 0 0 1 1 | 1 1 0 0 1 1 | 0 0 0 0 0 0 | 0 0 0 0 0 0 |
| 1 1 0 1 0 0 | 0 0 0 1 0 0 | 1 1 0 0 0 0 | 0 0 0 0 0 0 |
| 1 1 0 1 0 1 | 0 0 0 0 0 1 | 0 0 0 1 0 0 | 1 1 0 0 0 0 |
| 1 1 0 1 1 0 | 0 0 0 1 1 0 | 1 1 0 0 0 0 | 0 0 0 0 0 0 |
| 1 1 0 1 1 1 | 1 1 0 0 0 0 | 0 0 0 1 1 1 | 0 0 0 0 0 0 |
| 1 1 1 0 0 0 | 1 1 1 0 0 0 | 0 0 0 0 0 0 | 0 0 0 0 0 0 |
| 1 1 1 0 0 1 | 1 1 1 0 0 1 | 0 0 0 0 0 0 | 0 0 0 0 0 0 |
| 1 1 1 0 1 0 | 0 0 0 0 1 0 | 1 1 1 0 0 0 | 0 0 0 0 0 0 |
| 1 1 1 0 1 1 | 0 0 0 0 1 1 | 1 1 1 0 0 0 | 0 0 0 0 0 0 |
| 1 1 1 1 0 0 | 1 1 1 1 0 0 | 0 0 0 0 0 0 | 0 0 0 0 0 0 |
| 1 1 1 1 0 1 | 0 0 0 0 0 1 | 1 1 1 1 0 0 | 0 0 0 0 0 0 |
| 1 1 1 1 1 0 | 1 1 1 1 1 0 | 0 0 0 0 0 0 | 0 0 0 0 0 0 |
| 1 1 1 1 1 1 | 1 1 1 1 1 1 | 0 0 0 0 0 0 | 0 0 0 0 0 0 |

Write of Data "00..."

Write of Data "01..."

Write of Data "10..."

Write of Data "11..."

Fig.19

| Input Data | First Conversion Data (First Write) | Second Conversion Data (Second Write) |
|---|---|---|
| 0 0 0 0 | 0 0 0 0 | 0 0 0 0 |
| 0 0 0 1 | 0 0 0 1 | 0 0 0 0 |
| 0 0 1 0 | 0 0 1 0 | 0 0 0 0 |
| 0 0 1 1 | 0 0 1 1 | 0 0 0 0 |
| 0 1 0 0 | 0 1 0 0 | 0 0 0 0 |
| 0 1 0 1 | 0 0 0 1 | 0 1 0 0 |
| 0 1 1 0 | 0 1 1 0 | 0 0 0 0 |
| 0 1 1 1 | 0 1 0 0 | 0 0 1 1 |
| 1 0 0 0 | 1 0 0 0 | 0 0 0 0 |
| 1 0 0 1 | 1 0 0 1 | 0 0 0 0 |
| 1 0 1 0 | 0 0 1 0 | 1 0 0 0 |
| 1 0 1 1 | 1 0 0 0 | 0 0 1 1 |
| 1 1 0 0 | 1 1 0 0 | 0 0 0 0 |
| 1 1 0 1 | 0 0 0 1 | 1 1 0 0 |
| 1 1 1 0 | 1 0 0 0 | 0 1 1 0 |
| 1 1 1 1 | 1 1 0 0 | 0 0 1 1 |

Fig.20

| Input Data | First Conversion Data (First Write) | Second Conversion Data (Second Write) | Third Conversion Data (Third Write) |
|---|---|---|---|
| 0 0 0 0 0 0 | 0 0 0 0 0 0 | 0 0 0 0 0 0 | 0 0 0 0 0 0 |
| 0 0 0 0 0 1 | 0 0 0 0 0 1 | 0 0 0 0 0 0 | 0 0 0 0 0 0 |
| 0 0 0 0 1 0 | 0 0 0 0 1 0 | 0 0 0 0 0 0 | 0 0 0 0 0 0 |
| 0 0 0 0 1 1 | 0 0 0 0 1 1 | 0 0 0 0 0 0 | 0 0 0 0 0 0 |
| 0 0 0 1 0 0 | 0 0 0 1 0 0 | 0 0 0 0 0 0 | 0 0 0 0 0 0 |
| 0 0 0 1 0 1 | 0 0 0 0 0 1 | 0 0 0 1 0 0 | 0 0 0 0 0 0 |
| 0 0 0 1 1 0 | 0 0 0 1 1 0 | 0 0 0 0 0 0 | 0 0 0 0 0 0 |
| 0 0 0 1 1 1 | 0 0 0 1 0 0 | 0 0 0 0 1 1 | 0 0 0 0 0 0 |
| 0 0 1 0 0 0 | 0 0 1 0 0 0 | 0 0 0 0 0 0 | 0 0 0 0 0 0 |
| 0 0 1 0 0 1 | 0 0 1 0 0 1 | 0 0 0 0 0 0 | 0 0 0 0 0 0 |
| 0 0 1 0 1 0 | 0 0 0 0 1 0 | 0 0 1 0 0 0 | 0 0 0 0 0 0 |
| 0 0 1 0 1 1 | 0 0 0 0 1 1 | 0 0 1 0 0 0 | 0 0 0 0 0 0 |
| 0 0 1 1 0 0 | 0 0 1 1 0 0 | 0 0 0 0 0 0 | 0 0 0 0 0 0 |
| 0 0 1 1 0 1 | 0 0 0 0 0 1 | 0 0 1 1 0 0 | 0 0 0 0 0 0 |
| 0 0 1 1 1 0 | 0 0 1 0 0 0 | 0 0 0 1 1 0 | 0 0 0 0 0 0 |
| 0 0 1 1 1 1 | 0 0 1 1 0 0 | 0 0 0 0 1 1 | 0 0 0 0 0 0 |
| 0 1 0 0 0 0 | 0 1 0 0 0 0 | 0 0 0 0 0 0 | 0 0 0 0 0 0 |
| 0 1 0 0 0 1 | 0 0 0 0 0 1 | 0 1 0 0 0 0 | 0 0 0 0 0 0 |
| 0 1 0 0 1 0 | 0 1 0 0 1 0 | 0 0 0 0 0 0 | 0 0 0 0 0 0 |
| 0 1 0 0 1 1 | 0 1 0 0 0 0 | 0 0 0 0 1 1 | 0 0 0 0 0 0 |
| 0 1 0 1 0 0 | 0 0 0 1 0 0 | 0 1 0 0 0 0 | 0 0 0 0 0 0 |
| 0 1 0 1 0 1 | 0 0 0 0 0 1 | 0 0 0 1 0 0 | 0 1 0 0 0 0 |
| 0 1 0 1 1 0 | 0 0 0 1 1 0 | 0 1 0 0 0 0 | 0 0 0 0 0 0 |
| 0 1 0 1 1 1 | 0 1 0 0 0 0 | 0 0 0 1 0 0 | 0 0 0 0 1 1 |
| 0 1 1 0 0 0 | 0 1 1 0 0 0 | 0 0 0 0 0 0 | 0 0 0 0 0 0 |
| 0 1 1 0 0 1 | 0 0 0 0 0 1 | 0 1 1 0 0 0 | 0 0 0 0 0 0 |
| 0 1 1 0 1 0 | 0 0 0 0 1 0 | 0 1 1 0 0 0 | 0 0 0 0 0 0 |
| 0 1 1 0 1 1 | 0 0 0 0 1 1 | 0 1 1 0 0 0 | 0 0 0 0 0 0 |
| 0 1 1 1 0 0 | 0 1 0 0 0 0 | 0 0 1 1 0 0 | 0 0 0 0 0 0 |
| 0 1 1 1 0 1 | 0 0 0 0 0 1 | 0 0 0 1 0 0 | 0 1 1 0 0 0 |
| 0 1 1 1 1 0 | 0 1 1 0 0 0 | 0 0 0 1 1 0 | 0 0 0 0 0 0 |
| 0 1 1 1 1 1 | 0 1 0 0 0 0 | 0 0 1 1 0 0 | 0 0 0 0 1 1 |

Fig.21

| Input Data | First Conversion Data (First Write) | Second Conversion Data (Second Write) | Third Conversion Data (Third Write) |
|---|---|---|---|
| 1 0 0 0 0 0 | 1 0 0 0 0 0 | 0 0 0 0 0 0 | 0 0 0 0 0 0 |
| 1 0 0 0 0 1 | 1 0 0 0 0 1 | 0 0 0 0 0 0 | 0 0 0 0 0 0 |
| 1 0 0 0 1 0 | 0 0 0 0 1 0 | 1 0 0 0 0 0 | 0 0 0 0 0 0 |
| 1 0 0 0 1 1 | 0 0 0 0 1 1 | 1 0 0 0 0 0 | 0 0 0 0 0 0 |
| 1 0 0 1 0 0 | 1 0 0 1 0 0 | 0 0 0 0 0 0 | 0 0 0 0 0 0 |
| 1 0 0 1 0 1 | 1 0 0 0 0 1 | 0 0 0 1 0 0 | 0 0 0 0 0 0 |
| 1 0 0 1 1 0 | 1 0 0 0 0 0 | 0 0 0 1 1 0 | 0 0 0 0 0 0 |
| 1 0 0 1 1 1 | 1 0 0 1 0 0 | 0 0 0 0 1 1 | 0 0 0 0 0 0 |
| 1 0 1 0 0 0 | 0 0 1 0 0 0 | 1 0 0 0 0 0 | 0 0 0 0 0 0 |
| 1 0 1 0 0 1 | 0 0 1 0 0 1 | 1 0 0 0 0 0 | 0 0 0 0 0 0 |
| 1 0 1 0 1 0 | 0 0 0 0 1 0 | 0 0 1 0 0 0 | 1 0 0 0 0 0 |
| 1 0 1 0 1 1 | 0 0 0 0 1 1 | 0 0 1 0 0 0 | 1 0 0 0 0 0 |
| 1 0 1 1 0 0 | 0 0 1 1 0 0 | 1 0 0 0 0 0 | 0 0 0 0 0 0 |
| 1 0 1 1 0 1 | 1 0 0 0 0 1 | 0 0 1 1 0 0 | 0 0 0 0 0 0 |
| 1 0 1 1 1 0 | 1 0 0 0 0 0 | 0 0 1 0 0 0 | 0 0 0 1 1 0 |
| 1 0 1 1 1 1 | 1 0 0 0 0 0 | 0 0 1 1 0 0 | 0 0 0 0 1 1 |
| 1 1 0 0 0 0 | 1 1 0 0 0 0 | 0 0 0 0 0 0 | 0 0 0 0 0 0 |
| 1 1 0 0 0 1 | 0 0 0 0 0 1 | 1 1 0 0 0 0 | 0 0 0 0 0 0 |
| 1 1 0 0 1 0 | 0 0 0 0 1 0 | 1 1 0 0 0 0 | 0 0 0 0 0 0 |
| 1 1 0 0 1 1 | 0 0 0 0 1 1 | 1 1 0 0 0 0 | 0 0 0 0 0 0 |
| 1 1 0 1 0 0 | 0 0 0 1 0 0 | 1 1 0 0 0 0 | 0 0 0 0 0 0 |
| 1 1 0 1 0 1 | 0 0 0 0 0 1 | 0 0 0 1 0 0 | 1 1 0 0 0 0 |
| 1 1 0 1 1 0 | 0 0 0 1 1 0 | 1 1 0 0 0 0 | 0 0 0 0 0 0 |
| 1 1 0 1 1 1 | 1 1 0 0 0 0 | 0 0 0 1 0 0 | 0 0 0 0 1 1 |
| 1 1 1 0 0 0 | 0 0 1 0 0 0 | 1 1 0 0 0 0 | 0 0 0 0 0 0 |
| 1 1 1 0 0 1 | 0 0 1 0 0 1 | 1 1 0 0 0 0 | 0 0 0 0 0 0 |
| 1 1 1 0 1 0 | 0 0 0 0 1 0 | 0 0 1 0 0 0 | 1 1 0 0 0 0 |
| 1 1 1 0 1 1 | 0 0 0 0 1 1 | 0 0 1 0 0 0 | 1 1 0 0 0 0 |
| 1 1 1 1 0 0 | 0 0 1 1 0 0 | 1 1 0 0 0 0 | 0 0 0 0 0 0 |
| 1 1 1 1 0 1 | 0 0 0 0 0 1 | 0 0 1 1 0 0 | 1 1 0 0 0 0 |
| 1 1 1 1 1 0 | 1 1 0 0 0 0 | 0 0 1 1 0 0 | 0 0 0 0 0 1 |
| 1 1 1 1 1 1 | 1 1 0 0 0 0 | 0 0 1 1 0 0 | 0 0 0 0 1 1 |

Fig. 24

| Input Data | Redundancy-Bit Added Data | First Conversion Data (First Write) | Second Conversion Data (Second Write) |
|---|---|---|---|
| 000000 | 0000000 | 0000000 | 0000000 |
| 000001 | 0000001 | 0000001 | 0000000 |
| 000010 | 0000010 | 0000010 | 0000000 |
| 000011 | 0000011 | 0000011 | 0000000 |
| 000100 | 0000100 | 0000100 | 0000000 |
| 000101 | 0000101 | 0000001 | 0000100 |
| 000110 | 0000110 | 0000110 | 0000000 |
| 000111 | 0000111 | 0000100 | 0000011 |
| 001000 | 0001000 | 0001000 | 0000000 |
| 001001 | 0001001 | 0001001 | 0000000 |
| 001010 | 0001010 | 0000010 | 0001000 |
| 001011 | 0001011 | 0000011 | 0001000 |
| 001100 | 0001100 | 0001100 | 0000000 |
| 001101 | 0001101 | 0000001 | 0001100 |
| 001110 | 0001110 | 0001000 | 0000110 |
| 001111 | 0001111 | 0001100 | 0000011 |
| 010000 | 0010000 | 0010000 | 0000000 |
| 010001 | 0010001 | 0000001 | 0010000 |
| 010010 | 0010010 | 0010010 | 0000000 |
| 010011 | 0010011 | 0010000 | 0000011 |
| 010100 | 0010100 | 0000100 | 0010000 |
| 010101 | 1000000 | 1000000 | 0000000 |
| 010110 | 0010110 | 0000110 | 0010000 |
| 010111 | 1000001 | 1000000 | 0000001 |
| 011000 | 0011000 | 0011000 | 0000000 |
| 011001 | 0011001 | 0000001 | 0011000 |
| 011010 | 0011010 | 0000010 | 0011000 |
| 011011 | 0011011 | 0000011 | 0011000 |
| 011100 | 0011100 | 0010000 | 0001100 |
| 011101 | 1000010 | 1000010 | 0000000 |
| 011110 | 0011110 | 0011000 | 0000110 |
| 011111 | 1000100 | 1000000 | 0000100 |

Fig.25

| Input Data | Redundancy-Bit Added Data | First Conversion Data (First Write) | Second Conversion Data (Second Write) |
|---|---|---|---|
| 100000 | 0100000 | 0100000 | 0000000 |
| 100001 | 0100001 | 0100001 | 0000000 |
| 100010 | 0100010 | 0000010 | 0100000 |
| 100011 | 0100011 | 0000011 | 0100000 |
| 100100 | 0100100 | 0100100 | 0000000 |
| 100101 | 0100101 | 0100001 | 0000100 |
| 100110 | 0100110 | 0100000 | 0000110 |
| 100111 | 0100111 | 0100100 | 0000011 |
| 101000 | 0101000 | 0001000 | 0100000 |
| 101001 | 0101001 | 0001001 | 0100000 |
| 101010 | 1001000 | 1001000 | 0000000 |
| 101011 | 1010000 | 1000000 | 0010000 |
| 101100 | 0101100 | 0001100 | 0100000 |
| 101101 | 0101101 | 0100001 | 0001100 |
| 101110 | 1100000 | 1100000 | 0000000 |
| 101111 | 1100001 | 1100000 | 0000001 |
| 110000 | 0110000 | 0110000 | 0000000 |
| 110001 | 0110001 | 0000001 | 0110000 |
| 110010 | 0110010 | 0000010 | 0110000 |
| 110011 | 0110011 | 0000011 | 0110000 |
| 110100 | 0110100 | 0000100 | 0110000 |
| 110101 | 1100010 | 1100000 | 0000010 |
| 110110 | 0110110 | 0000110 | 0110000 |
| 110111 | 1100100 | 1100000 | 0000100 |
| 111000 | 0111000 | 0001000 | 0110000 |
| 111001 | 0111001 | 0001001 | 0110000 |
| 111010 | 1101000 | 1100000 | 0001000 |
| 111011 | 1110000 | 1100000 | 0010000 |
| 111100 | 0111100 | 0001100 | 0110000 |
| 111101 | 1000011 | 1000000 | 0000011 |
| 111110 | 1000110 | 1000000 | 0000110 |
| 111111 | 1001100 | 1000000 | 0001100 |

SEMICONDUCTOR MEMORY DEVICE AND ELECTRONIC EQUIPMENT

CROSS-REFERENCES TO RELATED APPLICATIONS

This nonvolatile application claims priority under 35 U.S.C. § 119(a) on Patent Application Nos. 2005-114460, 2005-137528, and 2005-292564, filed in Japan on Apr. 12, 2005, May 10, 2005, and Oct. 5, 2005, the entire contents of which are hereby incorporated by reference.

BACKGROUND OF THE INVENTION

The present invention relates to a semiconductor memory device, and more particularly to a semiconductor memory device having nonvolatile memory cells such as flash memory cells or mask ROM (read only memory) cells.

In recent years, as semiconductor memories for data storage or code storage of mobile telephones, digital cameras, etc., nonvolatile memories such as flash memories in which data is not lost even if the power supply is off or the battery goes dead are frequently used.

In some of such semiconductor memories, bit lines are connected with memory cells by a virtual grounding scheme in order to reduce the chip size without reducing the storage capacity. However, when the memory cells are connected with bit lines by a virtual ground system, adjacent memory cells connected with the same word line share a bit line. Because of this, there is a problem that for example at writing to one of adjacent memory cells, drain disturbance occurs in the other memory cell.

In order to solve such a problem, there is known a semiconductor memory device in which the memory cell array is divided into some areas, the number of memory cells existing in the row direction in one area is limited to 8, 16, or the like, and write operations are carried out for the memory cells in the area on a one-by-one basis. In such a semiconductor memory device, the number of bit lines in the case that the memory cell array is divided, for example, into areas each having n (n>2) memory cells is 2(n+1)/3n (0.75 when n=8) of that in a fixed bit line system in which each two memory cells share a fixed ground wire. Thus, reduction in the chip size resulting from reduction in the number of the bit lines can be expected.

As such a semiconductor memory device, there is a previously proposed one in which the memory cell array is electrically divided into a plurality of areas using transistors, and writing to memory cells is carried out for each of the areas (see JP 2002-279789 A for example).

However, the above conventional semiconductor memory device in which the memory cell array is divided into areas each including n memory cells in the row direction needs n write operations (8 when n=8), for all of the memory cells in the memory cell array. Because of this, there is a problem that the write time becomes extremely long. In addition, the above semiconductor memory device in which the memory cell array is divided using transistors has a problem that it needs an area to form the transistors, thereby increasing the chip area on the contrary.

By the way, the information stored in a nonvolatile memory cell is determined with the help of variation in the cell currents responsive to the storage condition, it is difficult from a structure viewpoint to get perfect agreement of cell current between a plurality of memory cells in which the same information is stored. Thus, it is a common occurrence that cell current values distribute in some degree of width even if the same information is stored in a plurality of memory cells. However, if the distribution of cell current values of memory cells in which certain information is stored overlaps with the distribution of cell current values of memory cells in which other information is stored, it is difficult to correctly determine information. For this reason, programmed verify operations are carried out so that the distribution of cell currents of memory cells in which certain information is stored does not overlap with the distribution of cell currents of memory cells in which other information is stored, in other words, there is a gap between the two distributions. However, there is a problem that a gap between the distributions of cell currents goes narrower as memories become smaller, operate at lower voltage, and store more-valued data. Furthermore, disturbance (disturbance by access to other memory cells), endurance (deterioration of the rewrite characteristic of memory cells resulting from increase of the number of rewrite operations), retention (deterioration of the property of retaining stored information resulting from variation with temperature, variation with time, etc.), etc. have different degrees of influence on a plurality of memory cells. Because of this, there is a problem that the distribution conditions of cell current values are different between, for example, word lines, and thereby gaps between the distributions deviate in position.

In order to solve such a problem, conventionally, there is a semiconductor memory device in which a reference cell or reference cells are provided every word line, and the current value of the reference cell or the average current value of the reference cells is set to a reference current value, and the cell current values of memory cells from which information is to be read are compared with the reference current values to determine the information (see JP 2004-273093 A). Specifically, two kinds of reference cells are connected to word lines, and are brought into correspondence with data 0 and data 1, the average current value of the reference cells being used as a reference current value. In addition, in consideration of cell current values varying due to disturbance, program verify operations are carried out to obtain the distribution of cell current values of memory cells, and the reference current value is reset, or changed based on the obtained distribution of cell current values of memory cells.

However, the conventional semiconductor memory device has a problem that reference cells are provided every word line, so that many reference cells are required, thereby increasing the chip area. Furthermore, there is a problem that since the memory cells are affected by disturbance until the program verify operations are carried out, information may be incorrectly determined.

SUMMARY OF THE INVENTION

A first object of the present invention is to provide a semiconductor memory device in which time for writing to memory cells can be prevented from increasing and the chip area can be effectively reduced.

A second object of the present invention is to provide a semiconductor memory device in which the information stored in the memory cells can be correctly read, even if boundary values of cell currents for determining the information stored in the memory cells vary between word lines or vary with time, without increasing the chip area.

In order to accomplish the first object, there is provided, according to a first aspect of the present invention, a semiconductor memory device, including:

a memory cell array in which a plurality of nonvolatile memory cells are arranged, the nonvolatile memory cells each having input and output terminals and a control terminal;

bit lines connected with the input and output terminals of the plurality of memory cells by a virtual grounding scheme;

word lines connected with the control terminals of the memory cells;

a word line selecting circuit selecting one of the word lines;

a write voltage applying circuit applying voltages to the bit lines associated with the memory cells; and a write voltage control circuit controlling the write voltage applying circuit such that for each of memory cells, to which writing is to be carried out at the same time, of all the memory cells connected with the word line selected by the word line selecting circuit, different voltages are applied to two bit lines associated with the memory cell, while for each of other memory cells, to which writing is not to be carried out, a same voltage is applied to two bit lines associated with the memory cell.

In this configuration, for each of memory cells, connected with the word line selected by the word line selecting circuit, to which writing is to be carried out at the same time, different voltages are applied to two bit lines associated with the memory cell, by the write voltage applying circuit, under the control of the write voltage control circuit. On the other hand, for each of other memory cells, to which writing is not to be carried out, a same voltage is applied to two bit lines associated with the memory cell. Because of this, although the memory cells are connected with the bit lines by the virtual grounding scheme, writing to all memory cells to which writing is to be carried out can be carried out at the same time without problems such as drain disturbance, etc. As a result of this, in this semiconductor memory device, although the memory cells are connected with the bit lines by the virtual grounding scheme, time for writing to memory cells can be prevented from increasing, and the chip area can be effectively reduced because conventional transistors for dividing the memory cell array into a plurality of areas are not required.

In one embodiment, the memory cells of the memory cell array are asymmetrical memory cells, and the semiconductor memory device further includes a conversion section converting, under the control of the write voltage control circuit, input information to two or more pieces of conversion information capable of being written into the memory cells which are connected with the word line selected by the word line selecting circuit and to which writing is to be carried out at the same time.

The "asymmetrical memory cell" means a memory cell in which when information is written into it, of the two input/output terminals, a terminal to which a high voltage is applied and a terminal to which a low voltage is applied are previously specified, and if the high voltage and the low voltage are exchanged and applied to the two terminals, information to be written cannot be written. In this embodiment, the memory cells are asymmetrical memory cells, so that there is a case that input information cannot be simultaneously written into memory cells, into which the input information is to be written, connected to a word line selected by the word line selecting circuit. In such a case, the input information is converted, by the conversion section, to two or more pieces of conversion information which can be simultaneously written. By the two or more pieces of conversion information being simultaneously written into memory cells, the input information can be written faster than when it is separately written every minimum unit.

In this connection, it is preferable that the conversion section converts the input information to a smaller number of pieces of the conversion information than the number of pieces of information such as, for example, the number of "1" information included in the input information. By so doing, the conversion information can be written by fewer write operations than the write operations to be carried out when "1" information is separately written.

In one embodiment, the memory cells are side-wall memory cells.

The "side-wall memory" is a memory in which each of the memory cells has two source/drain regions, a channel region formed between the two source/drain regions, a gate formed above the channel region, and charge retention regions formed at both sides of the gate, and in each of the memory cells information having two or more levels can be stored by controlling the potentials of the two source/drain regions and the gate to separately control the charge retention conditions of the two charge retention regions. In other words, the side-wall memory has two storage sections in each of the memory cells. Thus, the degree of integration of the semiconductor memory device can be effectively increased. When attention is given to one of the charge retention regions, it is defined which of a high voltage or a low voltage should be applied to which of the two source/drain regions. Since the high voltage and the low voltage cannot be exchanged, the side-wall memory cell is asymmetrical.

In one embodiment, the semiconductor memory device further includes a write detection circuit detecting completion of writing to memory cells; and a voltage reset circuit instructing the write voltage control circuit, when the write detection circuit detects the completion of writing to a memory cell, to reset a voltage to be applied to the memory cell to which writing has completed, to a voltage which does not allow writing.

In this embodiment, when the completion of writing to a memory cell is detected by the write detection circuit, the voltage to be applied to the memory cell to which writing has completed is reset to a voltage which does not allow writing by the instruction to the write voltage control circuit given by the reset circuit. Thus, excessive writing to the memory cell to which writing has completed is effectively prevented.

In one embodiment, the semiconductor memory device further includes a write detection circuit detecting completion of writing to memory cells; and a conversion information renewal circuit instructing the conversion section, when the write detection circuit detects the completion of writing to a memory cell, to output the conversion information which does not allow writing to the memory cell to which writing has been completed, while continuously allowing writing to memory cells to which writing has not been completed.

In this embodiment, when the completion of writing to a memory cell is detected by the write detection circuit, new conversion information is output from the conversion section by the instruction of the conversion information renewal circuit. The conversion information does not allow writing to the memory cell to which writing has completed, while allowing to continue writing to memory cells to which writing has not completed. Because of this, input information to be written can be surely written into memory cells while effectively preventing excessive writing to memory cells to which writing has completed.

In one embodiment, conversion information obtained by conversion in the conversion section defines that the number of memory cells to which writing is carried out at the same time by the write voltage control circuit is two or less.

In this embodiment, when the conversion information defines that the number of memory cells to which writing is carried out at the same time is two, if writing to one memory cell has finished before writing to the other memory cell, writing to only one memory cell is continued. Thus, it does not happen that simultaneous writing to a plurality of memory cells to which writing is to be continued becomes impossible when writing to one memory cell has finished. Since writing to one memory cell to which writing is to be continued is surely continued, there is no necessity of reconversion of information, which would be necessary when there are a plurality of memory cells to which writing of the information was unsuccessful. Thus, the speed of writing to memory cells can be increased.

In one embodiment, the memory cell array includes redundancy memory cells, and the memory device further includes a redundancy added information output section identifying the input information converted to a predetermined number of pieces of the conversion information or more by the conversion section and outputting, with respect to the input information, identification information converted to less than a predetermined number of pieces of conversion data by the conversion section and redundancy data indicating the existence of the identification information, the redundancy information being to be written into the redundancy memory cells.

In this embodiment, identification information identifying the input information which is converted to not less than a predetermined number of pieces of conversion information by the conversion section, and redundancy information indicating the presence of the identification information are output by the redundancy added information output section. The redundancy information is written into the redundancy memory cells, and the identification information is converted to less than the predetermined number of pieces of conversion information by the conversion section. Because of this, the identification information can be written into memory cells by less than the predetermined number of write operations, so that the writing speed of the semiconductor memory device can be increased. At reading, when redundancy information is read from the redundancy memory cells by the read circuit, the input information may be identified from the identification information read from the memory cells by the read circuit, using, for example, a table or the like, and then outputted.

In one embodiment, the predetermined number is an integer nearest n/2 when the input information is n-bit information, where n is a natural number of 4 or more.

In this embodiment, when the input information is converted to conversion information the number of pieces of which is not less than an integer nearest n/2, the write speed of the semiconductor memory device can be effectively increased by identifying the input information with identification information converted to conversion information the number of pieces of which is less than the integer nearest n/2.

In one embodiment, the redundancy added information output section has a table in which the input information and the identification information are stored in association with each other.

In this embodiment, by changing the table, the input information converting method can be changed more easily than the conversion is implemented by, for example, a circuit.

In one embodiment, the conversion section has a table in which the input information and the conversion information are stored in association with each other.

In this embodiment, by changing the table, the method of outputting identification information can be changed more easily than the identification information is output by, for example, a circuit.

Electronic equipment according to the present invention includes the semiconductor memory device as mentioned above.

According to this configuration, the electronic equipment has the semiconductor memory device in which the information writing speed is relatively fast and the chip area is relatively small, so that relatively large scale input information can be stored at high speed and the size of the electronic equipment can be reduced.

In order to accomplish the second object, there is provided, according to another aspect of the present invention, a semiconductor memory device, including:

a memory cell array in which a plurality of nonvolatile memory cells are arranged, the nonvolatile memory cells each having input and output terminals and a control terminal;

word lines connected with the control terminals of the memory cells;

bit lines connected with the input and output terminals of the memory cells;

a cell current related value read circuit reading values related to currents flowing through a predetermined number of memory cells in the memory cell array;

a threshold producing circuit producing a threshold to identify information stored in the memory cells, based on distribution of the values read by the cell current related value read circuit; and an information determining circuit determining the information stored in the predetermined number of memory cells using the threshold produced by the threshold producing circuit.

In this configuration, values related to currents flowing through the predetermined number of memory cells are read by the cell current related value read circuit. The values of the currents flowing through the memory cells (so-called cell currents) correspond to the information stored in the memory cells. Thus, a threshold or thresholds for identifying the information stored in the memory cells are obtained by the threshold producing circuit based on the distribution of the values related to the currents flowing through the memory cells. Using the threshold(s), the information stored in each of the predetermined number of memory cells is determined by the information determining circuit. That is, in this semiconductor memory device, the thresholds for identifying information are determined based on the currents actually flowing through a predetermined number of memory cells of which information is to be determined. Thus, the information stored in the memory cells can be determined without using conventional reference cells. Furthermore, even if the distributions of cell current values vary between word lines or vary with time, the information stored in the memory cells can be determined correctly. In addition, it is not required to reset the reference current value in agreement with the variation in the current values of memory cells caused by disturbance, etc. as before, so that the circuitry and operation of the semiconductor memory device can be significantly simplified. Furthermore, no reference cell is required, so that the chip area can be reduced than in conventional memory devices using such reference cells. The memory cells are not limited to ones for storing binary information, and may be of storing multivalued, or multilevel information. When multilevel information is stored in the memory cells of a semiconductor memory device using reference cells, the information determination accuracy easily deteriorates due to the variation in the cell currents. In contrast to this, in the semiconductor memory device according to the present invention, the thresholds are determined based on the cell currents of the memory cells the information in which is to be determined, so that a good determination accuracy can be obtained also when multilevel information is stored.

In one embodiment, the semiconductor memory device further includes a word line selecting circuit selecting a word line; and a bit line charging and discharging circuit charging or discharging the bit lines. And, the cell current related value read circuit includes an A/D converter which is connected with the bit lines and outputs the potentials of the bit lines.

In this embodiment, the potentials of the bit lines charged by the bit line charging and discharging circuit are output by the A/D converter serving as the cell current related value read circuit. The potentials of the charged bit lines reduce or increase according to currents flowing through the memory cells with discharge of the bit lines. Thus, for example, potential differences in the case of decrease or potential differences in the case of increase in a predetermined discharge period of the bit lines are obtained, and thresholds for identifying information in the memory cells connected with the bit lines are determined based on the distribution of the potential differences.

In one embodiment, the semiconductor memory device further includes a word line selecting circuit selecting a word line; and a bit line charging and discharging circuit charging or discharging the bit lines. And, the cell current related value read circuit includes a comparator which is connected with the bit lines and compares the potentials of the bit lines and a reference value; and a counter performing counting, based on the output from the comparator, to generate count values indicating discharging periods or charging periods during which the potentials of the bit lines become a predetermined potential.

In this embodiment, a variation in the potential of a bit line relative to the reference value is detected by the comparator. Based on the output from the comparator, a count value indicating a discharging period or a charging period during which the potential of the bit line becomes the predetermined potential is counted by the counter. The amount of the discharging period or charging period corresponds to the amount of the cell current of the memory cell connected with the bit line. In more detail, the discharging period or the charging period is almost inversely proportional to the cell current of the memory cell. Thus, information in the memory cell can be determined using the count value.

In one embodiment, bits of the A/D converter are larger in number than bits of the information stored in the memory cells.

In this embodiment, values related to the currents flowing through the memory cells (the values of the potentials of the bit lines) can be correctly output according to the information stored in the memory cells. Thus, the accuracy of thresholds produced by the threshold producing circuit can be increased.

In one embodiment, bits of the counter are larger in number than bits of information stored in the memory cells.

In this embodiment, values related to the currents flowing through the memory cells (the count values of the counter) can be correctly output according to the information stored in the memory cells. Thus, the accuracy of thresholds produced by the threshold producing circuit can be increased.

In one embodiment, the threshold producing circuit produces the threshold based on adjacent bit line voltage values that have a largest gap therebetween, of all adjacent bit line voltage values of bit lines connected with the plurality of memory cells measured by the A/D converter.

In this embodiment, the difference between adjacent bit line voltage values for the plurality of memory cells is largest when the adjacent bit line voltage values correspond to different information. Thus, the threshold(s) can be appropriately set based on the bit line voltage values the gap between which is the longest.

In one embodiment, the threshold producing circuit produces the threshold based on adjacent count values that have a largest gap therebetween, of all adjacent count values of the plurality of memory cells counted by the counter.

In this embodiment, the difference between adjacent count values for the plurality of memory cells is largest when the adjacent count values correspond to different information. Thus, the threshold(s) can be appropriately set based on the count values the gap between which is the longest.

In one embodiment, the threshold producing circuit produces the threshold based on values at ends of distributions of continuous bit line voltage values of bit lines connected with the plurality of memory cells.

In this embodiment, when the distributions of continuous bit line voltage values are obtained with respect to the plurality of memory cells, there is a gap or gaps between the distributions of the bit line voltage values corresponding to different information. The threshold(s) can be appropriately set based on the end values of the distributions of the bit line voltage values.

In one embodiment, the threshold producing circuit produces the threshold based on values at ends of distributions of continuous count values of the plurality of memory cells counted by the counter.

In this embodiment, when the distributions of the continuous count values with respect to the plurality of memory cells are obtained, there is a gap or gaps between the distributions of the count values corresponding to different information. The threshold(s) can be appropriately set based on the end values of the distributions of the count values.

In one embodiment, an operation of starting comparison between the potential of a bit line and a reference value by the comparator and an operation of starting generating the count value by the counter are synchronized.

In this embodiment, the counter is operated only during a period of time necessary for charging or discharging of the bit line, so that the information stored in the memory cell can be effectively read by making the most of the accuracy of the counter. In this connection, the operation of starting the comparison between the potential of a bit line and the reference value carried out by the comparator and the operation of starting to count carried out by the counter only need to be synchronized but does not need to be carried out at the same time.

In one embodiment, an operation of inverting the output of the comparator and stopping of the counting of the counter are synchronized.

In this embodiment, count values corresponding to the discharging periods or charging periods of the bit lines can be obtained accurately.

In one embodiment, capacitive elements are connected with the bit lines.

In this embodiment, the discharging periods or charging periods of the bit lines can be increased by increasing the capacitances of the bit lines with the capacitive elements, so that the number of the output bits of the counter can be increased without changing, for example, the frequency of the counter and hence without increasing the power consumption of the counter. Thus, the accuracy of count values output from the counter can be increased, and thereby the accuracy of determining the information in the memory cells can be increased.

In one embodiment, resistive elements having resistances between a maximum resistance and a minimum resistance, inclusive, of the memory cells when turned on are connected with the bit lines.

In this embodiment, the discharging periods or charging periods of the bit lines can be increased by the resistive elements, so that the number of the output bits of the counter can be increased without changing, for example, the frequency of the counter and hence without increasing the power consumption of the counter. Thus, the accuracy of count values output from the counter can be increased, and thereby the accuracy of determining the information in the memory cells can be increased.

In one embodiment, the bit line charging and discharging circuit includes a resistive element having a resistance between a maximum resistance and a minimum resistance, inclusive, of the memory cells when turned on.

In this embodiment, by the resistive element included in the bit line charging and discharging circuit, the discharging period or charging period of a bit line can be increased and the accuracy of a count value counted by the counter can be increased, and thereby the accuracy of determining the information in the memory cells can be increased. Furthermore, by using resistance of, for example, a switching element included in, for example, the bit line charging and discharging circuit, the accuracy of determining the information in the memory cells can be increased without complicating the circuitry and increasing the chip area.

In one embodiment, the memory cells include side-wall memory cells.

In this embodiment, each of the side-wall memory cells has two storage sections, so that the degree of integration of the semiconductor memory device can be effectively increased. In each of the side-wall memory cells, current flowing through the memory cell when reading information in one storage section is affected by the storage condition of the other storage section. Thus, the variation in the cell current values of the memory cells is larger than that of memory cells each having one storage section. However, the semiconductor memory device may have a counter or counters for counting count values indicating the discharging periods or charging periods of the bit lines, so that regardless of the properties of the side-wall memory cells, the information in the memory cells can be determined with high accuracy by identifying information based on the output of the counter(s).

Electronic equipment of the present invention has the above semiconductor memory device.

Due to the provision of the semiconductor memory device which has a relatively simple configuration and is able to determine information with high accuracy, the electronic equipment can be made small and reliable.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein:

FIG. 10 shows a table for the conversion of 4-bit input data;

FIG. 11 shows a table for the conversion of 6-bit input data;

FIG. 12 shows a table for the conversion of 6-bit input data;

FIG. 19 is a table for the conversion of 4-bit input data, included in a data conversion section provided in a semiconductor memory device of a seventh embodiment.

FIG. 20 shows a table for the conversion of 6-bit input data;

FIG. 21 shows a table for the conversion of 6-bit input data;

FIG. 24 shows a table for converting 6-bit input data to conversion data through redundancy-bit added data;

FIG. 25 shows a table for converting 6-bit input data to conversion data through redundancy-bit added data;

DETAILED DESCRIPTION OF THE INVENTION

Figure 1:
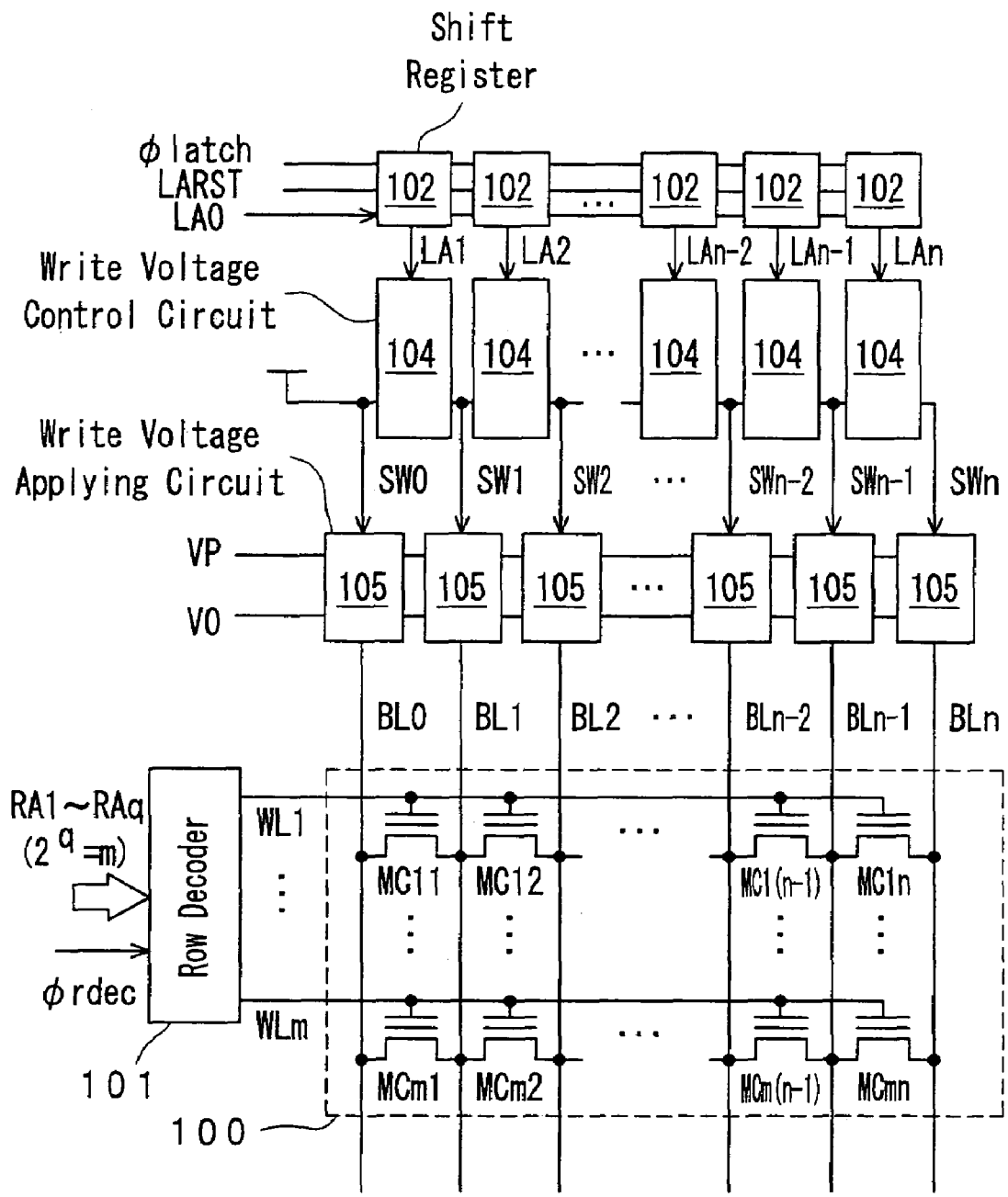
FIG. 1 is a block diagram showing a semiconductor memory device of a first embodiment.

The present invention will be described in detail below with embodiments illustrated in the drawings.

FIRST EMBODIMENT

Figure 2A:
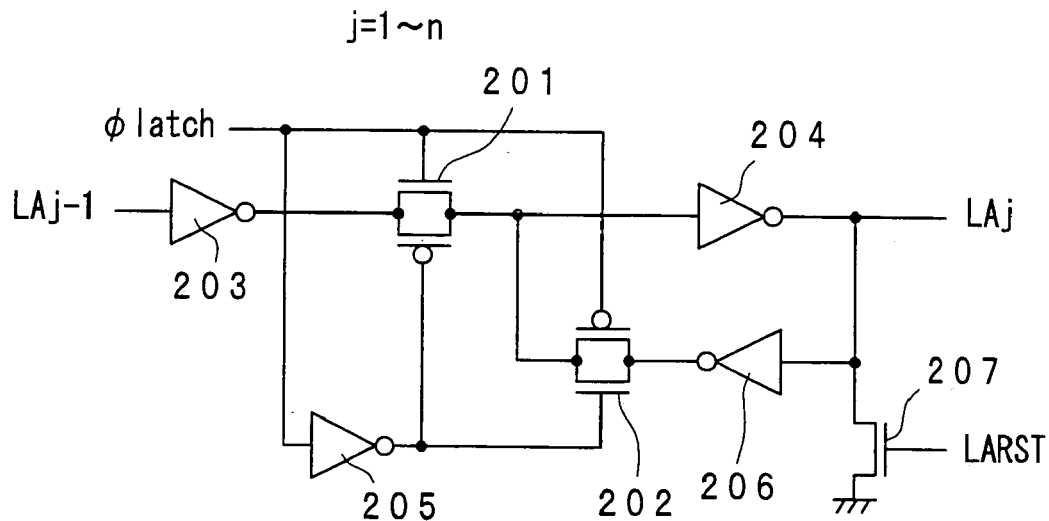
FIG. 2A is a circuit diagram showing an example of a shift register.

FIG. 1 is a block diagram showing a semiconductor memory device of the first embodiment of the present invention. FIGS. 2A and 2C are circuit diagrams showing an example of the peripheral circuits of the semiconductor memory device.

As shown in FIG. 1, this semiconductor memory device has a memory cell array 100 in which a plurality of non-volatile memory cells MC11, MC12, - - - , MC1(n−1), MC1n, - - - , MCm(n−1), and MCmn are arranged in the form of a matrix. In this memory cell array 100, a plurality of word lines WL1 to WLm align in the column direction, and each of the word lines extends in the row direction and is connected with the control gates of the memory cells of a corresponding row. Furthermore, in the memory cell array 100, a plurality of bit lines BL0 to BLn align in the row direction, and each of the bit lines extends in the column direction and is connected with the input and output terminals, i.e., sources and drains of the memory cells of a corresponding column. The bit lines BL0 to BLn are connected with the memory cells MC11 to MCmn by a virtual ground scheme. The semiconductor memory device also has a row decoder 101 as a word line selecting circuit for selecting a word line WL1 to WLm, shift registers 102 for latching input data as input information to output write data ("0" and "1" when it is binary data) to the memory cells, write voltage control circuits 104 for switching voltages according to data to be written in the memory cells, and write voltage applying circuits 105 for applying voltages to bit lines BL0 to BLn. In this embodiment, a row to which a particular memory cell belongs is represented by i, and a column to which the particular memory cell belongs is represented by j. That is, i=1 to m, and j=0 to n.

FIG. 2A is a circuit diagram showing an example of the sift register 102. In FIG. 2A, the reference numeral 201 denotes a CMOS transfer gate which is turned on by the leading edge of a ølatch pulse, and the reference numeral 202 denotes a CMOS transfer gate which is turned on by the trailing edge of the ølatch pulse. The reference numerals 203, 204, 205, and 206 each denote an inverter. The inverters 204 and 206 at the output side of the CMOS transfer gate 201 constitute an inverter pair when the COMS transfer gate 202 is turned on. The reference numeral 207 denotes a transistor for controlling the grounding of the output line.

Figure 2B:
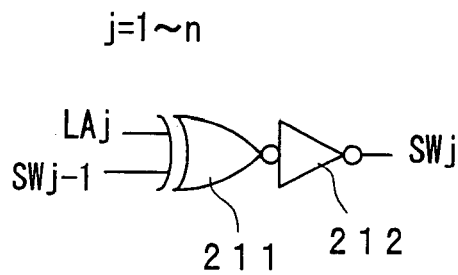
FIG. 2B is a circuit diagram showing an example of a write voltage control circuit.
Figure 2C:
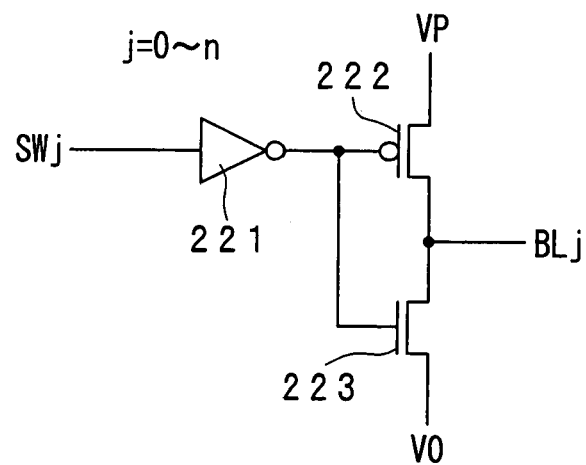
FIG. 2C is a circuit diagram showing an example of a write voltage applying circuit.

FIG. 2B is a circuit diagram showing an example of the write voltage control circuit 104. The reference numeral 211 denotes an EX-NOR into which output SWj-1 of a preceding EX-NOR and output LAj from the associated shift register 102 are input, and the reference numeral 212 denotes an inverter.

FIG. 2C is a circuit diagram showing an example of the write voltage applying circuit 105. The reference numeral 221 denotes an inverter for inverting the output from the write voltage control circuit 104, the reference numeral 222 denotes a PMOS, and the reference numeral 223 denotes an NMOS.

Into the memory cells MC11 to MCmn of this embodiment, data 0 or 1 is written according to combinations of write voltages as shown in the following table 1.

TABLE 1

|  | Word Line (Voltage) | Bit Line BLj-1 (Voltage) | Bit Line BLj (Voltage) |
| --- | --- | --- | --- |
| Data 0 | VWL | V0 | V0 |
|  | VWL | VP | VP |
| Data 1 | VWL | VP | V0 |
|  | VWL | V0 | VP |

As shown in Table 1, if the voltage VWL, of which a representative value is 5 V, is applied to a word line with which the control gate of a memory cell MCij into which data is to be written is connected, and if the voltage VP, of which a representative value is 5 V, or voltage V0, of which a representative value is 0 V, is applied to both of two bit lines BLj-1 and BLj with which the source and drain of the memory cell MCij are connected, data 0 is written into the memory cell MCij. In this specification, "data 0 is written" means that charge injection to or charge extraction from the charge storage section of a memory cell is not performed, so that writing to the memory cell is not substantially carried out. On the other hand, if the voltage VWL, of which a representative value is 5 V, is applied to a word line with which the control gate of a memory cell MCij is connected, and if the voltage VP, of which a representative value is 5 V, and the voltage V0, of which a representative value is 0 V, are applied to two bit lines BLj-1 and BLj with which the source and drain of the memory cell MCij are connected, data 1 is written into the memory cell MCij. When data 1 written, VP or V0 may be applied to either of the two bit lines. That is, it is essential that voltage VP or V0 applied to one of the two bit lines is different from voltage V0 or VP applied to the other one.

In a write operation, it is a general way that the voltage of a word line is kept VWL and a pulse of voltage VP is applied to a bit line, but writing may be carried out also by applying a pulse of voltage VWL to a word line and keeping the bit line at the voltage Vp. In this connection, it is important in writing of data 0 into a memory cell MCij that when voltages of two bit lines BLj-1 and BLj connected with the memory cell MCij are equal to each other, data 0 can be written into the memory cell MCij regardless of the values of the voltages (that is, in either of VP and V0 as shown in Table 1). In general, when data 0 is written into a memory cell, the memory cell is held erased, charge injection to or charge extraction from the charge storage section of the memory cell is not performed, and no write disturbance occurs. On the other hand, it is important in writing of data 1 into a memory cell MCij that when different voltages are applied to two bit lines BLj-1 and BLj connected with the memory cell MCij, data 1 can be written into the memory cell MCij whichever of the two bit lines is at a higher potential. However, there are some kinds of flash memories having memory cells such as asymmetric memory cells into which data cannot be written if either one of the two bit lines is not at a higher potential than the other one. Furthermore, there is a memory such as a side-wall memory having two storage nodes in each memory cell, in which storage nodes into which data is written vary depending on which of the two bit lines a higher potential is applied to. These memories will be described in detail in the third and fourth embodiments.

In the semiconductor memory device of this embodiment, any given data can be written, by one write operation, into all memory cells connected with one word line, according to the combinations of write voltages as shown in Table 1. For example, when the data "1011001010 - - -" is written into the memory cells MC11, MC12, - - -, MC1(n-1), and MC1n connected with the word line WL1 in FIG. 1, voltages applied to the bit lines BL0, - - -, and BLn are as shown in FIG. 3.

Figure 3:
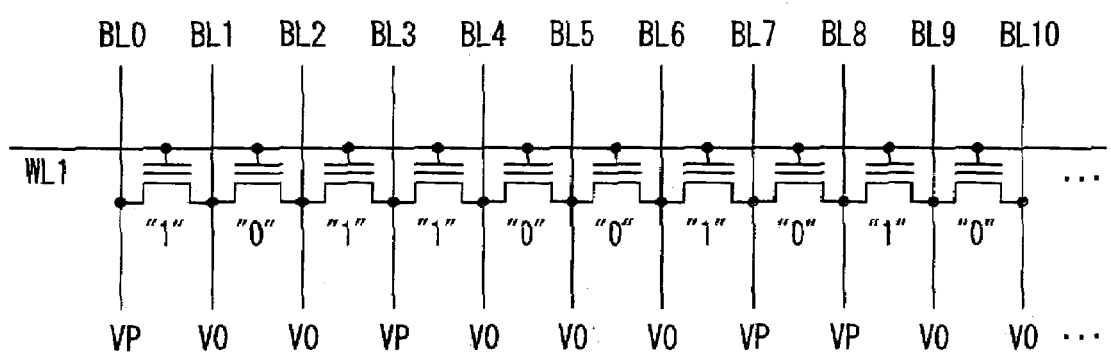
FIG. 3 shows voltages applied to bit lines when data "1011001010 . . . " is written into memory cells connected with the same word line.

In order to realize the application of voltages to the bit lines as shown in FIG. 3, at first, the write data is taken into a shift register 102 (see FIG. 1). In the circuit of FIG. 2A, signal LARST is turned to the low level to release the reset and the write data is input to LA0 sequentially while giving a pulse to ølatch.

When input of data to the shift register 102 has finished, the write voltage control circuit 104 in FIG. 2B determines which of voltages VP and V0 is to be applied to the bit line, based on the output SWj-1 of the preceding circuit and the output LAj from the shift register 102. Then, a signal indicative of this VP or V0 is output as an output signal SWj. The associated write voltage applying circuit 105 receives the output signal SWj, performs switching between VP and V0, and applies the predetermined voltage to the bit line BLj.

In this embodiment, the voltage of the bit line BL0 at an initial end of the memory cell array 100 may be VP or V0. In FIG. 3, although the voltage of the bit line BL0 is set to VP. If, however, the voltage of the bit line BL0 is set to V0, the signal SW0 which is output from the write voltage control circuit 104 may be set to GND level instead of VCC level. Also in this case, data is correctly written into all the memory cells.

As described above, in the semiconductor memory device of this embodiment, when data 0 is written into a memory cell MCij, the same potential is applied to two bit lines BLj-1 and BLj connected with the memory cell MCij, while when data 1 is written into the memory cell MCij, different potentials are applied to the bit lines BLj-1 and BLj, so that any given data can be written, by one write operation, into all the memory cells MC1, - - -, MCn connected with the word line WLi, without being affected by data written into the adjacent memory cells MCi(j-1) and MCi(j+1).

SECOND EMBODIMENT

Figure 4:
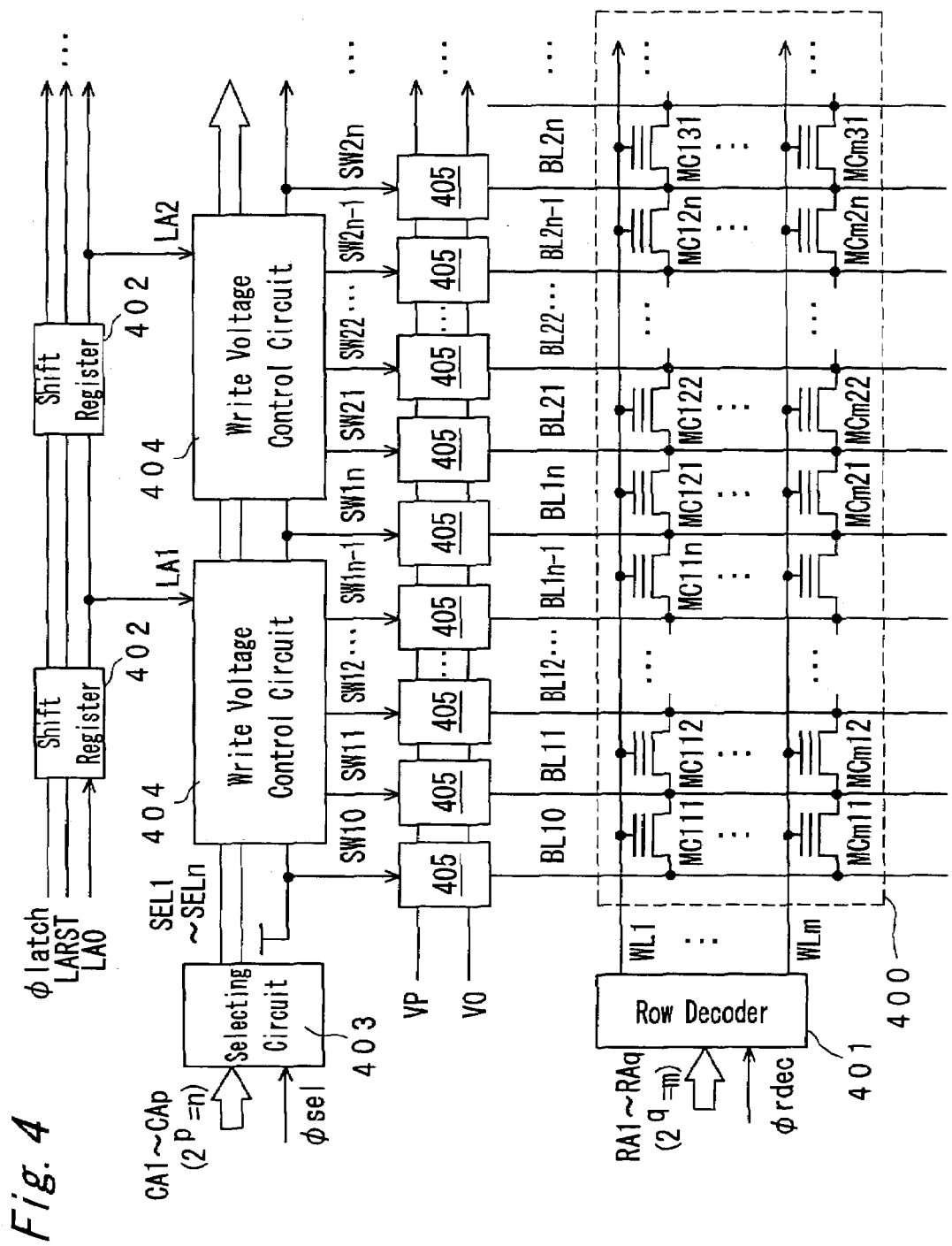
FIG. 4 is a block diagram showing a semiconductor memory device of a second embodiment.

FIG. 4 is a block diagram showing a semiconductor memory device of a second embodiment of the present invention, and FIGS. 5 and 6 are circuit diagrams showing an example of the peripheral circuits of the semiconductor memory device.

As shown in FIG. 4, this semiconductor memory device has a memory cell array 400 in which a plurality of nonvolatile memory cells MC111, MC112, - - -, MC11(n−1), MC11n, MC121, - - -, MCm11, - - -, MCm2n, - - -, and MCmrn are arranged in the form of a matrix. This memory cell array 400 has r areas each including n memory cells in the row direction. In this memory cell array 400, a plurality of word lines WL1 to WLm are arranged in the column direction, and each of the word lines extends in the row direction and is connected with the control gates of the memory cells aligning in the same row. Furthermore, in the memory cell array 400, a plurality of bit lines BL10 to BLrn are arranged in the row direction. Each of bit lines extends in the column direction and is connected with the input and output terminals, i.e., sources and drains of the memory cells in the same column. The bit lines BL10 to BLrn are connected with the memory cells MC111 to MCmrn by a virtual ground scheme or system. The semiconductor memory device also has a row decoder 401 for selecting a word line WL1 to WLm, shift registers 402 for latching input data as input information, a selecting circuit 403 for selecting the addresses of memory cells into which data is written, write voltage control circuits 404 for switching voltages according to data ("0" or "1" when it is binary data) written into memory cells, and write voltage applying circuits 405 for applying voltages to the bit lines BL10, BL11, - - -, BL1n−1, BL1n, - - -. In this embodiment, a row to which a particular memory cell belongs is referred to as i, a column to which the particular memory cell belongs is referred to as j, and an area to which the particular memory cell belongs is referred to as k. In this connection, j indicates one of columns 0 to n which exist in an area, and is counted from the end column at the row decoder 401 side.

Figure 5A:
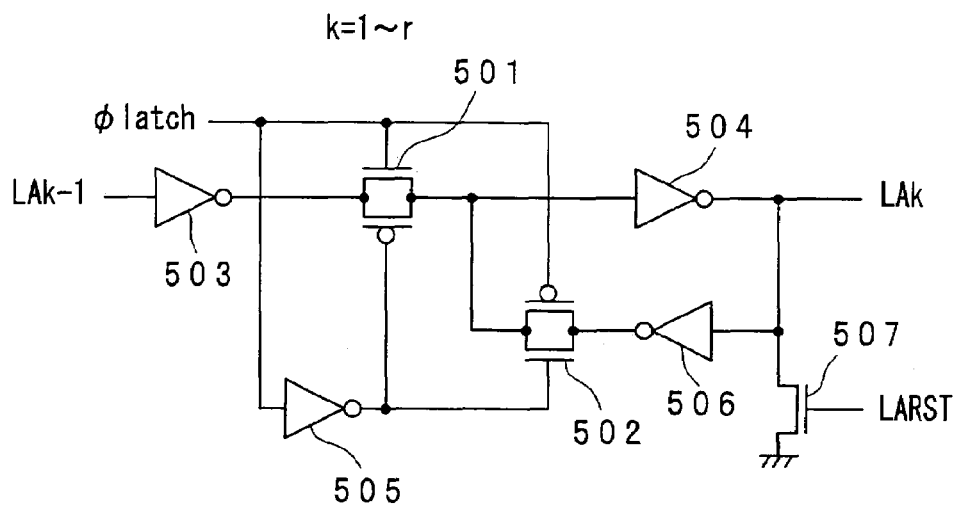
FIG. 5A is a circuit diagram showing an example of a shift register.

FIG. 5A is a circuit diagram showing an example of the sift register 402. This shift register 402 has a circuit configuration similar to that of the shift register 102 of the first embodiment. In FIG. 5A, the reference numeral 501 denotes a CMOS transfer gate, 502 denotes a CMOS transfer gate, 503, 504, 505, and 506 each denote an inverter, and 507 denotes a transistor.

Figure 5B:
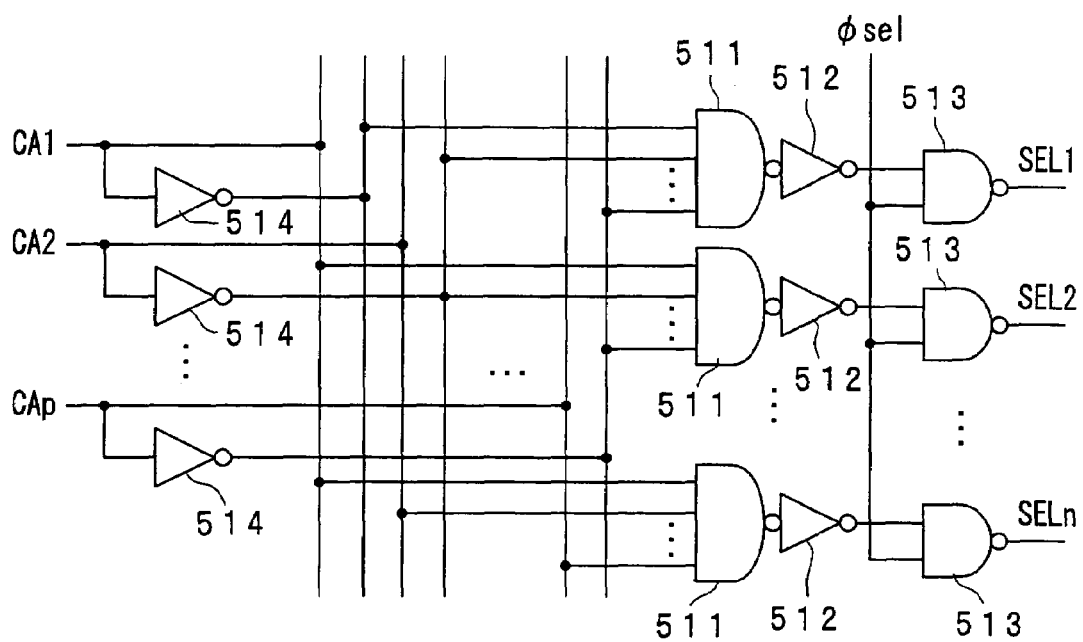
FIG. 5B is a circuit diagram showing an example of a selecting circuit.

FIG. 5B is a circuit diagram showing an example of the selecting circuit 403. In FIG. 5B, the reference numeral 511 denotes NAND gates for producing selecting signals SEL1, SEL2, - - - which indicate bit lines BL0, BL11, - - - to be selected, based on address signals CA1, CA2, - - -, CAp from the control circuit which is not shown in the figure. The reference numerals 512 and 514 denote inverters. The reference numeral 513 denotes NAND gates for outputting signals SELL to SELn by the leading edge of øsel, respectively.

Figure 6A:
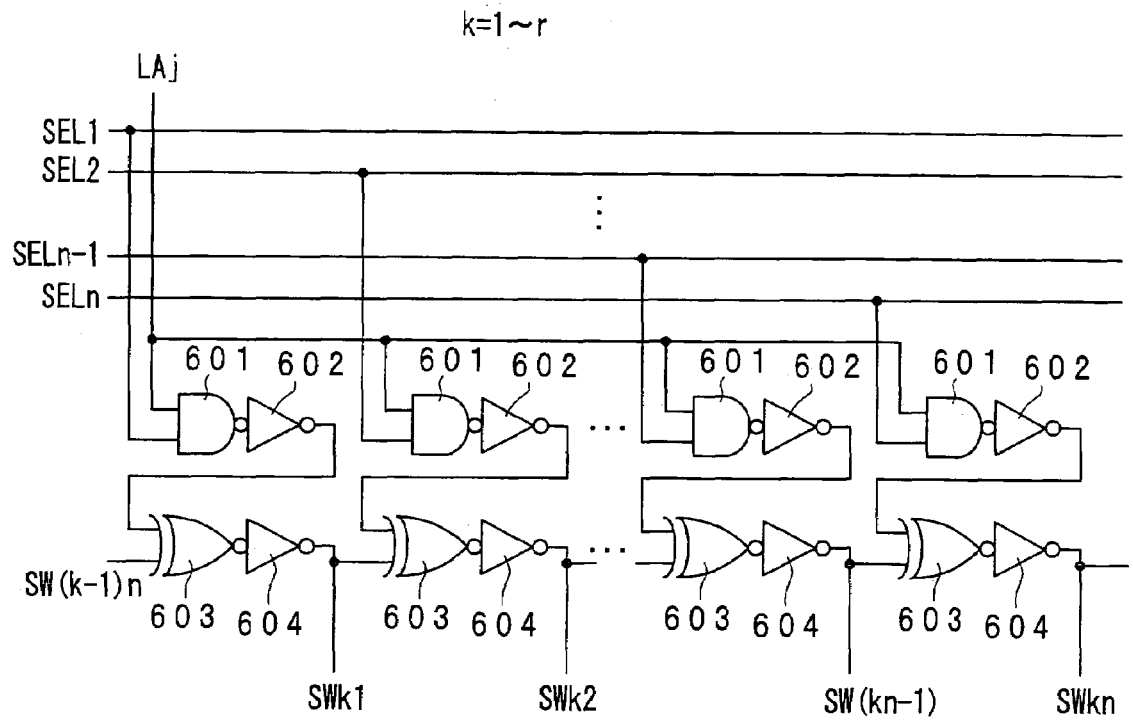
FIG. 6A is a circuit diagram showing an example of a write voltage control circuit.

FIG. 6A is a circuit diagram showing an example of the write voltage control circuit 404. In FIG. 6A, the reference numerals 601 and 602 denote NAND gates and inverters, respectively, for outputting signals LA1, 2, - - - from shift registers 402 in response to leading edges of selecting signals SEL1, SEL2, - - - from the selecting circuit 403. The reference numerals 603 and 604 denote EX-NORs and inverters, respectively, for outputting output signals SWk1 to SWkn (k=1 to r) indicating which of voltages VP and V0 is applied to a bit line, based on the output from the preceding stage and the output from the associated inverter 602.

Figure 6B:
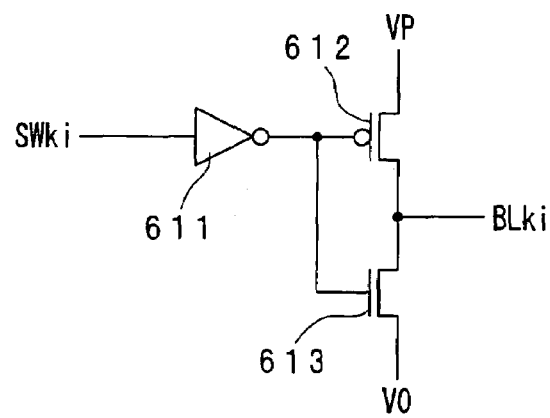
FIG. 6B is a circuit diagram showing an example of a write voltage applying circuit.

FIG. 6B is a circuit diagram showing an example of the write voltage applying circuit 405. In FIG. 6B, the reference numeral 611 denotes an inverter for inverting the output from the write voltage control circuit 404, the reference numeral 612 denotes a PMOS, and the reference numeral 613 denotes an NMOS.

Write voltages for memory cells MC111, - - -, and MCmrn in this embodiment are identical to those in Table 1 of the first embodiment. Because of this, when the voltages of two bit lines connected with a predetermined memory cell MCikj are equal to each other, data 0 is written into the memory cell MCikj regardless of the voltage value, i.e., either of V0 or VP. On the other hand, when the voltages of the two bit lines are different from each other, data 1 is written into the memory cell MCikj whichever bit line is at a higher potential.

Operations peculiar to this embodiment will be described below, and description about operations similar to those of the first embodiment will be omitted.

In the semiconductor memory device of this embodiment, as shown in FIG. 4, n×r memory cells MCikj are connected with one word line WLi, and writing to only one memory cell per area of these memory cells is carried out at the same time. That is, writing to memory cells as many as the areas of memory cells connected with one word line is carried out at the same time. When writing to a flash memory is carried out, a verify operation is carried out every time a write pulse is applied to the flash memory by reading data in memory cells to confirm whether the data was correctly written. However, in a virtual ground system, as described in, for example, JP 11-110987 A, data can be simultaneously read only from at most one memory cell per four memory cells. Because of this, writing is to be carried out upon one cell every n cells (per area) in order that the number of write cells is set to be equal to or less than the number of cells from which data can be simultaneously read. However, in the verify operation, the read operation may be divided to two or more operations carried out separately, and in such a case write operations as in the first embodiment may be carried out.

In the semiconductor memory device of this embodiment, writing to one memory cell every n memory cells (every area) is carried out, so that selecting signals for selecting the addresses of memory cells is output by the selecting circuit 403. As shown in FIG. 5B, the selecting circuit 403 receives address signals CA1 to CAp (2p=n) and outputs selecting signals SELL to SELn when øsel is turned to the high level.

Input data to be written into memory cells is taken in by the shift registers 402. The operation of the shift registers is similar to that of the first embodiment. When the shift registers 402 have finished taking in data, the write voltage control circuit 404 outputs the output signal SWk1 to SWkn indicating which of voltages VP and V0 is to be applied to a bit line, based on the output SW(k−1)n of the preceding stage, the output LAk of the shift register 402, and the output SELL to SELn of the selecting circuit 403. The write voltage applying circuits 405 apply voltage VP or V0 to bit lines BLk1 to BLkn according to the output signals SWk1 to SWkn.

Figure 7A:
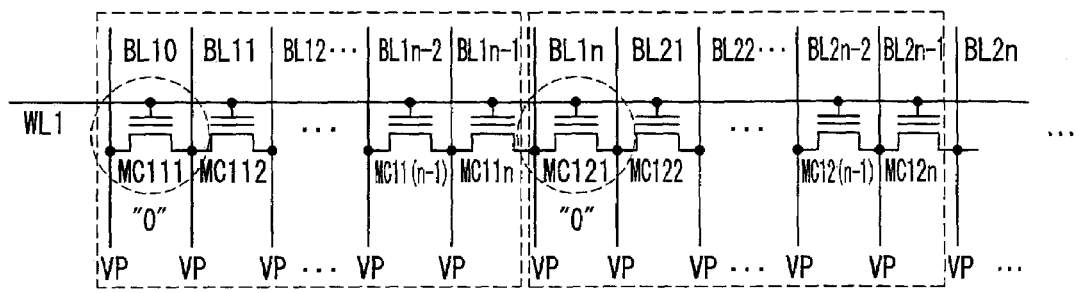
FIG. 7A shows voltages applied to bit lines when data 0 and data 0 are written into two adjacent areas of a memory cell array, respectively.
Figure 7B:
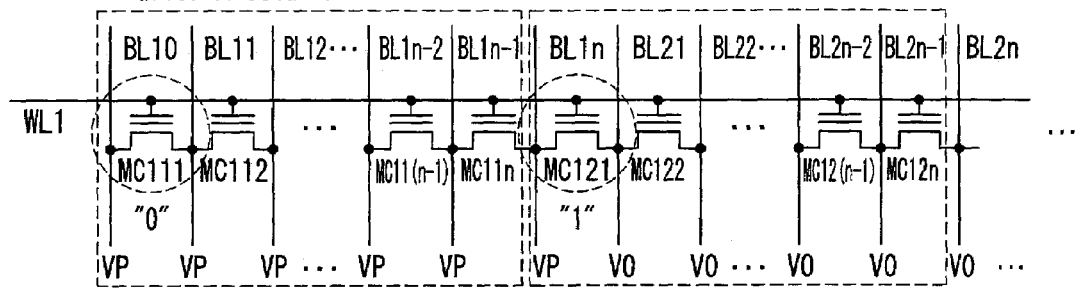
FIG. 7B shows voltages applied to bit lines when data 0 and data 1 are written into two adjacent areas of a memory cell array, respectively.
Figure 7C:
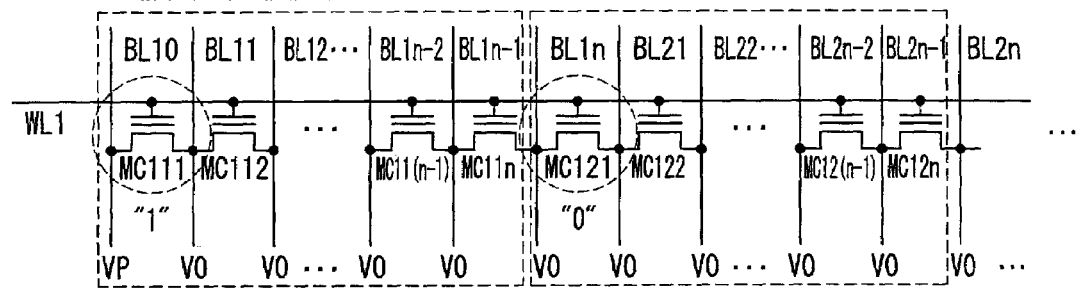
FIG. 7C shows voltages applied to bit lines when data 1 and data 0 are written into two adjacent areas of a memory cell array, respectively.
Figure 7D:
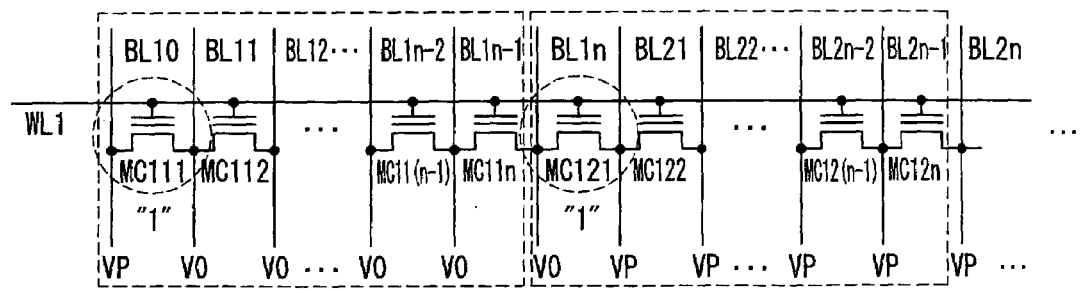
FIG. 7D shows voltages applied to bit lines when data 1 and data 1 are written into two adjacent areas of a memory cell array, respectively.

FIGS. 7A to 7D show all combinations of data which can be simultaneously written into first memory cells (nearest the row decoder 401) of the memory cells which are included in two adjacent areas and are connected with the same word line WL1. In FIGS. 7A to 7D, two areas next to the row decoder 401 are shown, and the memory cells into which data is to be written are surrounded with broken line circles. FIG. 7A shows voltages which are applied to bit lines in the areas when data 0 and data 0 are written into the memory cells in the order of increasing distance from the row decoder 401. FIG. 7B shows voltages which are applied to the bit lines in the areas when data 0 and data 1 are written into the memory cells in the order of increasing distance from the row decoder 401. FIG. 7C shows voltages which are applied to the bit lines in the areas when data 1 and data 0 are written into the memory cells in the order of increasing distance from the row decoder 401. FIG. 7C shows voltages which are applied to the bit lines in the areas when data 1 and data 1 are written into the memory cells in the order of increasing distance from the row decoder 401.

As shown in FIGS. 7A to 7D, when data 0 is written into the memory cells MC111 and MC121, the same potential is applied to the two bit lines BL10 and BL11 connected with the memory cell MC111, and to the two bit lines BL1n and BL21 connected with the memory cell MC121, while different potentials are applied to the bit lines BL10 and BL11, and to the bit lines BL1n and BL21 when data 1 is written into the memory cells MC111 and MC121. Because of this, any given data can be written, by one write operation, into the memory cells MC111 and MC121 connected with the word line WL1, without being affected by data to be written in the memory cell in the adjacent area.

Also in this embodiment, the voltage of the bit line BL10 next to the row decoder 401 in the memory cell array 400 may be VP or V0. In FIGS. 4 and 7, the voltage of the bit line BL10 is set to VP. If, however, the voltage of the bit line BL0 is set to V0, the potentials of the signals SW10 and SW1n from the write voltage control circuit 404 may be set to GND level instead of VCC level. As a result of this, given data can be correctly written into the memory cells MC111 and MC121.

THIRD EMBODIMENT

Figure 8:
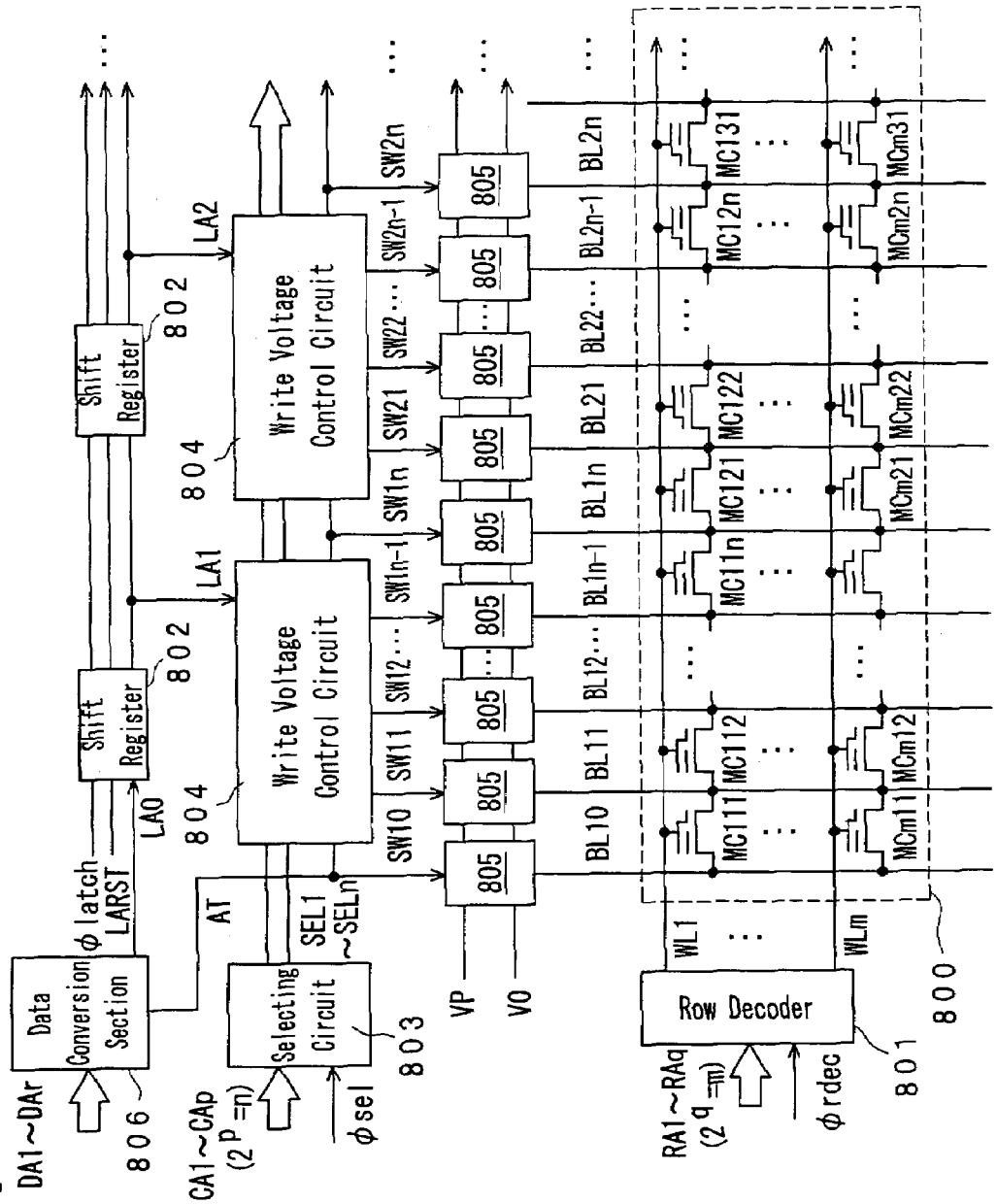
FIG. 8 is a block diagram showing a semiconductor memory device of a third embodiment.

FIG. 8 is a block diagram showing a semiconductor memory device of a third embodiment of the present invention.

The semiconductor memory device of this embodiment has a memory cell array 800 in which a plurality of nonvolatile memory cells MC111, MC112, - - - , MC11(n−1), MC11n, MC121, - - - , MCm11, - - - , MCm2n, - - - , and MCmrn are arranged in the form of a matrix. The memory cells constituting the memory cell array are asymmetrical memory cells which require that at writing to a memory cell, a voltage higher than a voltage applied to one of two bit lines connected with the memory cell be applied to the other bit line. In this embodiment, the memory cell array has r areas each including n memory cells in the row direction, which are arranged in such a manner that memory cells in adjacent areas have properties opposite to each other. Specifically, when data 1 is written into the memory cell MC111 nearest the row decoder 801 in FIG. 8, it is necessary to apply VP to the bit line BL10 and apply V0 to the bit line BL11. On the other hand, when data 1 is written into the memory cell 121 nearest the row decoder 801 in the area adjacent to the area to which the memory cell MC111 belongs, it is necessary to apply V0 to the bit line BL1n and apply VP to the bit line BL21. In order to control voltages to be applied to bit lines, a data conversion section 806 as the conversion section according to the present invention is provided. Other sections have functions similar to those of the second embodiment. That is, the row decoder 801, shift register 802, selecting circuit 803, write voltage control circuit 804, and write voltage applying circuit 805 have functions similar to those of the row decoder 401, shift register 402, selecting circuit 403, write voltage control circuit 404, and write voltage applying circuit 405, respectively.

FIGS. 9A to 9D show voltages to be applied to bit lines when data 0 and 0, data 0 and 1, data 1 and 0, and data 1 and 1 are written into first memory cells closest to the row decoder 801 in adjacent two areas, respectively.

Figure 9A:
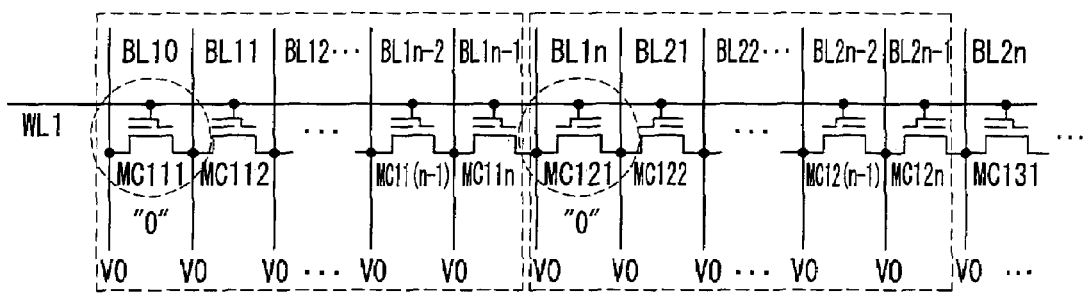
FIG. 9A shows voltages applied to bit lines when data 0 and data 0 are written into two adjacent areas of a memory cell array, respectively.
Figure 9B:
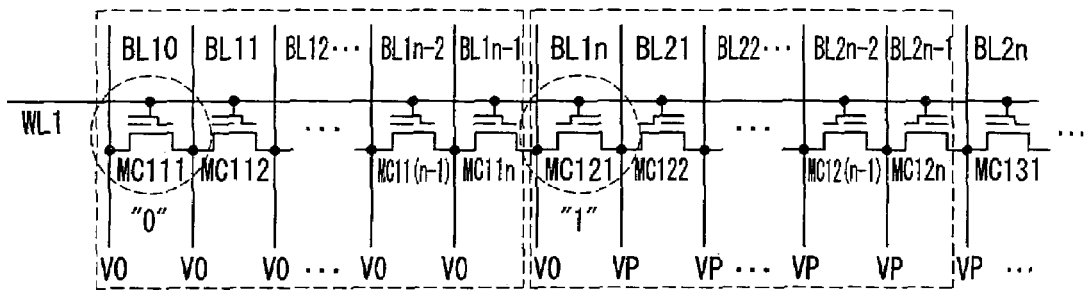
FIG. 9B shows voltages applied to bit lines when data 0 and data 1 are written into two adjacent areas of a memory cell array, respectively.
Figure 9C:
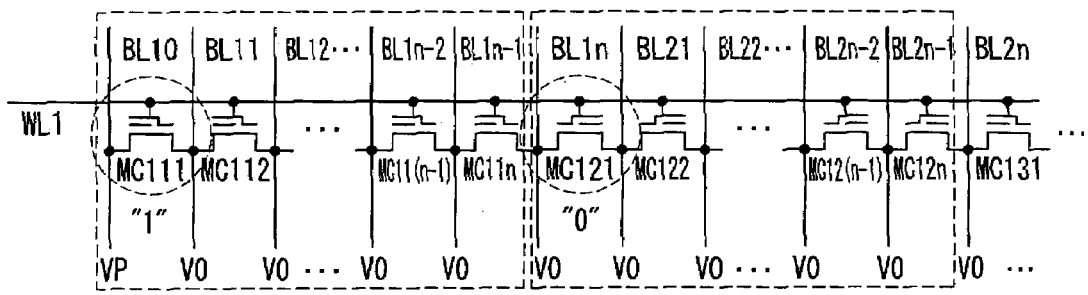
FIG. 9C shows voltages applied to bit lines when data 1 and data 0 are written into two adjacent areas of a memory cell array, respectively.
Figure 9D:
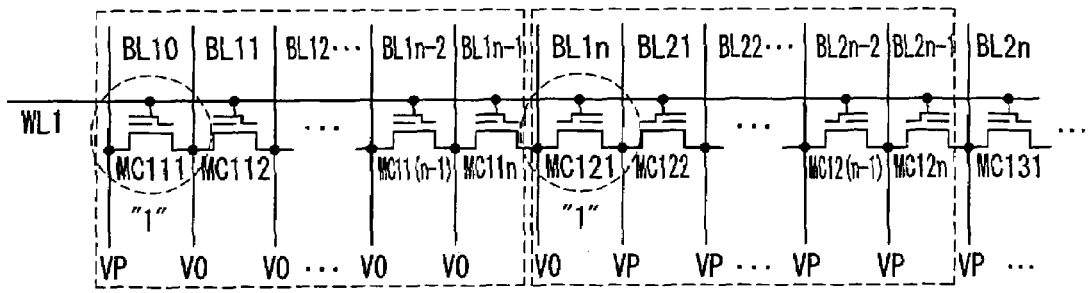
FIG. 9D shows voltages applied to bit lines when data 1 and data 1 are written into two adjacent areas of a memory cell array, respectively.

In the memory cell array 800 including asymmetrical memory cells of this embodiment, as shown in FIGS. 9A and 9C, when the voltage V0 is applied to the bit line BL2n connected with the memory cell MC12n farthest from the row decoder 801 in the second area from the row decoder 801 (i.e., the last memory cell in the area), data to be written into the first memory cell MC131 in the third area is restricted. In more detail, the voltage applied to the bit line BL2n is V0, and the memory cell MC131 connected with the bit line BL2n has a property opposite to that of the memory cell MC12n which shares the bit line BL2n with the memory cell MC131. Thus, only the voltage V0 can be applied to other bit line BL31 connected with the memory cell MC131. Because of this, data 1 cannot be written into the memory cell 131. Consequently, data having a sequence such as "001 - - -" or "101 - - -" cannot be written into the memory cell array.

For this reason, by the data conversion section 806, r-bit input data DA1 to DAr as input information is converted to r-bit conversion data as the two or more pieces of conversion information which can be simultaneously written, and the conversion data is written in one or more operations.

FIG. 10 shows a table held by the data conversion section 806, in which 4-bit first and second conversion data to which 4-bit input data has been converted are stored. Regarding input data whose second conversion data after conversion is "0000" in FIG. 10, conversion of data is not necessary, which means that the input data can be written into memory cells by one write operation.

As shown in FIG. 10, input data "0101", "1010", "1011" and "1101" cannot be written into the memory cells by one write operation due to the asymmetry of the memory cells, and require two write operations. For this reason, the data conversion section 806 converts input data "0101" to first conversion data "0001" and second conversion data "0100", input data "1010" to first conversion data "0010" and second conversion data "1000", input data "1011" to first conversion data "1000" and second conversion data "0011", and input data "1101" to first conversion data "0001" and second conversion data "1100". By writing the first and second conversion data into memory cells by two write operations, data can be written into the memory cells in four consecutive areas. By such a writing method, the average number of actual write operations can be 1.19 for all 4-bit input data. That is, according to the writing method of this embodiment, of all 4-bit input data, 3.37-bit data can be written into memory cells by one write operation.

FIGS. 11 and 12 show a table held by the data conversion section 806, in which first to third 6-bit conversion data to which 6-bit input data was converted are stored. Regarding input data whose second conversion data after conversion is "000000" in FIGS. 11 and 12, more conversion is not necessary, and the input data can be written into memory cells by one write operation. On the other hand, input data whose third conversion data after conversion is "000000" can be written into memory cells by two write operations for the first conversion data and second conversion data.

As shown in the table in FIGS. 11 and 12, input data "000101", "001010", "001011", "001101", "010001", "010100", "010110", "010111", "011010", "011011", "011101", "100010", "100011", "100101", "101000", "101001", "101100", "101101", "101110", "101111", "110001", "110100", "110110", "110111", "111010", "111011", and "111101" are each written into memory cells by two write operations for the first conversion data and second conversion data. On the other hand, input data "010101", "101010", "101011" and "110101" are each written into memory cells by three write operations for the first, second, and third conversion data. Because of this, although the write properties of the memory cells are asymmetrical, input data can be correctly written into memory cells in six consecutive areas by a relatively small number of write operations. By such a writing method, the average number of actual write operations can be 1.53 for all 6-bit input data. That is, according to the writing method of this embodiment, of all 6-bit input data, 3.91-bit data can be written by one write operation.

The data conversion section 806 performing such conversion of input data may have a memory such as a ROM in which tables as shown in FIGS. 10 to 12 are stored and a latch circuit, and read the tables using DA1 to DAr as addresses. Alternatively, the data conversion section 806 may also compute conversion data by a logic circuit.

When the data conversion section 806 calculates conversion data with a logic circuit, conversion data can be obtained by performing calculation as shown below. That is, when input data contains an odd number of 0s between 1 and 1, it is divided into two or more pieces of conversion data which do not contain an odd number of 0s between 1 and 1. In addition, the number of data 1 simultaneously written is made as many as possible to minimize the number of writing operations. As a result, x-bit input data can be written by 1 to x/2 operations.

FOURTH EMBODIMENT

Figure 13:
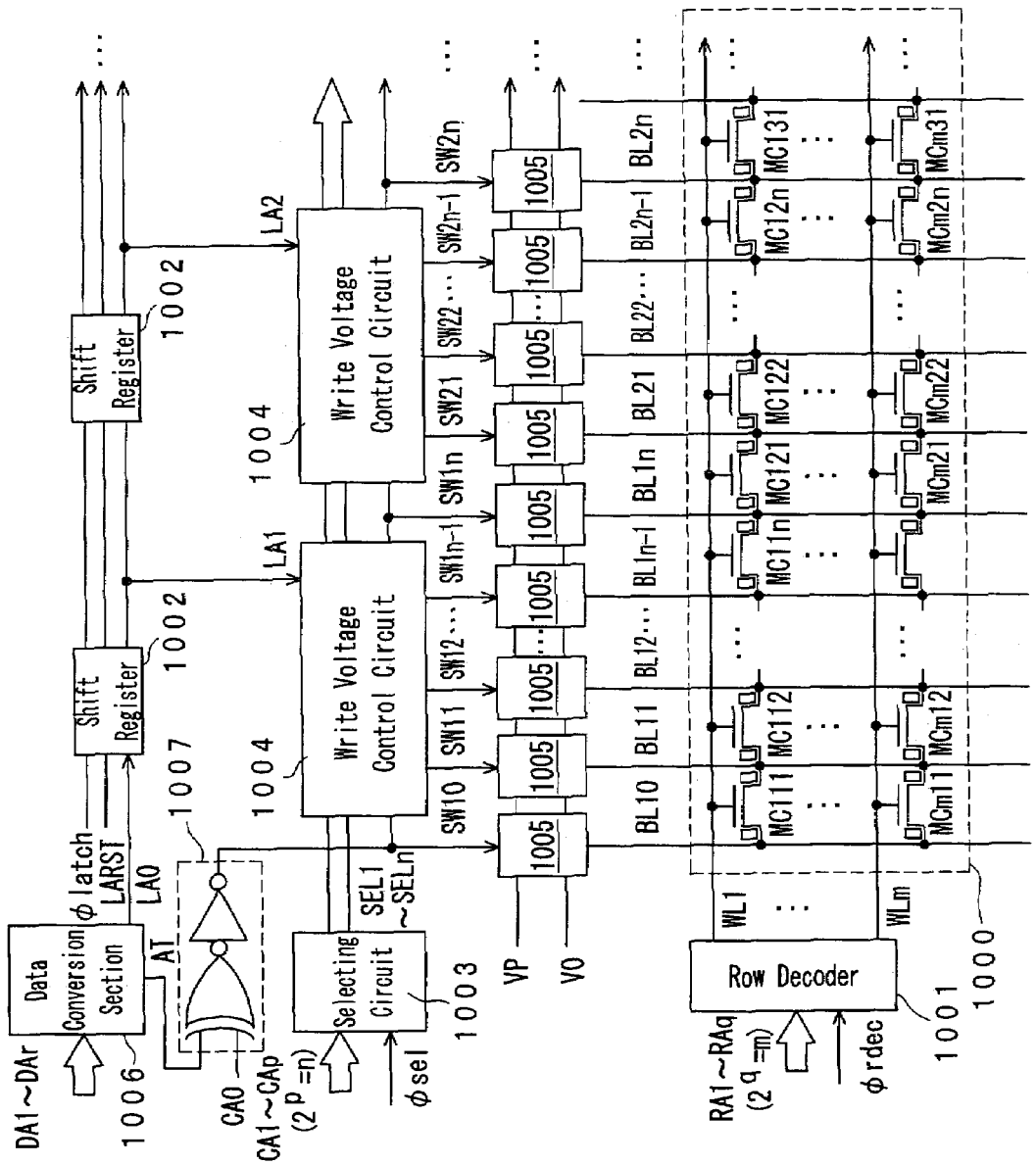
FIG. 13 is a block diagram showing a semiconductor memory device of a fourth embodiment.
Figure 14:
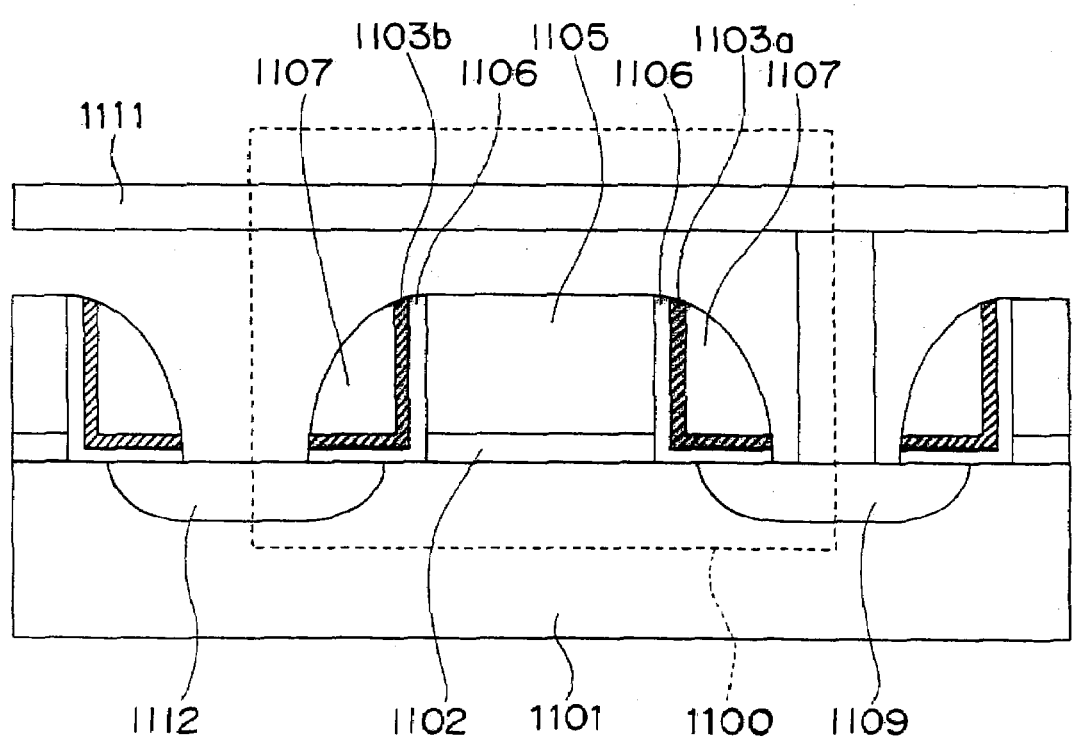
FIG. 14 is a cross-sectional view showing a side-wall memory used for the memory cells of the semiconductor memory device of the fourth embodiment.

FIG. 13 is a block diagram showing a semiconductor memory device of a fourth embodiment of the present invention. This semiconductor memory device uses a side-wall memory as shown in FIG. 14, which shows a cross-sectional view of a memory cell of the side-wall memory. Each of the memory cells 1100 of the side-wall memory has first and second silicon nitride films 1103a and 1103b which are nodes for storing charges, and stores 2-bit information.

Each of the memory cells of the semiconductor memory device of this embodiment has two storage nodes which are positioned at both sides of the control gate, and thereby has asymmetry similar to that of the third embodiment. For this reason, the semiconductor memory device of this embodiment has a data conversion section 1006 similar to the data conversion section of the third embodiment. In addition, since each of the memory cells has two storage nodes, the semiconductor memory device has an array-end write voltage control circuit 1007 peculiar to this embodiment. In FIG. 13, the reference numeral 1000 denotes a memory cell array consisting of side-wall memory cells, 1001 denotes a row decoder, 1002 denotes a shift register, and 1003 denotes a selecting circuit. In this embodiment, description will be made for portions different from the third embodiment, and description about portions similar to those of the third embodiment will be omitted.

Details of the structure of the side-wall memory are as follows. That is, on a substrate 1101, a word line 1105 functioning as a control gate is formed via a gate insulation film 1102, and the first and second silicon nitride films 1103a and 1103b are formed via the silicon oxide films 1106 at both sides of the word line 1105. Each of the first and second silicon nitride films 1103a and 1103b has a vertical portion extending substantially in parallel with a side wall of the word line 1105, and a horizontal portion extending from the lower end of the vertical portion substantially in parallel with the surface of the substrate 1101 and extending away from the word line 1105 to be shaped substantially like a letter L. On the sides of the first and second silicon nitride films 1103a and 1103b far from the word line 1105, silicon oxide films 1107 and 1107 are provided. The first and second silicon nitride films 1103a and 1103b are thus sandwiched between the silicon oxide films 1106 and 1107, so that the efficiency of charge injection at a write operation is increased to allow a high speed operation. The substrate 1101 has two diffusion regions which are formed in the proximity of the first and second silicon nitride films 1103a and 1103b. In more detail, a diffusion layer 1109 is formed to overlap part of the horizontal portion of the first silicon nitride film 1103a and to overlap part of the horizontal portion of the silicon nitride film contained in a next memory cell. Furthermore, a second bit line 1112 is formed to overlap part of the horizontal portion of the second silicon nitride film 1103b and to overlap part of the horizontal portion of the silicon nitride film contained in a next memory cell. The diffusion layer 1109 and second bit line 1112 each function as a source region or a drain region. A channel region is defined between the diffusion layer 1109 and the second bit line 1112 each functioning as a source region or a drain region. The diffusion layer 1109 is connected with a first bit line 1111 formed in the upper portion of the memory cell.

Voltages applied to bit lines at writing to this side-wall memory are as shown in Table 2 below.

TABLE 2

| | | Word Line (Voltage) | Bit Line BLj-1 (Voltage) | Bit Line BLj (Voltage) |
|---|---|---|---|---|
| Data 0 | | VWL | V0 | V0 |
| | | VWL | VP | VP |
| Data 1 | First Storage Node | VWL | VP | V0 |
| | Second Storage Node | VWL | V0 | VP |

As shown in Table 2, at writing of data 0 to a memory cell, VP (e.g., 5V) or V0 (e.g., 0V) is applied to both of two bit lines connected with the memory cell as in the case of the first embodiment. On the other hand, at writing of data 1, when data 1 is written into the first storage node 1103a, VP is applied to the bit line Bj–1, and V0 is applied to the bit line Bj, for example. When data 1 is written into the second storage node 1103b, V0 is applied to the bit line Bj–1, and VP is applied to the bit line Bj, for example.

The semiconductor memory device of this embodiment is different from the semiconductor memory device in the third embodiment in that the former has the array-end write voltage control circuit 1007. In more detail, a signal from the data conversion section 1006 are input to the write voltage control circuit 1004 or the write voltage applying circuit 1005 via the array-end write voltage control circuit 1007. In this embodiment, SW10 is produced using a data signal LA1 from the data conversion section 1006, and an address CA0 for selecting one of two storage nodes of a memory cell, by the array-end write voltage control circuit 1007 consisting of an EX-NOR gate and an inverter. Because of this, data having a given sequence can be written into memory cells in adjacent areas.

FIGS. 15A to 15D show voltages to be applied to bit lines when data 0 and 0, data 0 and 1, data 1 and 0, and data 1 and 1 are written, respectively, into the adjacent first and second areas of the memory cell array 1000. Furthermore, FIGS. 16A to 16D show voltages to be applied to bit lines when data 0 and 0, data 0 and 1, data 1 and 0, and data 1 and 1 are written, respectively, into the adjacent first and second areas of the memory cell array 1000. In FIGS. 15A to 15D and FIGS. 16A to 16D, storage nodes to which writing is carried out are surrounded with broken line circles.

Figure 15A:
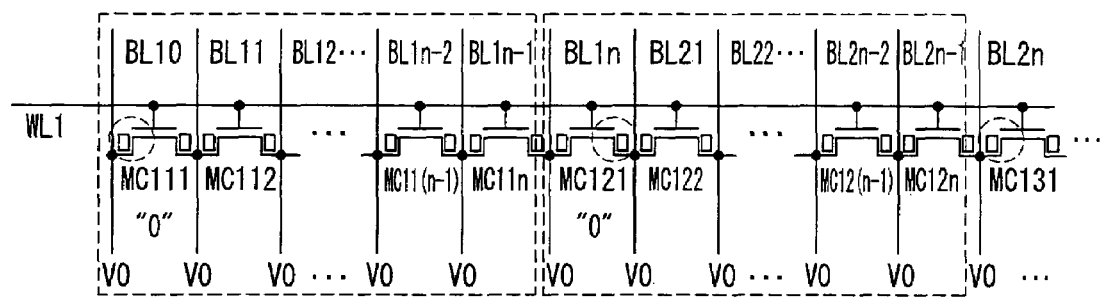
FIG. 15A shows voltages applied to bit lines when data 0 and data 0 are written into two adjacent areas of a memory cell array, respectively.
Figure 15B:
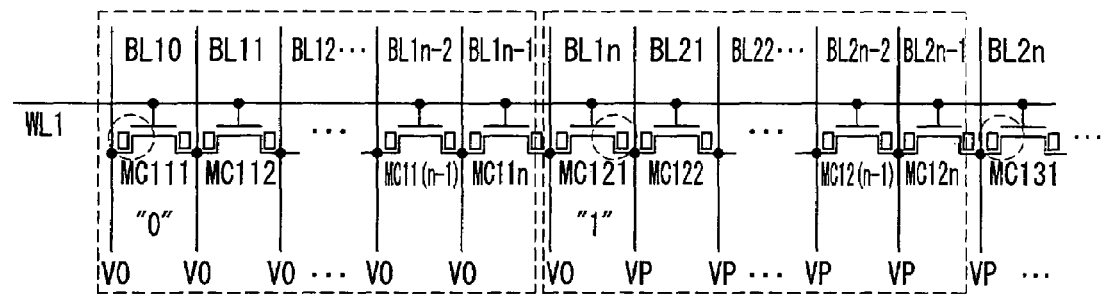
FIG. 15B shows voltages applied to bit lines when data 0 and data 1 are written into two adjacent areas of a memory cell array, respectively.

As shown in FIG. 15A, when writing is carried out to the first storage node (left side of MC111 in FIG. 15A) of the first memory cell in the first area, writing is carried out to the second storage node (right side of MC121) of the first memory cell in the second area, and to the first storage node (left side of MC131) of the first memory cell in the third area. In other words, for memory cells in adjacent areas, writing is carried out alternately between the first node and the second node. When writing is carried out to the first node of the first memory cell in the first area, a signal CA0 inputted to the array-end write voltage control circuit 1007 is 0.

Figure 16A:
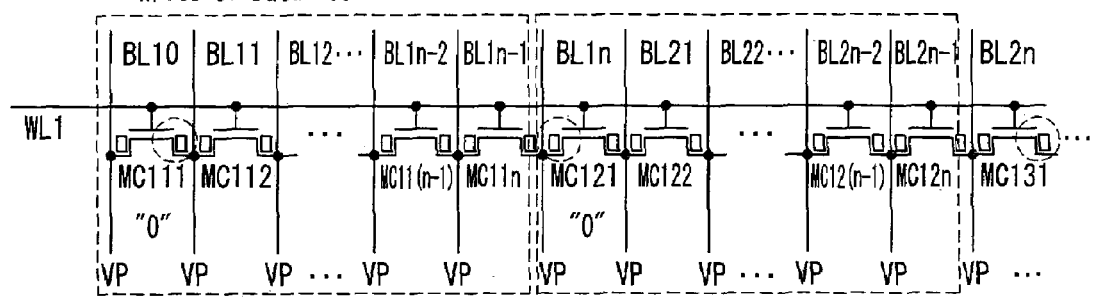
FIG. 16A shows voltages applied to bit lines when data 0 and data 0 are written into two adjacent areas of a memory cell array, respectively.
Figure 16B:
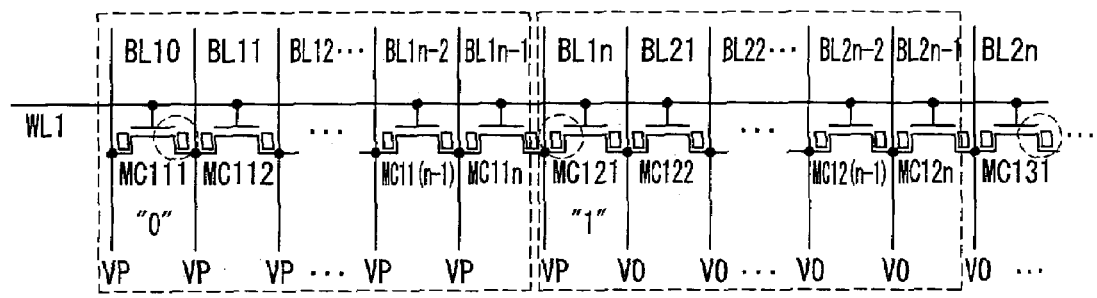
FIG. 16B shows voltages applied to bit lines when data 0 and data 1 are written into two adjacent areas of a memory cell array, respectively.

On the other hand, as shown in FIG. 16A, by carrying out writing to storage nodes different from those in FIG. 15A in memory cells in each area, the same data as FIG. 15A can be written. That is, when writing is carried out to the second storage node (right side of MC111 in FIG. 16) of the first memory cell in the first area, writing is carried out to the first storage node (left side of MC121) of the first memory cell in the second area, and to the second storage node (right side of MC131) of the first memory cell in the third area. In other words, for memory cells in adjacent areas, writing is carried out alternately between the first node and the second node. When writing is carried out to the second node of the first memory cell in the first area, a signal CA0 inputted to the array-end write voltage control circuit 1007 is 1.

Figure 15C:
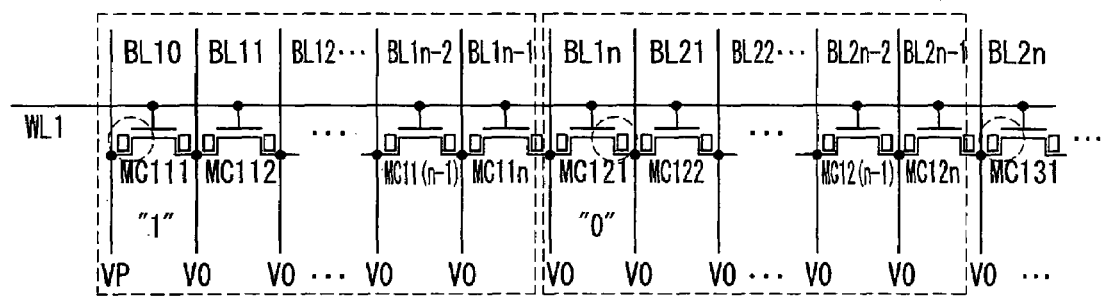
FIG. 15C shows voltages applied to bit lines when data 1 and data 0 are written into two adjacent areas of a memory cell array, respectively.
Figure 15D:
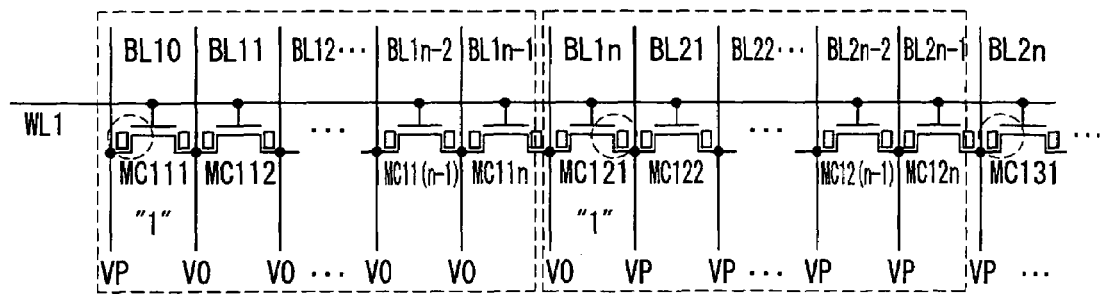
FIG. 15D shows voltages applied to bit lines when data 1 and data 1 are written into two adjacent areas of a memory cell array, respectively.
Figure 16C:
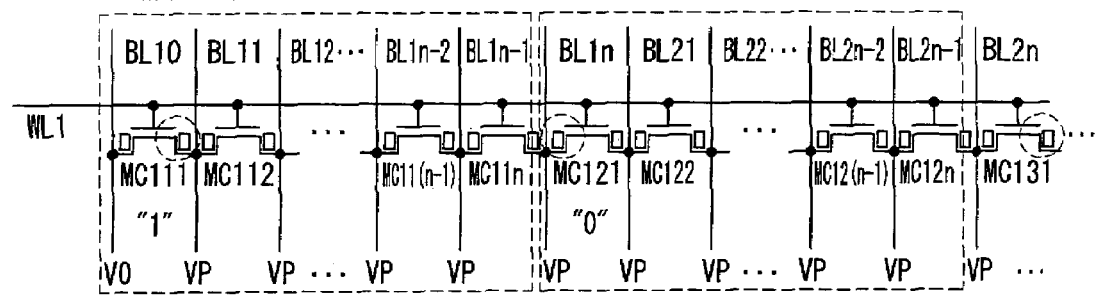
FIG. 16C shows voltages applied to bit lines when data 1 and data 0 are written into two adjacent areas of a memory cell array, respectively.
Figure 16D:
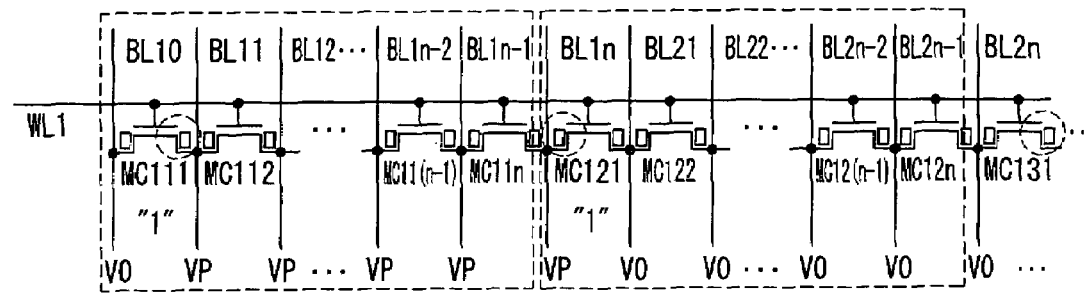
FIG. 16D shows voltages applied to bit lines when data 1 and data 1 are written into two adjacent areas of a memory cell array, respectively.

In such a writing method, in FIGS. 15C and 16C, when 1 and 0 are written into the first area and the second area, 1 cannot be written into the third area at the same time. That is, an odd number of 0s cannot be written between 1 and 1 at the same time. For this reason, as in the case of the third embodiment, input data is converted by the data conversion section 1006, and obtained conversion data is written by two or more operations. The input data conversion method of the data conversion section 1006 may be identical to that of the data conversion section 806 of the third embodiment.

As described above, in this embodiment, any given data can be written by a relatively small number of write operations while obtaining an advantage of high-speed rewrite operation of the side-wall memory.

FIFTH EMBODIMENT

Figure 17:
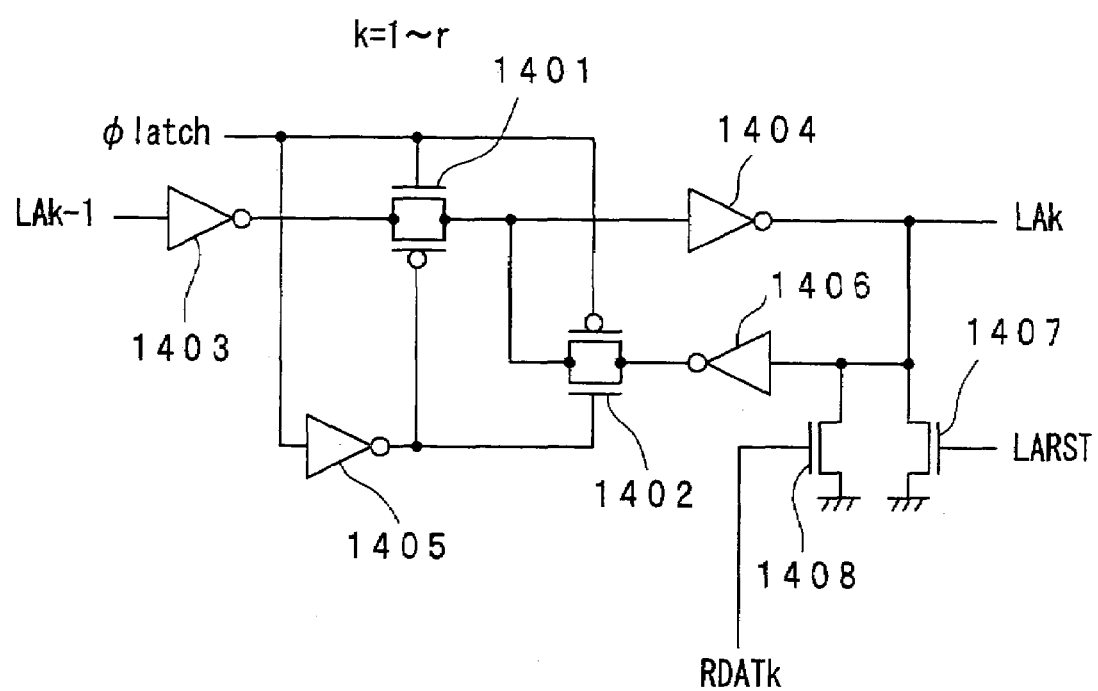
FIG. 17 is a circuit diagram showing a shift register provided in a semiconductor memory device of a fifth embodiment.

FIG. 17 is a circuit diagram showing a shift register provided in a semiconductor memory device of a fifth embodiment of the present invention.

When data is written into a memory cell, a write verify operation is carried out that confirms whether data was correctly written into the memory cell. When data is simultaneously written into two or more memory cells, there may be a variation in the write finish times of the memory cells due to the variation of the properties of the memory cells. In this case, when excessive writing that applies write voltage also after writing has finished does not become a problem for the memory cells, application of write voltage can be continued until writing to all cells to which writing is to be carried out has finished.

However, when memory cells for which excessive writing becomes a problem are used, the output from the shift register should be stopped in order to finish the application of write voltage at the time when writing has been completed. For this reason, shift registers as shown in the circuit diagram of FIG. 17 are used.

In FIG. 17, the reference numeral 1401 denotes a CMOS transfer gate which is turned on by the leading edge of the ølatch pulse, and the reference numeral 1402 denotes a CMOS transfer gate which is turned on by the trailing edge of the ølatch pulse. The reference numerals 1403, 1404, 1405, and 1406 each denote an inverter. The inverters 1404 and 1406 at the output side of the CMOS transfer gate 1401 constitute an inverter pair when the COMS transfer gate 1402 is turned on. The reference numeral 1407 denotes a transistor for grounding the output line by the reset control signal LARST, and the reference numeral 1408 denotes a transistor for grounding the output line by the signal RDATk.

In the circuit of FIG. 17, LARST is turned to a low level to release the reset, and then write data is input at LA0 in succession while giving a pulse to ølatch. On the other hand, by a verify operation, when data RDATk read from, for example, a sense amplifier or the like becomes 1, the transistor 1408 is turned on and thereby the output line is grounded. Because of this, the contents of the shift register are cleared. As a result, the output from the shift register to the write voltage control circuit is stopped so that excessive writing to a memory cell is prevented. The shift registers of this embodiment can be used as the shift registers 102, 402, 802, and 1002 of the first to fourth embodiments. In this embodiment, the sense amplifier functions as a write detection circuit, and the shift register functions as a voltage reset circuit.

SIXTH EMBODIMENT

Figure 18:
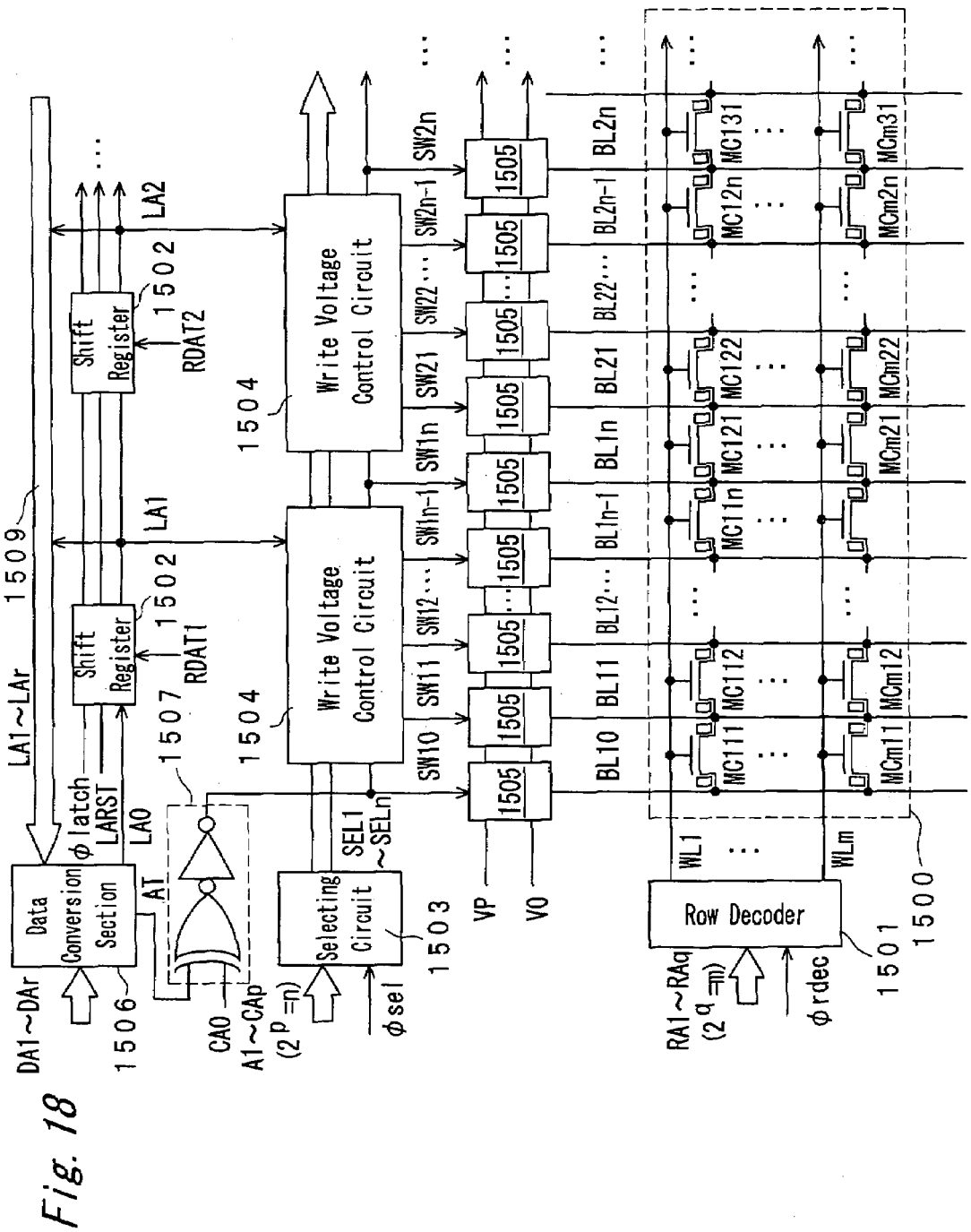
FIG. 18 is a block diagram showing a semiconductor memory device of a sixth embodiment.

FIG. 18 is a block diagram showing a semiconductor memory device of a sixth embodiment of the present invention. This semiconductor memory device has shift registers 1502 similar to the shift registers of the fifth embodiment. The semiconductor memory device of this embodiment has a configuration similar to that of the fourth embodiment shown in FIG. 13 except the shift registers 1502 and a feedback circuit 1509 for feeding back the outputs LA1 to LAr from the shift registers 1502 to a data conversion section 1506. In FIG. 18, the reference numeral 1500 denotes a memory cell array consisting of side-wall memory cells, 1501 denotes a row decoder, 1503 denotes a selecting circuit, 1504 denotes a write voltage control circuit, 1505 denotes a write voltage applying circuit, and 1507 denotes an array-end write voltage control circuit.

In this embodiment, description will be made for portions different from the fourth embodiment, and description about portions similar to those of the fourth embodiment will be omitted.

In semiconductor memories in which excessive writing to memory cells is a problem, such as semiconductor memories which include memory cells having a symmetric write property as in the first and second embodiments, the excessive writing can be prevented without any problem by using the shift registers of the fifth embodiment. On the other hand, in semiconductor memories having asymmetrical memory cells as in the third embodiment, or having side-wall memory cells as in the fourth embodiment, when a shift register has been cleared, it is necessary to newly receive write data from the data conversion section with respect to data corresponding to other registers.

For this reason, in the semiconductor memory device of this embodiment, as shown in FIG. 18, the outputs LA1 to LAr from the shift registers 1502 are fed back to the data conversion section 1506 via the feedback circuit 1509. Because of this, when the shift registers 1502 corresponding to memory cells have been cleared, conversion data about data for which write operations are further carried out to other memory cells can be newly output to the corresponding shift registers 1502 from the data conversion section 1506. As a result, in the semiconductor memory device having the memory cell array 1500 consisting of side-wall memory cells, writing of data is surely carried out while preventing excessive writing. Thus, the shift registers 1502 and the feedback circuit 1509 function as a conversion information renewal circuit.

In this connection, the shift registers 1502 and the feedback circuit 1509 may be applied to the semiconductor memory device of the third embodiment using asymmetrical memory cells.

SEVENTH EMBODIMENT

FIGS. 19, 20 and 21 show an example of tables contained in the data conversion section provided in a semiconductor memory device of a seventh embodiment of the present invention. FIG. 19 shows a table used for the conversion of 4-bit data, FIGS. 20 and 21 show a table used for the conversion of 6-bit data. In the semiconductor memory device of this embodiment, excessive writing to asymmetrical memory cells can be prevented, and the number of write operations can be also prevented from increasing.

When excessive writing to memory cells is a problem as explained in the sixth embodiment, if the tables shown in FIGS. 10 to 12 of the third and fourth embodiments are used, there is a case that the time of a write operation becomes long, as will be described below. That is, when 4-bit data "0111", for example, is simultaneously written, if writing to a memory cell to which data 1 of the second bit is written has finished before writing to any other memory cells, data "0101" is newly read to the sift registers. In this case, since one 0 which is a odd number of 0 exits between 1 and 1, simultaneous writing cannot be carried out, so that as apparent from the column of the input data "0101" in FIG. 10, it is required that further data conversion be performed and two write operations be carried out. Thus, time required for write operations becomes long.

For this reason, in the semiconductor memory device of this embodiment, tables as shown in FIGS. 19 to 21 are stored in the data conversion section. The tables in FIGS. 19 to 21 are partially modified from the tables in FIGS. 10 to 12 of the third embodiment, and the portions different from FIGS. 10 to 12 are surrounded with broken lines. In the tables of this embodiment, the number of is contained in the conversion data is two or less. Because of this, the number of memory cells into which data 1 is written at writing is always two or less. Thus, when the number of memory cells into which data 1 is written is two, even if writing to either one of these memory cells has finished before the other one, the number of memory cells to which writing is continued is one so that new write data for memory cells to which writing should be continued does not need to be reconverted. As a result, it is possible to prevent excessive writing while preventing the number of write operations from increasing. Furthermore, the semiconductor memories of the third and fourth embodiments may have the same operation and effect as this embodiment without any circuit modification just by substituting the tables of this embodiment for the tables of the data conversion sections 806 and 1006.

According to the tables in FIGS. 19 to 21, the average number of write operations for conversion data to which input data is converted is 1.38 for 4-bit data, and 1.97 for 6-bit data. On the other hand, according to the tables in FIGS. 10 to 12, the average number of write operations for conversion data is 1.19 for 4-bit data, and 1.53 for 6-bit data. Thus, there is a little increase in average number of write operations. However, the conversion data in the tables of FIGS. 10 to 12 may need further conversion due to the variation in the write times of the memory cells. When such further conversion is made, the write time will be extremely larger than that for writing of conversion data according to the tables of this embodiment. In contrast to this, in this embodiment, further conversion of the conversion data is surely prevented, so that writing can be carried out by a relatively small number as originally specified of write operations without causing excessive writing.

The data conversion section of the semiconductor memory device of this embodiment may produce the conversion data in the tables shown in FIGS. 19 to 21 by using a circuit.

EIGHTH EMBODIMENT

Figure 22:
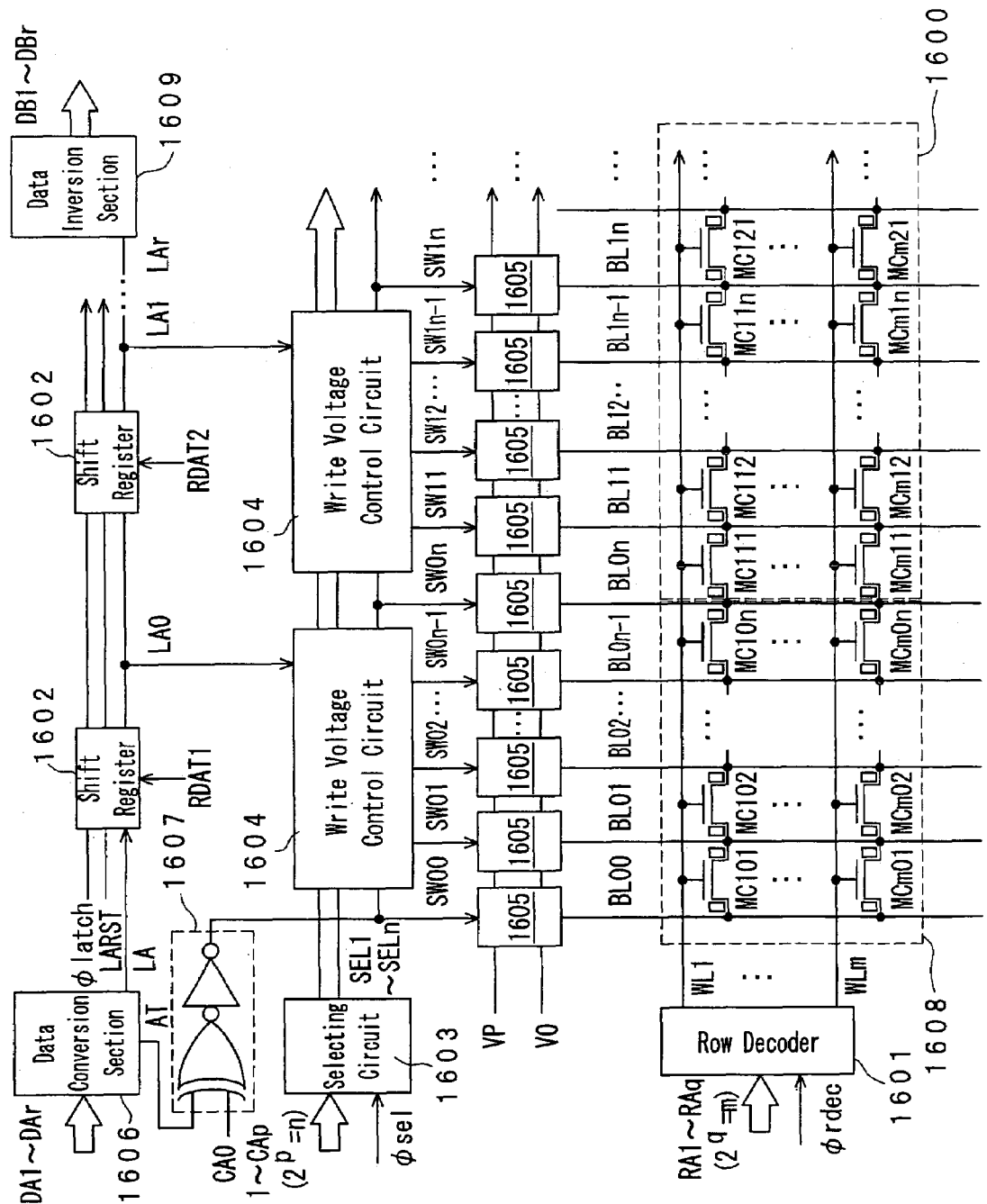
FIG. 22 is a block diagram showing a semiconductor memory device of an eighth embodiment.

FIG. 22 is a block diagram showing a semiconductor memory device of an eighth embodiment of the present invention. The semiconductor memory device of this embodiment has a configuration similar to that of the fourth embodiment shown in FIG. 13 except shift registers 1602, a data conversion section 1606, a redundant memory cell array 1608 and a data inversion section 1609. In FIG. 22, the reference numeral 1600 denotes a memory cell array consisting of side-wall memory cells, 1601 denotes a row decoder, 1603 denotes a selecting circuit, 1604 denotes a write voltage control circuit, 1605 denotes a write voltage applying circuit, and 1607 denotes an array-end write voltage control circuit.

Figure 23:
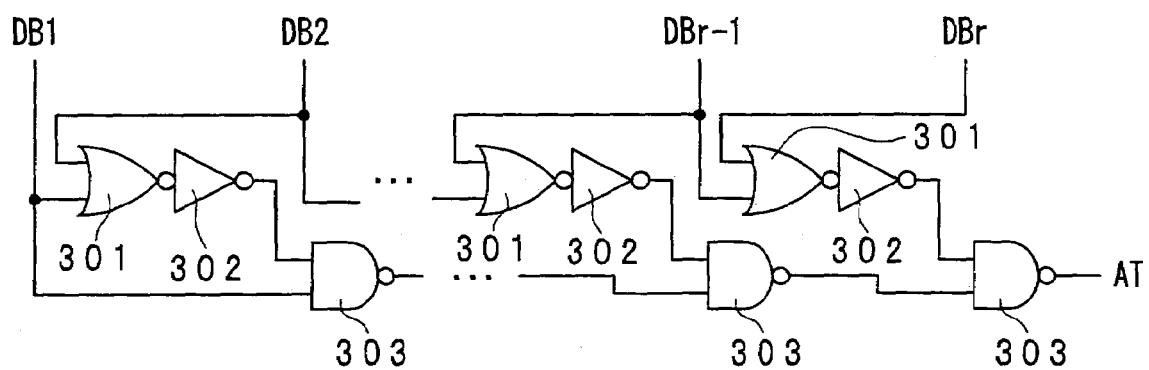
FIG. 23 is a block diagram showing an array-end voltage control circuit.

FIG. 23 is a block diagram showing an array-end voltage control circuit provided in the data conversion section 1606. In FIG. 23, the reference numerals 301 and 302 denote a NOR gate and an inverter, respectively, for performing NOR operation between output data DBk−1 and DBk (k=1 to r) of adjacent memory cells to output inverted information, and the reference numeral 303 denotes a NAND gate for performing NAND operation between the output of the inverter and the output data DBk−1 of the memory cell. The output AT of the array-end voltage control circuit is input to the array-end write voltage control circuit 1607 to determine a voltage (V0 or VP in this embodiment) to be applied to the first bit line BL00.

In this embodiment, description will be made for portions different from the fourth embodiment, and description about portions similar to those of the fourth embodiment will be omitted.

As understood from FIGS. 19 to 21 of the seventh embodiment, when x-bit input data is simultaneously written, data which requires the maximum number of write operations of x/2 times is limited. For example, in the case of 4-bit input data, 7 out of the 16 pieces of data require the maximum number of write operations. Furthermore, in the case of 6-bit input data, 15 out of the 64 pieces of data require the maximum number of write operations. For this reason, in the semiconductor memory device of this embodiment, a redundancy bit of 1-bit as redundancy information is added to input data at the data conversion section 1606. Then, the redundancy bit is set to 1 for input data which requires the maximum number of write operations, and the bits other than the redundancy bit of the input data are converted to identification information for which the number of write operations is less than x/2 to thereby make redundancy-bit added data. Then, the redundancy-bit added data is converted to conversion data, which is written into memory cells. In other words, the data conversion section 1606 of this embodiment functions as a redundancy added information output section and a conversion section. At reading, data in which the redundancy bit is 1 is inverted to reproduce the input data. The operation of the semiconductor memory device of this embodiment will be described in detail below.

In FIG. 22, in the redundant memory cell array 1608, memory cells for storing the redundant bit data are arranged. The total number of the memory cells contained in the redundant memory cell array 1608 and the memory cell array 1608 for storing bit data other than the redundant bit data is m×n×(r+1). In this expression, r is the number of areas contained in the memory cell array.

FIGS. 24 and 25 show a table used for conversion of 6-bit input data carried out by the data conversion section 1606. In FIGS. 24 and 25, listed from the leftmost column are input data, redundancy-bit added data in which a redundancy bit is added, first write data after conversion, and the second write data after conversion.

As shown in FIGS. 24 and 25, redundancy-bit added data corresponding to 15 pieces of input data "010101", "010111", "011101", - - - , and "011111" for which the number of write operations is up to three in FIGS. 20 and 21 has the redundancy bit (at the highest place) of 1. In addition, bits (at lower places than the redundancy bit) other than the redundancy bit of the redundancy-bit added data have been replaced with data for which the number of write operations is two or less. On the other hand, redundancy-bit added data corresponding to input data for which the number of write operations is two or less (i.e., data in which bits at all places of the third conversion data are 0.) in FIGS. 20 and 21 has the redundancy bit of 0, and bits other than the redundancy bit of the redundancy-bit added data are same as those of the input data. The thus obtained redundancy-bit added data is converted to the first conversion data and the second conversion data by conversions similar to those of the seventh embodiment, but no third conversion data is produced. In other words, all the redundancy-bit added data can be written into the redundant memory cell array 1608 and the memory cell array 1600 by the first write operation only or the first and second write operations. As a result, the average number of write operations for all the redundant-bit added data in FIGS. 24 and 25 is 1.68, which is less than 1.97 that is the average number of write operations of the seventh embodiment, and thereby the write speed can be effectively increased.

When the data written into the redundant memory cell array 1608 and the memory cell array 1600 is read, it is read out as RDATj through the sense amplifier as a read circuit to the shift register 1602. The data read out to the shift register 1602 is transferred in succession according to ølatch pulses inputted to the shift registers 1602, and is input as a series of data LAk to the data inversion section 1609 as an inversion circuit. In this data inversion section 1609, the read data RDATk is inverted, i.e., inversely converted. That is, the redundancy-bit added data in FIGS. 24 and 25 is converted to the input data. Data obtained by the inversion is output as output data DBk from the data inversion section 1609.

In the semiconductor memory device of this embodiment, by carrying out write operations and read operations in the manner as described above, writing requires the number of write operations less than the maximum number of write operations in the seventh embodiment, and thereby the write time can be surely reduced.

NINTH EMBODIMENT

Figure 26:
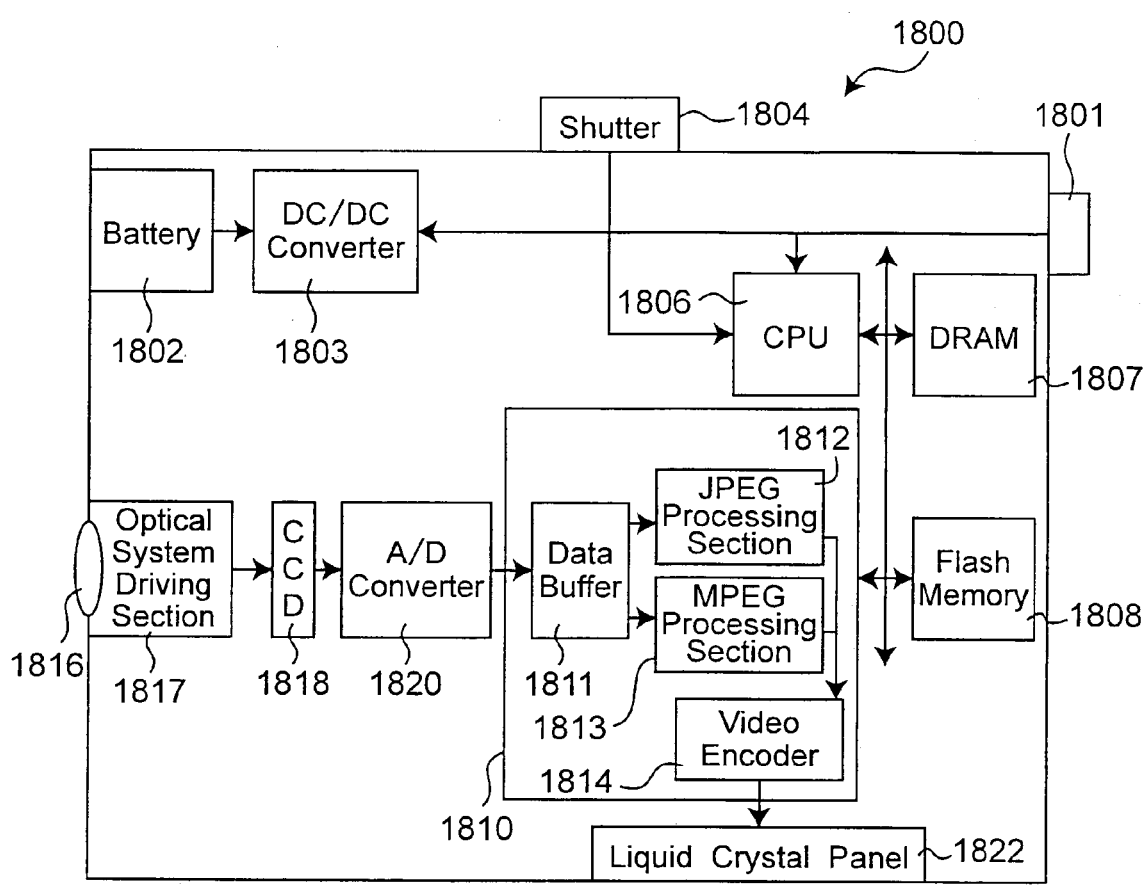
FIG. 26 is a block diagram showing a digital camera as electronic equipment of a ninth embodiment.

FIG. 26 is a block diagram showing a digital camera as electronic equipment of a ninth embodiment of the present invention. The digital camera has the semiconductor memory device of the eighth embodiment of the present invention as a flash memory in which captured images are stored.

As shown in FIG. 26, in the digital camera, when a power switch 1801 is turned on by an operator, the power supplied from a battery 1802 is transformed to a predetermined voltage by the DC/DC converter 1803 and is supplied to the components of the camera. Light which has entered through a lens 1816, which is driven by an optical system driving section 1817, is converted to a current by a CCD 1818. The current is converted to a digital signal by an A/D converter 1820. The digital signal is input to a data buffer 1811 of an image processing section 1810. The signal inputted to the data buffer 1811 is processed as a moving image by an MPEG processing section 1813, and is then converted to a video signal through a video encoder 1814. The video signal is displayed on a liquid crystal panel 1822. When the operator presses a shutter 1804, information in the data buffer 1811 is processed as a still image in a JPEG processing section 1812, and is then stored in a flash memory 1808. In the flash memory 1808, system programs are also stored in addition to the captured image information. A DRAM 1807 is used to temporarily store data produced in various processes of a CPU 1806 and the image processing section 1810.

Information having large information contents such as image information, and voice information is stored in the flash memory 1808, so that writing, reading, and erasing of large amounts of data are carried out. The flash memory 1808 is a semiconductor memory device according to the eighth embodiment of the present invention, and has a redundant memory cell array and a memory cell array which include side-wall memories as memory cells. Thus, the flash memory 1808 has two storage sections in each memory cell to have a high degree of integration, and is able to adopt a virtual ground system, so that it can be manufactured at low cost. In addition, in the flash memory 1808, input data is converted to redundancy-bit added data to be written, so that a plurality of bits can be simultaneously written at high speed while preventing excessive writing. Consequently, a flash memory 1808 which is cheap because of a small chip area and to which writing is carried out at high speed can be obtained, and eventually a digital camera which is small and cheap and is capable of storing a captured image at high speed can be obtained.

TENTH EMBODIMENT

Figure 27:
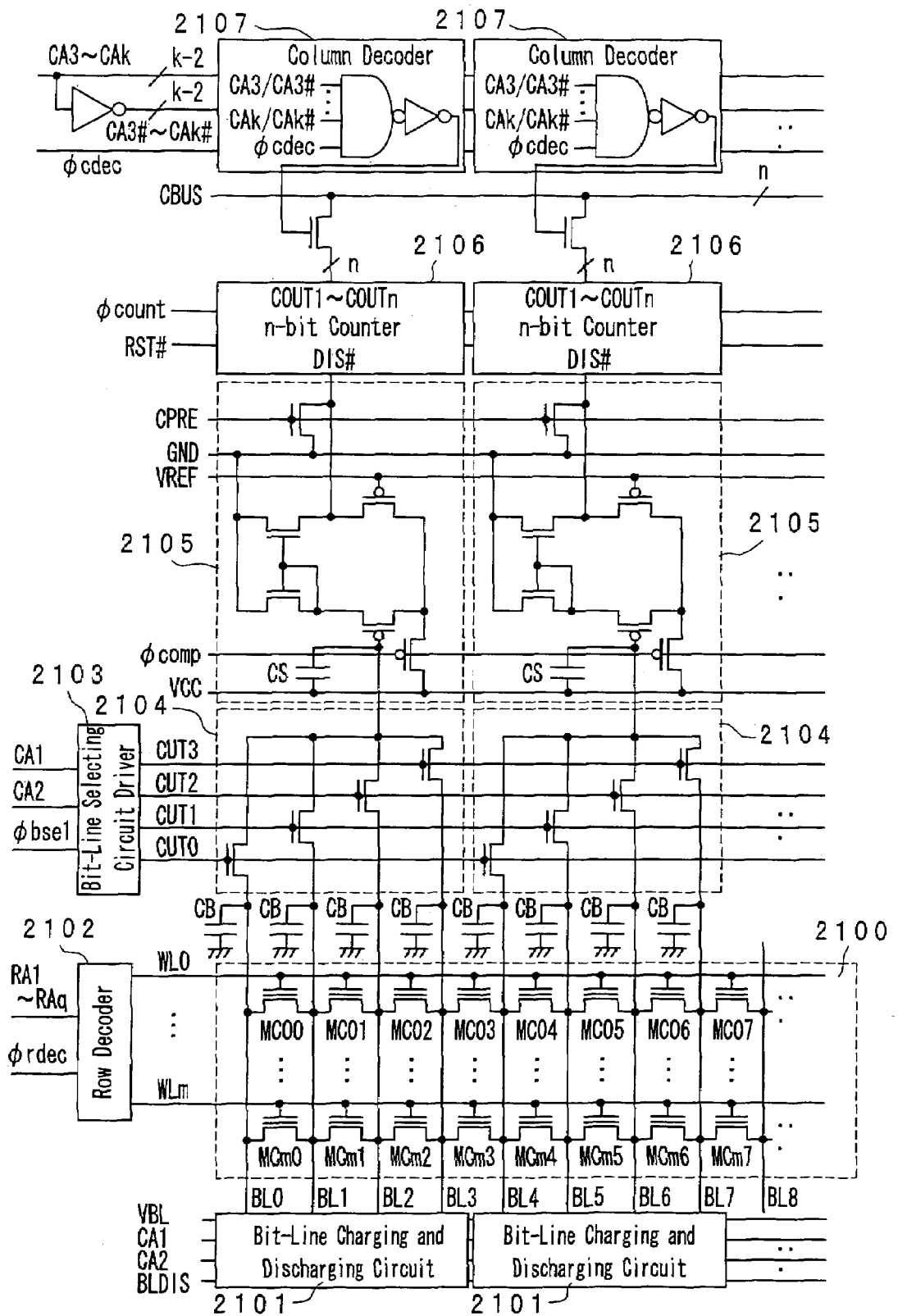
FIG. 27 shows a semiconductor memory device of a tenth embodiment of the present invention.

FIG. 27 shows a semiconductor memory device of a tenth embodiment of the present invention. The semiconductor memory device has a memory cell array 2100 in which lots of nonvolatile memory cells MC00, MC01, - - - , MCm0, MCm1, - - - are arranged in the form of a matrix. A plurality of word lines WL0 to WLm extend in the row direction of this memory cell array 2100, and each of the word lines is connected with the control gates of memory cells aligning in the same row. Furthermore, a plurality of bit lines BL0-BLm extend in the column direction of the memory cell array 2100, and each of the bit lines is connected with the input and output terminals, i.e., sources and drains of memory cells aligning in the same column to connect the sources and the drains to each other. The bit lines BL0 to BLm are connected with bit-line charging and discharging circuits 2101 every four lines. The word lines WL0 to WLm are connected with a row decoder 2102 for selecting a given word line. The bit lines BL0 to BLm are connected with bit-line selecting circuits 2104 for selectively switching the connections between the bit lines and comparators 2105 described later. Bit-line selecting signals CUT0 to CUT3 for controlling the switching of the bit-line selecting circuits 2104 are input to them from a bit-line selecting circuit driver 2103. The bit-line selecting circuits 2104 are connected with the comparators 2105 for comparing the voltages of bit lines selected by the bit-line selecting circuits 2104 with a reference voltage VREF. In addition, this semiconductor memory device also has n-bit counters 2106 capable of stopping counting operations by the outputs DIS# of the comparators 2106, and column decoders 2107 for outputting the decoding results to a bus line CBUS of n-bit width. The comparators 2105 and n-bit counters 2106 correspond to the cell current related value read circuit according to the present invention.

In the memory cell array of this semiconductor memory device, the virtual grounding scheme is employed as a connection scheme for the bit lines BL0 to BLm, and reading operations for one of every four bit lines are simultaneously carried out under the operations of the bit-line selecting circuits 2104. However, the connection system for the bit lines may be a fixed grounding system, and any kinds of bit-line selecting circuits may be used. Alternatively, there may be no bit-line selecting circuit. An important thing is that a selected bit line is connected to one of the inputs of the comparator 2105 for a fixed time period.

Reading Operation

Figure 28:
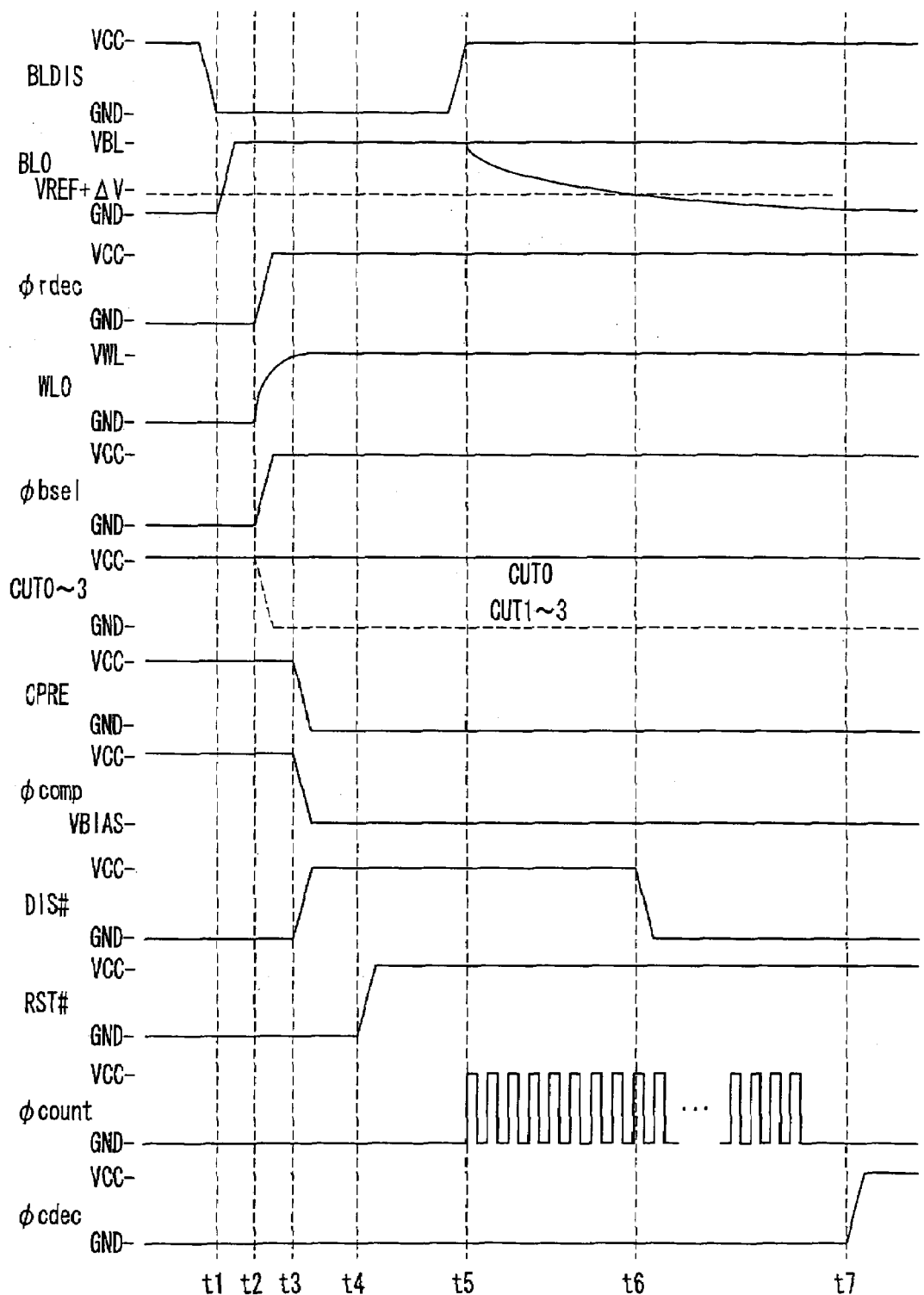
FIG. 28 is a timing chart illustrating a read operation of a semiconductor memory device.

FIG. 28 is a timing chart illustrating a read operation of the semiconductor memory device of this embodiment. Signal names in FIG. 28 correspond to the signal names attached to the signal lines in FIG. 27.

Here, the reading operation for the memory cell MC00 connected with the word line WL0 will be described.

At first, at time t1, BLDIS of the bit-line charging and discharging circuit 2101 is turned to a low level to charge all the bit lines.

Figure 29:
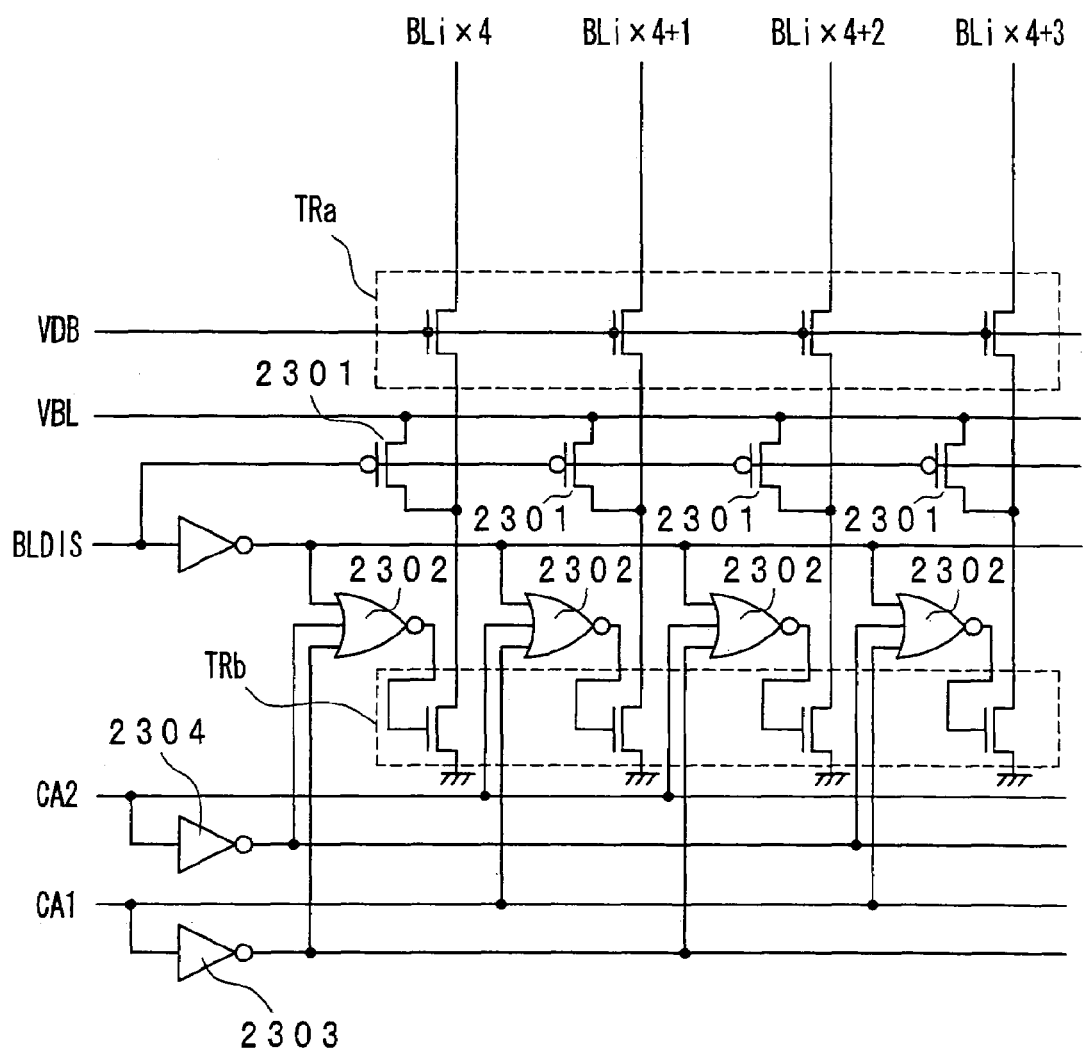
FIG. 29 is a circuit diagram showing an example of a bit-line charging and discharging circuit.

FIG. 29 is a circuit diagram showing an example of the bit-line charging and discharging circuit 2101. In FIG. 29, TRa denotes a transistor block for turning on or off the connections of the bit lines BLi to BLi+3 to the charging and discharging circuits based on the signal VDB, the reference numeral 2301 denotes a PMOS transistor for controlling the application of the charge voltage VBL, TRb denotes a transistor block for turning on or off the connections of bit lines BLi to BLi+3 to the ground, and the reference numeral 2302 denotes NOR gates for controlling the discharge of the bit lines BLi to BLi+3 based on the signals CA1, CA2, and BLDIS from the control circuit which is not shown in the figures. The reference numerals 2303 and 2304 denote inverters for inverting the signals CA1 and CA2, respectively.

Next, ørdec is turned to a high level to cause the voltage of the selected word line WL0 to rise to the level of the voltage VWL. At the same time, øbsel of the bit-line selecting circuit driver 2103 is turned to a high level to turn the signals CUT1 to CUT3 corresponding to bit lines other than one bit line selected from the four bit lines to a low level.

Figure 30:
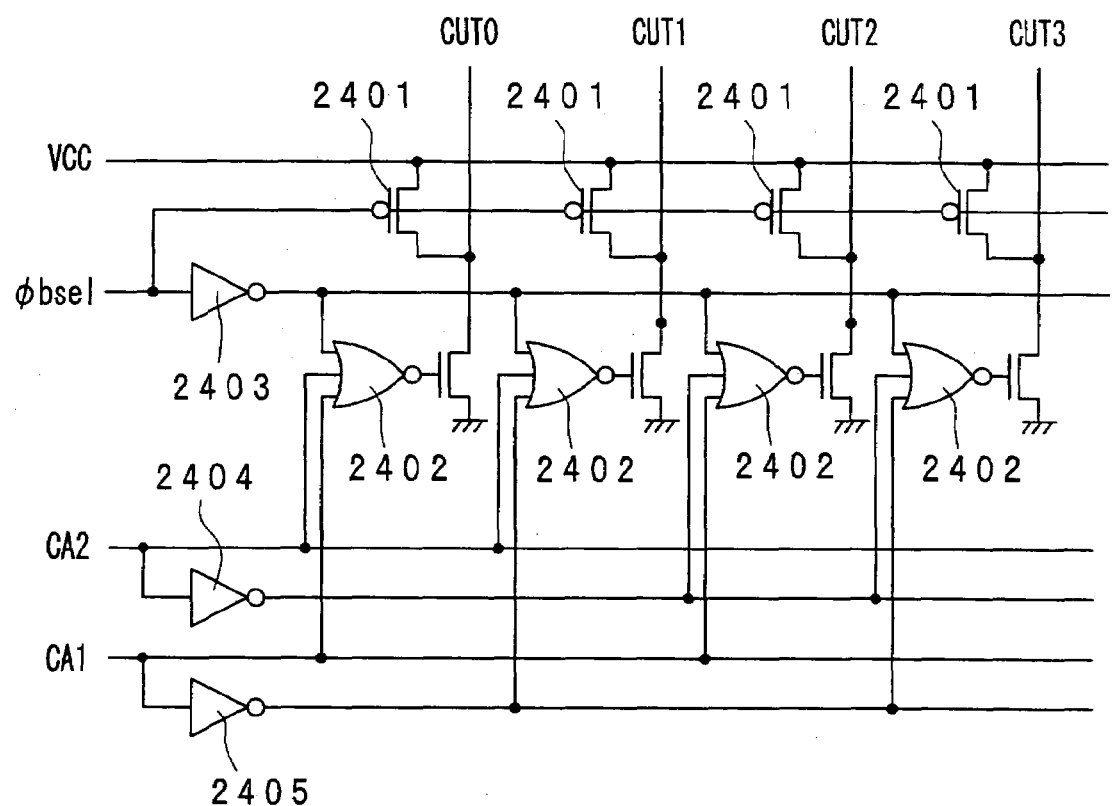
FIG. 30 is a circuit diagram showing an example of a bit-line selecting circuit driver.

FIG. 30 is a circuit diagram showing an example of the bit-line selecting circuit driver 2103. In FIG. 30, the reference numeral 2401 denotes PMOS transistors for switching the application of VCC potential to the output lines of CUT0 to CUT3, the reference numeral 2402 denotes NOR gates for controlling the grounding of the output lines of CUT0 to CUT3, and the reference numerals 2403, 2404, and 2405 each denote an inverter.

When the signals CUT1 to CUT3 are turned to the low level, only the selected bit lines BL0, BL4, - - - are each connected to one of the inputs of corresponding one of the comparators 2105. To the other input of the comparators 2105, a reference voltage VREF which is lower than the charge voltage VBL for the bit lines has previously been input. Furthermore, CPRE for the comparators is set at VCC level, the output DIS# is set at GND level.

Next, at time t3, CPRE for the comparators 2105 is turned to the low level to finish the discharge of the outputs DIS#, and øcomp falls to a bias voltage VBIAS to operate the comparators 2105. Since the charge voltage VBL for the bit lines and the reference voltage VREF which is lower than the charge voltage VBL are input to the two inputs of each of the comparators 2105, the outputs DIS# become VCC level. Then, at time t4, the reset signal RST# for counters is turned to the high level to make the counters 2106 operative.

Figure 31A:
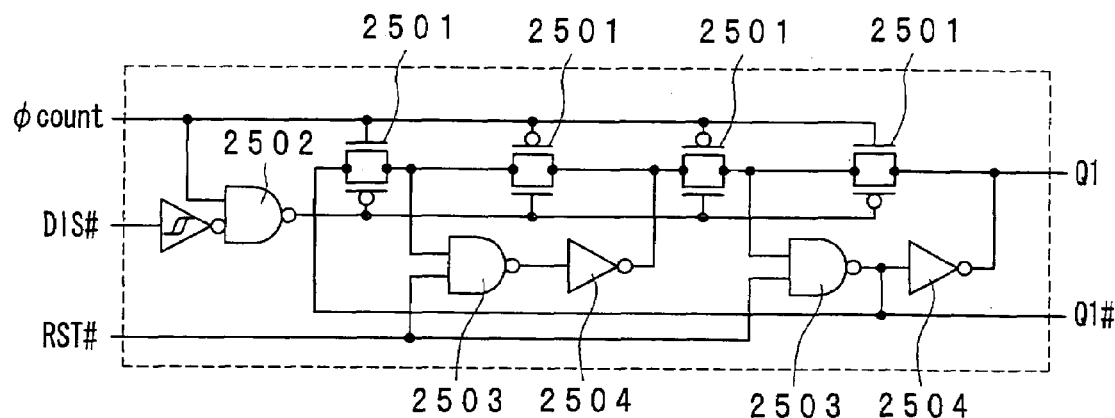
FIG. 31A is a circuit diagram showing an example of the first stage of a counter.
Figure 31B:
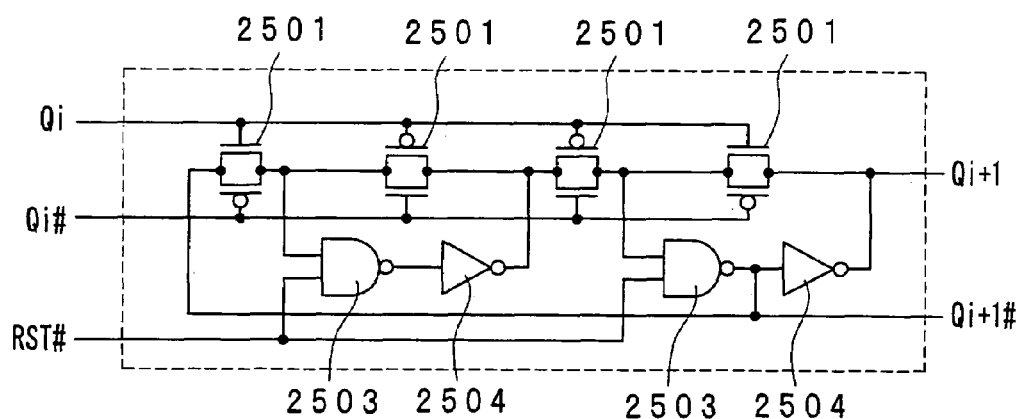
FIG. 31B is a circuit diagram showing an example of the 2nd to n stages of the counter.

FIGS. 31A and 31B are circuit diagrams showing an example of the counters 2106. In FIG. 31A, the reference numeral 2501 denotes CMOS transfer gates, 2502 denotes a NAND gate for switching the operations of the transfer gates based on the potential of DIS#, and 2503 and 2504 each denote NAND gates and inverters for resetting the transfer block based on the potential of RST#. In FIG. 31B, the reference numeral 2501 denotes CMOS gates, and 2503 and 2504 each denote NAND gates and inverters for resetting the transfer block based on the potential of RST#. FIG. 31A is a circuit diagram showing the first stage (least significant stage) of the counter, and FIG. 31B is a circuit diagram showing the second stage to the nth stage (which is a most significant stage) of the counter. As the clock proceeds from the first stage counter in FIG. 31A to the 2nd and subsequent stage counters, the clock is divided to make a count.

Next, at time t5, BLDIS is turned to the high level to start the discharge of the selected bit BL0, and a clock is input to øcount to start the counting operations of the counters 2106. In this connection, a precise agreement is not required between the time at which the BLDIS is turned to the high level and the time at which a clock is input to øcount. This is because, if the count values of the counters 2106 corresponding to the currents of the memory cells are relatively obtained, whether they are binary ones or multilevel ones can be determined. This determination is possible because the difference between Imax and Is+ is sufficiently large in general as compared with the resolutions of the counters 2106 in FIG. 34 described later.

As the counters 2106, typical up-counters as shown in FIGS. 31A and 31B may be used, or down-counters may be used. The counters 2106 of this embodiment each consist of n stages for n bits, and each of the stages is so designed that when one pulse ("H" and "L") is input from the preceding stage, it is inverted once ("H" to "L" or "L" to "H").

According to the magnitude of the cell current of the memory cell MC0, MC4, - - - corresponding to a selected bit line BL0, BL4, - - - , the bit line BL0, BL4, - - - is discharged. When the level of the bit line BL0, BL4, - - - becomes less than the reference voltage VREF+ΔV (ΔV is the offset voltage of the comparators 2105 and is usually of the order of ± a few mV) (at time t6 in FIG. 28), the comparator 2105 is reversed and the output DIS# becomes GND level. When DIS# becomes GND level, the counter 2106 stops the counting operation, and at this time the count value corresponding to the current of MC0 is held by the counter 2106. The count value indicates a period in which the potential of the bit line BL0, BL4, - - - drops from the charging voltage VBL to the reference voltage VREF+ΔV, that is, a discharge period. The discharge periods of the bit lines BL0, BL4, - - - are almost inversely proportional to the currents of the memory cell MC0, MC4, - - - connected with the bit lines. Thus, by obtaining the distribution of count values with respect to the bit lines BL0, BL4, the distribution of the cell currents of the memory cells MC0, MC4, - - - can be obtained.

The level of øcount becomes constant at GND level at the time when the number of pulses reaches 2n−1 and the counting operations of the counters of all the selected memory cells MC0, MC4, - - - are finished. After that, the operations of the column decoders 2107 are started at time t7 to read the count values for the memory cells MC0, MC4, - - - through CBUS. The circuits and their operations, etc. of the column decoders 107 may be typical ones applied to ordinary semiconductor memories.

Determination of Data of Memory Cell

Figure 32A:
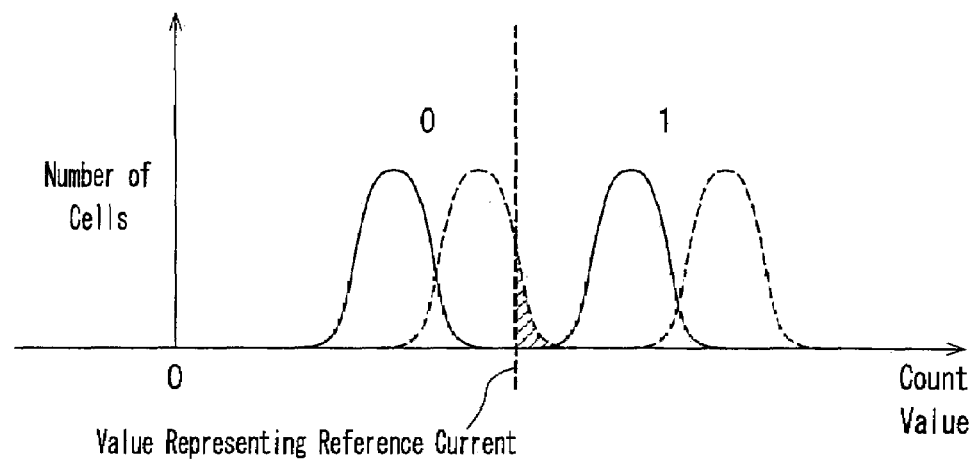
FIG. 32A illustrates a method of determining information from the distribution of cell current values using a reference current value.
Figure 32B:
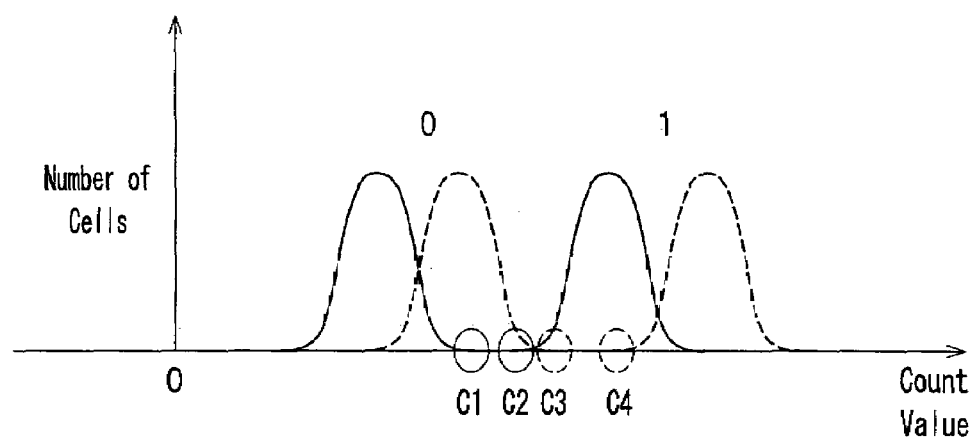
FIG. 32B illustrates a method of determining binary information from the distribution of cell current values of the semiconductor memory device of the embodiment.
Figure 32C:
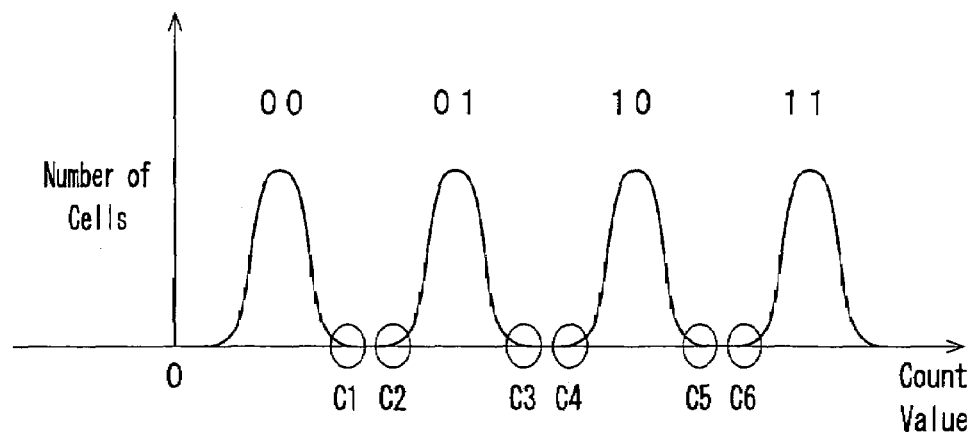
FIG. 32C illustrates a method of determining four-level, or four-valued information, from the distribution of cell current values in the semiconductor memory device of the embodiment.

FIGS. 32A to 32c show the distributions of cell current values measured with respect to a plurality of memory cells, using count values. In more detail, FIG. 32A shows a conventional method of determining information using a reference cell current value based on the distributions of cell current values (Note that cell current values and the reference current value are indicated by count values corresponding to them.), FIG. 32B shows a method of determining binary information from the distributions of count values used in the semiconductor memory device of this embodiment, and FIG. 32C shows a method of determining four-level information from the distributions of count values used in the semiconductor memory device of this embodiment.

Since the cell current of a memory cell is substantially inversely proportional to the discharge period of the bit line connected with the memory cell, the larger the count value on the horizontal axis, the smaller the cell current in FIGS. 32A to 32C. In FIGS. 32A to 32C, the information stored in a memory cell is data 0 when the cell current is large, and data 1 when the cell current is small. It is also said that the information is data 1 when the count value is small, and data 0 when the count value is large.

In a so-called NAND type nonvolatile memory, there is a case that cell current distributions are different between, for example, memory cells connected with different word lines, due to the difference in the amount of disturbance resulting from writing to an adjacent cell and the like, the difference in retention (retention property) or the difference in endurance (rewrite property), etc. in addition to the variation in the properties of the memory cells. In FIGS. 32A and 32B, it is indicated with solid lines and broken lines that cell current distributions (count value distributions) are different, with respect to two memory cells.

In a conventional method of determining information using reference cells, as shown in FIG. 32A, it is determined whether the information of each of the cells is 0 or 1 by comparing the current of the cell with a reference current R obtained using one or more reference cells. In FIG. 32A, cell currents are indicated by count values, and the reference current value R is indicated by a count value corresponding to the reference current value. There is a method using no reference cell but using a reference voltage generated from the power supply voltage. However, the method using a reference cell or cells is usually superior to the method using no reference cells in that a plurality of reference values can be finely set. In spite of this, in the conventional information determining method, information cannot be correctly determined with respect to memory cells having cell current distributions indicated by broken lines. That is, in the current distributions indicated by broken lines, the maximum values of the cell currents are larger than the reference current value R, so that information is incorrectly determined as 1 in spite of 0 with respect to the portion (diagonally shaded portions in FIG. 32A) beyond the reference current value R. In this case, if the cell currents of all the memory cells are shifted by the same amount by retention and/or endurance, this determination can be corrected to some extent by setting the average of current values of a plurality of reference cells showing similar retention and/or endurance as a reference current value. However, when the amounts of shift of cell currents vary between word lines, a reference cell should be provided every word line, thereby increasing the chip size. Furthermore, since the variation in cell currents can occur also between memory cells connected with the same word line, it is difficult to correct the reference current value.

In contrast to this, in this embodiment, count values indicating the discharge periods of the bit lines are counted by the counters 2106. The count values correspond to the currents of the memory cells. Thus, the distributions of cell current values in FIG. 32B can be grasped by summarizing the count values read from the memory cells. Based on the distributions of cell current values, information can be correctly determined. Specifically, the count values are input to a logic circuit to identify the value C1 or C2 with respect to the distribution of the count values indicated by solid line in FIG. 32B. The logic circuit corresponds to the threshold producing circuit according to the present invention. Using the value of C1 or C2, with respect to the memory cells related to the distributions of count values indicated by solid lines, it is determined that the information in the cells of count values less than C1 or C2 is data 0, and that the information in the cells of count values more than C1 or C2 is data 1. Furthermore, the value of C3 or C4 is identified with respect to the distributions of count values indicated by broken lines in FIG. 32B, and then it is determined that the information in the cells of count values less than C3 or C4 is data 0, and that the information in the cells of count values more than C3 or C4 is data 1. Thus, the information in the memory cells is determined using C1 or C2 and C3 or C4 as thresholds, which are end values of the distributions of count values indicating the distributions of the cell current values of the memory cells.

By making such a determination for each of a plurality of memory cells connected with the same word line, for example, even if the distributions of cell currents (distributions of count values) are different between word lines or vary with time and are shifted, the information can be correctly determined without using any reference cell. Since no reference cell is required, the chip area can be reduced. In addition to setting one threshold for memory cells connected with the same word line, one threshold may be set for memory cells included in a predetermined block.

FIG. 32C shows the distributions of the cell current values (count values) of a plurality of memory cells for storing multilevel information. Using FIG. 32C, a method of determining information based on cell current values (count values) will be described with respect to a plurality of memory cells for storing four-level information. These memory cells store four values of data 00, data 01, data 10, and data 11. As shown in FIG. 32C, the distributions of count values are obtained with respect to, for example, a plurality memory cells connected with a same word line. The count values are distributed such that four consecutive distributions adjacent to each other exist with a predetermined gap between them. With respect to three gaps between the four consecutive distributions, the values C1, C3, and C5 at one end of the gaps are identified. Alternatively, the values C2, C4, and C6 at the other end of the gaps may be identified. Next, when a count value is less than C1 (or C2), it is determined that the information is data 00. When a count value is larger than C1 (or C2) and less than C3 (or C4), it is determined that the information is data 01. When a count value is larger than C3 (or C4) and less than C5 (or C6), it is determined that the information is data 10. When a count value is larger than C5 (or C6), it is determined that the information is data 11. As in the case of binary information shown in FIG. 32B, with respect to memory cells of four-level information, even if the distributions of cell currents are different between word lines or vary with time and are shifted, the information can be correctly determined using no reference cells. In addition, since the reference cells can be dispensed with, the chip area can be reduced.

Figure 33:
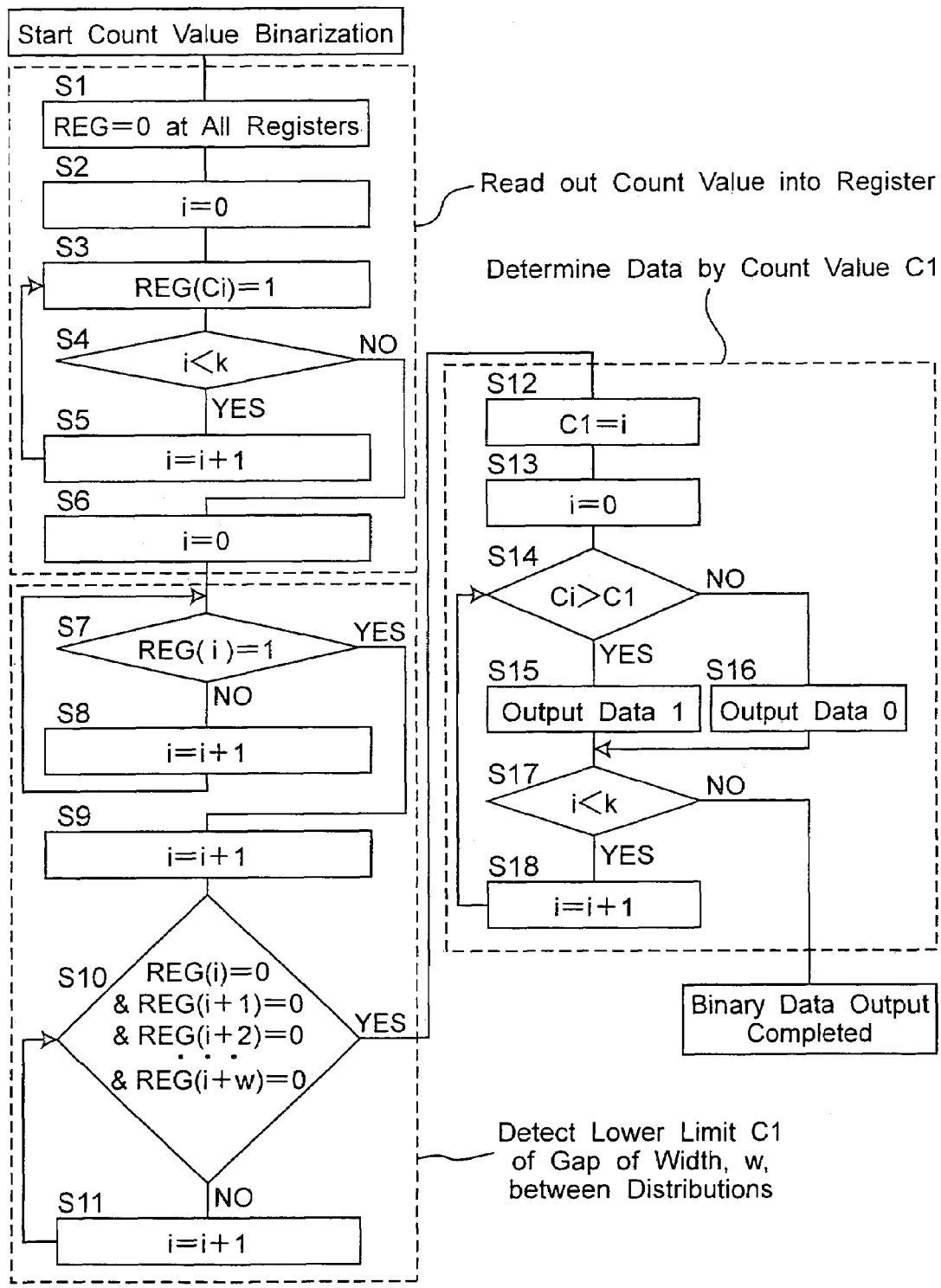
FIG. 33 shows an example of an algorithm for a logic circuit for determining the binary information shown in FIG. 32B.

FIG. 33 shows an example of an algorithm for the logic circuit to make the determination of the binary information shown in FIG. 32B. In this algorithm, the number of the counters is set to k, and the count value held in the ith counter is set to Ci. The number of registers provided in each of the counters is $2^n$ corresponding to the number of values of the counter, and the value of the Cith register is represented as REG (Ci). The number of count representing a gap between two distributions corresponding to data 0 and data 1 is set to at least 4. Furthermore, it is assumed that a gap of 4 or more counts is not included in each of the distributions corresponding to data 0 and data 1 (that is, 4 or more consecutive count values not corresponding to any memory cells do not exist in the distributions). An algorithm to be used in this embodiment is not limited to the shown algorithm provided that it is capable of outputting a count value read to CBUS as binary data. Furthermore, there is no limitation also about a logic circuit for realizing such an algorithm in the present invention.

In this algorithm of FIG. 33, at first, the values of all the registers are set to 0 at step S1, and then 1 is input to a register or registers corresponding to a count value, in succession with respect to the 0th counter to the kth counter (steps S2 to S5). As a result, the values of the registers which correspond to the count value are set to 1, and the values of the registers which do not correspond to the count value remain 0. Next, it is determined in succession from the 0th register whether the value of the register is 1 (steps S6 to S8), and when a register the value of which is 1 is detected, it is determined whether the values of the subsequent four registers are 0 (steps S9 to S11). When there are four consecutive registers having the value of 0, count values corresponding to these four consecutive registers are set to C1 (S12). Then, the count value of the ith counter is compared with C1 (S13, S14). When the count value C1 is larger than C1, data 1 is output (S15), while when the count value C1 is less than C1, data 0 is output (S16). This data outputting based on a count value is repeated until i becomes k (S17, S18). According to the above algorithm, data 0 or data 1 is determined from k count values and is output.

Accuracy of Count Value

In this embodiment, the time between the start of the discharge of a bit line and the reverse, or inversion of a comparator 2105 which compares the potential of the bit line with a reference value is counted by the n-bit counter 2106. In order to improve the accuracy of count values which are count results of the counters 2106, there are four methods described below.

The first is a method of increasing the number of bits of the counter 2106. When the number of bits of the counters 2106 is increased, the accuracy is doubled every time the number of bits increases by 1. However, since the discharge time of a bit line is usually dependent on the property of a memory cell, it is preferable that the counters complete counting from 0 to $2^n$ during the discharge time. In this case, the frequency of the pulses of the clock øcount of the counters must be increased, thereby increasing the power consumption of the counters, which should be kept within the allowable range of the power supply of the semiconductor.

The second is a method of increasing the capacitance of bit lines to thereby increase the discharge time of them. In this embodiment, as shown in FIG. 28, capacitive elements 2108 are connected between the bit lines and the comparators. For example, when the cell current of a memory cell is 10 μA, the parasitic capacitance CB of the bit line is 0.5 μF, and the charging voltage VBL is 1.2 V, it takes about 60 ns for the voltage of the bit line to fall to VBL/e≈0.44 V. In this case, the capacitive elements 2108 of 0.5 pF are provided and thereby the discharge time is doubled to be about 120 ns, so that the number n of bits of each of the counters can be increased by 1 to double the accuracy without increasing the frequency of the clock pulses of the counters, in other words, without increasing the power consumption of the counters.

The third is a method of increasing the resistances of the bit lines, etc. to increase the discharge time. Since the discharge time of a bit line is almost inversely proportional to a cell current, the larger the cell current, the shorter the discharge time becomes, and thereby the accuracy deteriorates. For this reason, as shown in FIG. 29, by connecting transistors TRa to the bit lines BLi, BLi+1, - - - and controlling their sizes and/or the gate voltage VDB, the currents flowing through the transistors TRa are set between the maximum value and the minimum value of cell currents to be measured. Because of this, the accuracy deterioration resulting from the variation in cell currents can be prevented, while increasing the discharge time of the bit lines. Furthermore, by reducing the sizes of the transistors TRb which are provided in the bit-line charging and discharging circuit 2101 to control the discharges of the bit lines, instead of providing the transistors TRa, it can be prevented that the discharge times of the bit lines become long and the accuracy deteriorates due to the variation in cell currents. The transistors of the bit-line charging and discharging circuit are usually set to allow current sufficiently larger than the cell current to flow. Reducing the sizes of the transistors TRb of the bit-line charging and discharging circuit 2101 is preferred to providing the transistors TRa separately because the circuit can be simplified and the chip area can be reduced.

Figure 34:
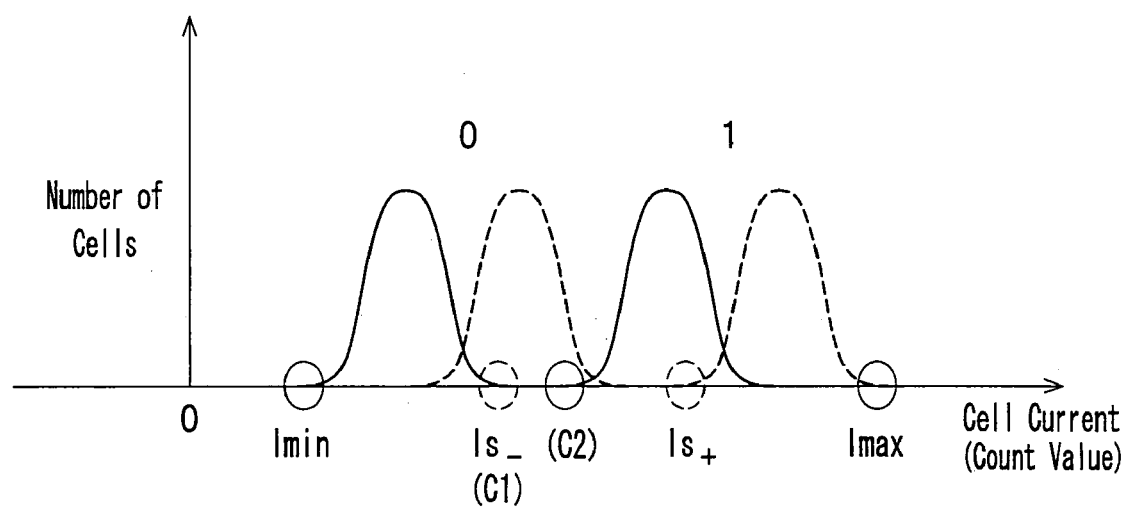
FIG. 34 illustrates the variation in the cell currents of a plurality of memory cells.

The fourth is a method of restricting the measurement range of cell currents. As shown in FIG. 34, when the upper limit Imax to the lower limit Imin of the distributions of the cell currents are counted with n bits with respect to a plurality of memory cells having the variation in the cell currents, the resolution Ires is $(Imax-Imin)/2^n$. The resolution needs to be less than the difference between the most adjacent cell currents (i.e., (C2−C1) in count value) corresponding to data (data 0 and data 1 in binary data) to be determined. In consideration of the maximum variation in the cell currents, in FIG. 34, the current values larger than Is+ definitely represent the highest-level data ("1" in binary data, "11" in four-level data, "111" in eight-level data), and the current values less than Is− definitely represent the lowest-level data ("0" in binary data, "00" in four-level data, "000" in eight-level data), so that the resolution Ires can be improved to $(Is+-Is-)/2^n$ by restricting the detection range to a range between Is+ and Is−. The relation between the measurement range of cell currents and the resolution is the same as that between the measurement range of count values and the resolution although the magnitudes of values are reversed.

Modification using A/D Converters

Figure 38:
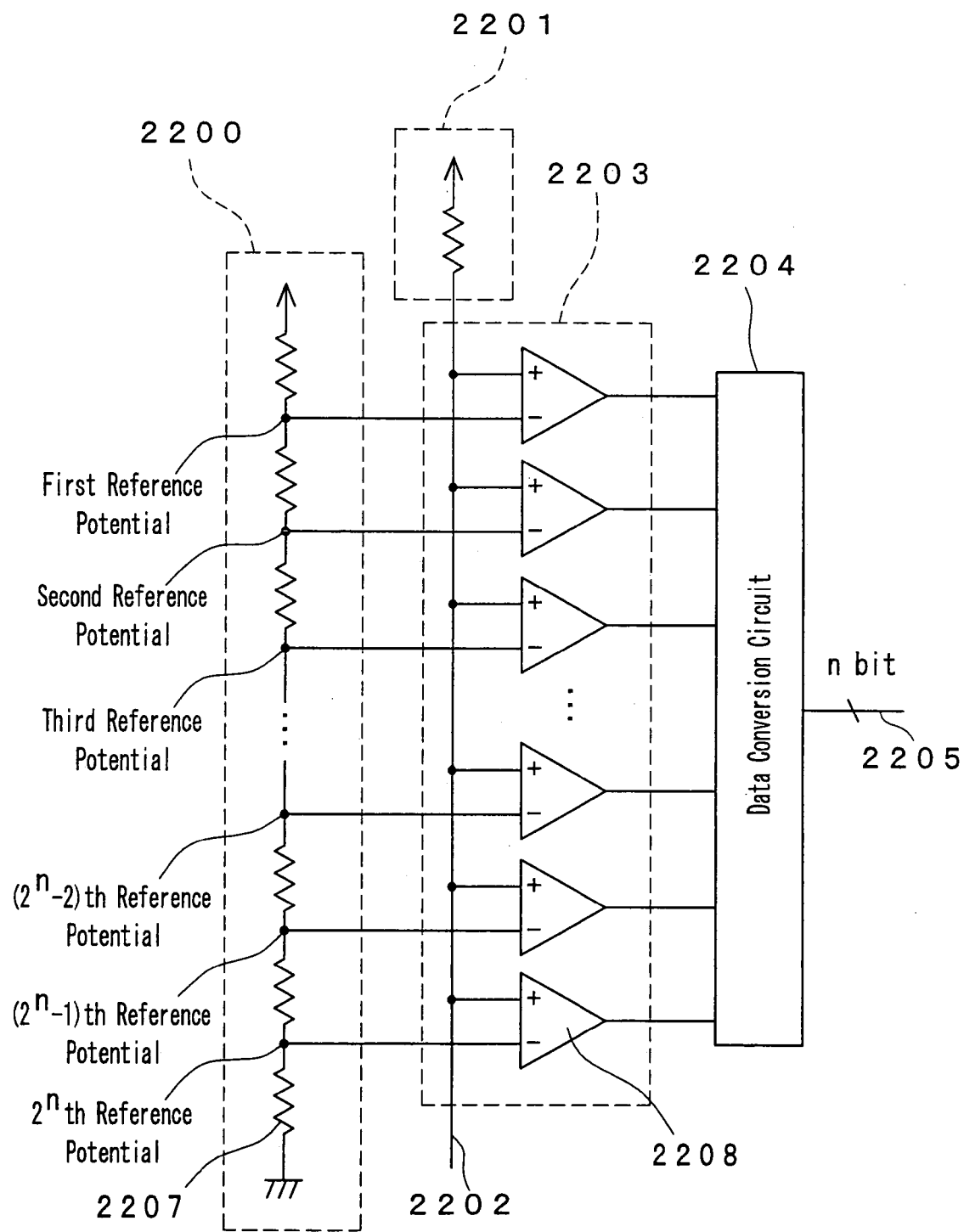
FIG. 38 shows an A/D converter as a cell current related value read circuit.

In the above embodiment, the comparators 2105 and the counters 2106 are provided as the cell current related value read circuit according to the present invention, but A/D converters may be provided as the cell current related value read circuit. That is, in the semiconductor memory device of FIG. 27, A/D converters as shown in FIG. 38 are connected to output lines of the bit-line selecting circuits 2104 instead of the comparators 2105 and the counters 2106. The A/D converters are flash-type A/D converters which convert the potentials of bit lines selected by the bit-line selecting circuits 2104 to digital signals with predetermined timing and output the signals to the bus line CBUS. The information stored in the memory cells is determined using values of the bit line potentials outputted from the A/D converters as the values related to currents flowing through memory cells according to the present invention.

As already described, with respect to a time required for a predetermined charged potential of a bit line to become a reference potential after starting the discharge, the time is shorter when the bit line is a bit line connected with a large-current memory cell than when the bit line is a bit line connected with a small-current memory cell. With respect to the potentials of bit lines during the discharge, the potential of a bit line through which a large cell current flows is less than the potential of bit line through which a small cell current flows. Thus, a cell current and a bit line potential during discharge are almost inversely proportional to each other. That is, this relation is similar to the relation between a cell current and a count value detected by the counter 2106. Because of this, the information stored in memory cells can be determined using bit line potentials detected by the A/D converters instead of count values detected by the counters 2106.

The A/D converters each comprises, as shown in FIG. 38, a reference potential generating circuit 2200, a comparison circuit 2203, a bias circuit 2201, and a data conversion circuit 2204. The reference potential generating circuit 2200 has $2^n+1$ resistors 2207 in series and generates first to $2^n$th reference potentials between the resistors 2207. The comparison circuit 2203 has $2^n$ comparators 2208, of which the minus (−) input terminals are connected with the first to the $2^n$ th reference potentials of the reference potential generating circuit 2200, respectively. The plus (+) input terminals of the $2^n$ comparators 2208 are connected with the output line of the bit-line selecting circuit 2104 via the input line 2202. The input line 2202 is connected with the bias circuit 2201. The data conversion circuit 2204 outputs an n-bit signal indicative of the bit-line potential data to the bus line CBUS through the output line 2205 based on the outputs of the $2^n$ comparators 2208.

The semiconductor memory device having the A/D converters determines the information in the memory cells as follows. That is, like the above embodiment, all the bit lines BL0, BL1, - - - are charged by the bit-line charging and discharging circuits 2101, and only the bit lines BL0, BL4, - - - selected by the bit-line selecting circuits 2104 are connected to the A/D converters. Then, discharge of the selected bit lines BL0, BL4, - - - is started. After a predetermined period has passed from the start of the discharge, signals indicating the values of the potentials of the bit lines BL0, BL4, - - - are output from the data conversion circuits 2204 of the corresponding A/D converters to the bus line CBUS. By the logic circuit connected with the bus line CBUS, thresholds for determining the information in the memory cells connected with the bit lines BL0, BL4, - - - are obtained based on the distributions of the potentials of the bit lines BL0, BL4, - - -. In more detail, like the distributions of count values in FIG. 32C, the potentials of the bit lines BL0, BL4, - - - are plotted on the horizontal axis, and the numbers of the memory cells MC00, MC04, - - - connected with the bit lines BL0, BL4, - - - are plotted on the vertical axis, in order to grasp the distribution of the numbers of the memory cells MC00, MC04, - - - to the potentials of the bit lines BL0, BL4, - - - . In these distributions, according to the information stored in the memory cells MC00, MC04, - - - , there are peaks the number of which is equal to the number of values of the information (i.e., two for the binary data and 4 for the four-valued data). From the potentials corresponding to the bottoms of the distributions (potentials corresponding to C1 to C6 in FIG. 32C), thresholds for determining the information are decided. Based on the thresholds, the information in the memory cells MC00, MC04, - - - connected with the bit lines BL0, BL4 is determined from the potentials of the bit lines BL0, BL4, - - - .

As described above, the relations between the potentials of the bit lines detected by the A/D converters and the cell currents of the memory cells MC0, MC04, - - - are similar to the relations between the above count values and the cell currents of the memory cells MC0, MC04. Thus, the information in the memory cells MC00, MC04, - - - can be determined using the A/D converters as in the case of detecting the count values. The A/D converters may be of, for example, pipeline type, successive approximation type, or the like, other than flash type ones.

ELEVENTH EMBODIMENT

Figure 35:
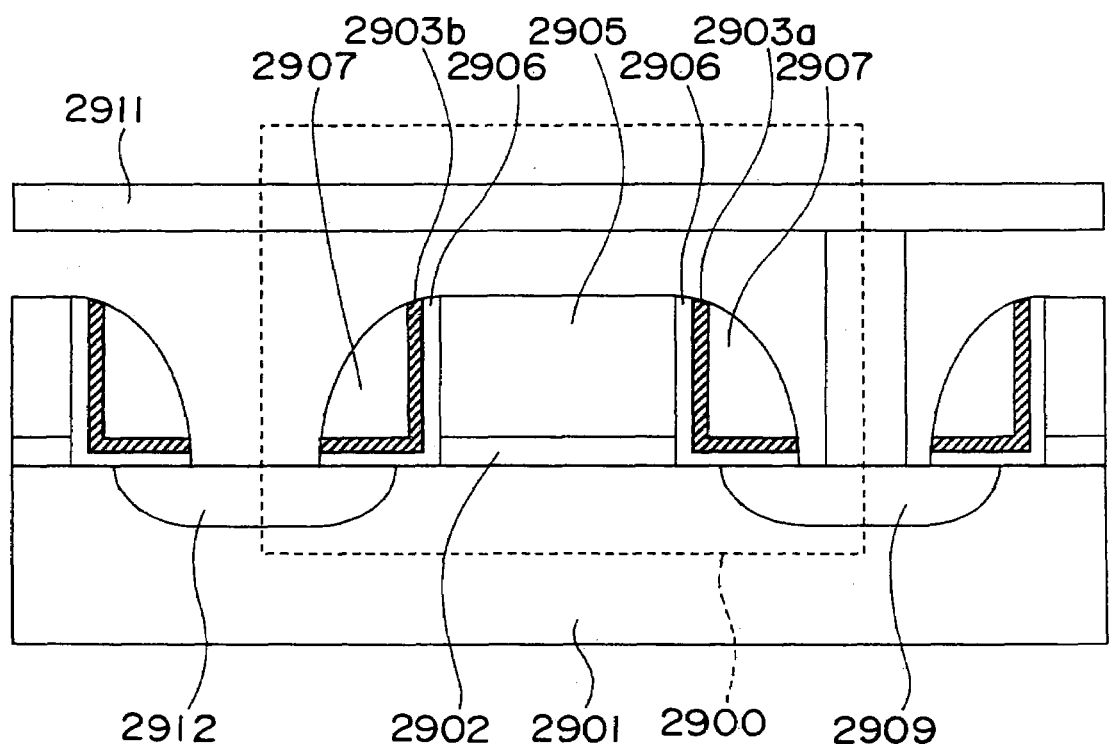
FIG. 35 is a cross-sectional view showing a semiconductor memory device of an eleventh embodiment.

FIG. 35 is a cross-sectional view of a side-wall memory constituting a memory cell 2900 included in a semiconductor memory device of an eleventh embodiment of the present invention. In FIG. 35, the reference numeral 2901 denotes a substrate, the reference numeral 2902 denotes a gate insulation film, the reference numeral 2905 denotes a word line, the reference numerals 2903a and 2903b denote first and second silicon nitride films, the reference numerals 2906 and 2907 denote silicon oxide films, the reference numeral 2909 denotes a diffusion layer, and the reference numeral 2911 and 2912 denote first and second bit lines. The side-wall memory shown in FIG. 35 is similar to the side-wall memory of the fourth embodiment shown in FIG. 14 in structure and function. Therefore, with respect to the details of the shape, function and connections of the constituent parts of the side-wall memory of FIG. 35, the relevant description made in connection with the fourth embodiment is also applied to this embodiment and no description will be provided here. Writing to this memory cell can be carried out using, for example, the method described with respect to the fourth embodiment.

In the semiconductor memory device configured as above, when reading the information stored in the first silicon nitride film 2903a, the first bit line 2911 is set to GND level, and a predetermined voltage is applied to the second bit line 2912. At this time, the cell current flowing through the channel region is mainly dependent on the information stored in the first silicon nitride film 2903a, that is, the charge stored in the first silicon nitride film 2903a.

Figure 36:
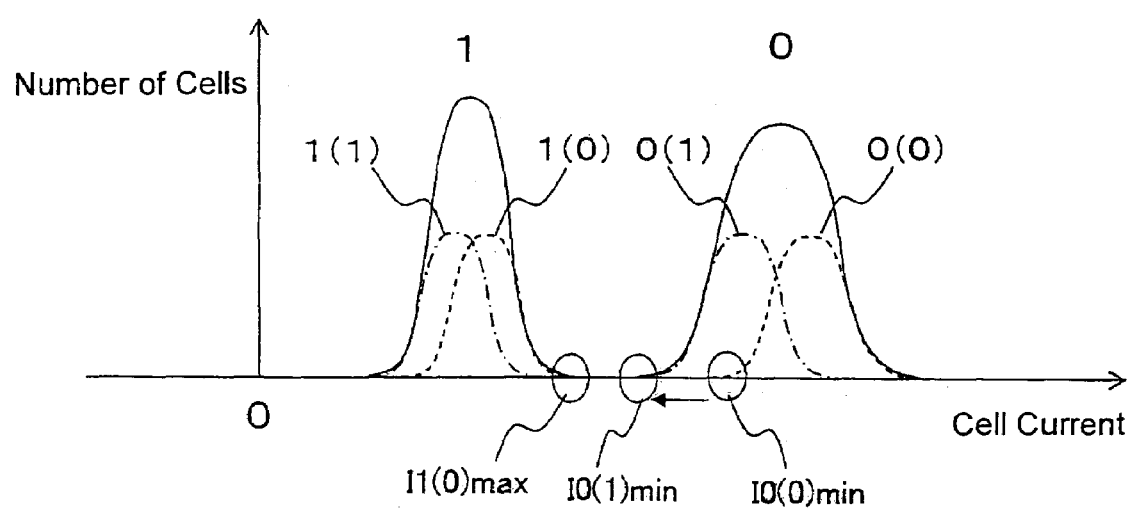
FIG. 36 illustrates the state that the cell current flowing when reading the information stored in a first silicon nitride film is affected by the information stored in a second silicon nitride.

However, the cell current is also affected by the charge stored in the second silicon nitride film 2903b. FIG. 36 illustrates the state that cell current flowing when reading the information stored in the first silicon nitride film 2903a is affected by the information stored in the second nitride film 2903b. In FIG. 36, the horizontal axis indicates cell currents, and the vertical axis indicates the number of memory cells wherein the state that cell currents are large is indicated as information 1, and the state that cell currents are small is indicated as information 0.

As shown in FIG. 36, there are two mountain-shape distributions of cell currents, one of which is obtained when the information stored in the silicon nitride film 2903a is 1, and the other one of which is obtained when the information stored in the silicon nitride film 2903a is 0, and each of the mountain-shape distributions is divided into two mountain-shape distributions, one of which is obtained when the information stored in the second nitride film 2903b is 1, and the other one of which is obtained when the information stored in the second nitride film 2903b is 0. The mountain-shape distributions obtained by the divisions according to the information stored in the second silicon nitride film 2903b are indicated by the broken lines and the alternate long and short dashed lines. The distributions indicated by the broken lines are obtained when the information stored in the second nitride film 2903b is 0, and the distributions indicated by the alternate long and short dashed lines are obtained when the information stored in the second nitride film 2903b is 1. Hereinafter, the mount-shape distribution obtained when the information stored in the first silicon nitride film 2903a is 1 and the information stored in the second silicon nitride film 2903b is 1 is called distribution 1(1), and the mount-shape distribution obtained when the information stored in the first silicon nitride film 2903a is 1 and the information stored in the second silicon nitride film 2903b is 0 is called distribution 1(0). Furthermore, the mount-shape distribution obtained when the information stored in the first silicon nitride film 2903a is 0 and the information stored in the second silicon nitride film 2903b is 1 is called distribution 0(1), and the mount-shape distribution obtained when the information stored in the first silicon nitride film 2903a is 0 and the information stored in the second silicon nitride film 2903b is 0 is called distribution 0(0).

As shown in FIG. 36, when the information stored in the second silicon nitride film 2903b is 0, the minimum difference in cell current between information 0 and information 1 of the silicon nitride film 2903a is I0(0)min−I1(0)max, which is a difference between the maximum value I1(0)max of the 1(0) distribution and the minimum value I0(0)min of the 0(0) distribution. If the information stored in the second nitride film 2903b is 1 when the information stored in the first silicon nitride film 2903a is 0, the minimum difference in cell current between information 0 and information 1 in the first silicon nitride film 2903a is I0(1)min−I1(0)max. When the information stored in the first silicon nitride film 2903a is 0, the value of a cell current flowing when the information stored in the second silicon nitride film 2903b is 1 is less than the value of a cell current flowing when the information stored in the second silicon nitride film 2903b is 0, so that the value of the minimum difference I0(1)min−I1(0)max is less than the value of the minimum difference I0(0)min−I1(0)max. That is, the range of cell currents in which a threshold is to be set between information 1 and information 0 becomes small. In addition to this, in a conventional determining method using a reference cell current, since there is a variation in current values every word line, the probability of a threshold being set to a value departing from the cell current range of between information 1 and information 0 extremely increases, and it follows that the accuracy of determining whether information is 0 or 1 is reduced.

In contrast to this, in this embodiment, the distributions of cell currents shown in FIG. 36 are detected as count values by a counter to detect the values of I1(0)max and I0(1)min. Then, it is determined that currents not less than I1(0)max are information 1 and currents not more than I0(1)min are information 0. Thus, even if the range of cell current values between information 1 and information 0 is narrow, or there is a variation in current values every word line, the information stored in the first silicon nitride films 2903 can be correctly determined.

Memory cells for a mask ROM may be used in the tenth and eleventh embodiments provided that information stored therein is determined based on the values of cell currents. Furthermore, the kind of memory may be any of NOR type, NAND type, AND type, DINOR type, etc., and charges for information storage may be stored in any of semiconductor nitride films, floating gates made of semiconductor, etc. In addition, the bit line system may be any of a fixed grounding system and a virtual grounding scheme. Furthermore, the information stored in the memory cells is not limited to binary information, and the present invention may be applied to multi-valued information other than binary information. Although the counters 2106 count discharging time, it is also applicable that the information stored in the memory cells is read by charging selected bit lines and the counters 2106 count charging time required for charging the bit lines to a predetermined voltage. Furthermore, the information stored in the memory cells may be read using values of bit line potentials detected by the A/D converters instead of count values detected by the counters.

TWELFTH EMBODIMENT

Figure 37:
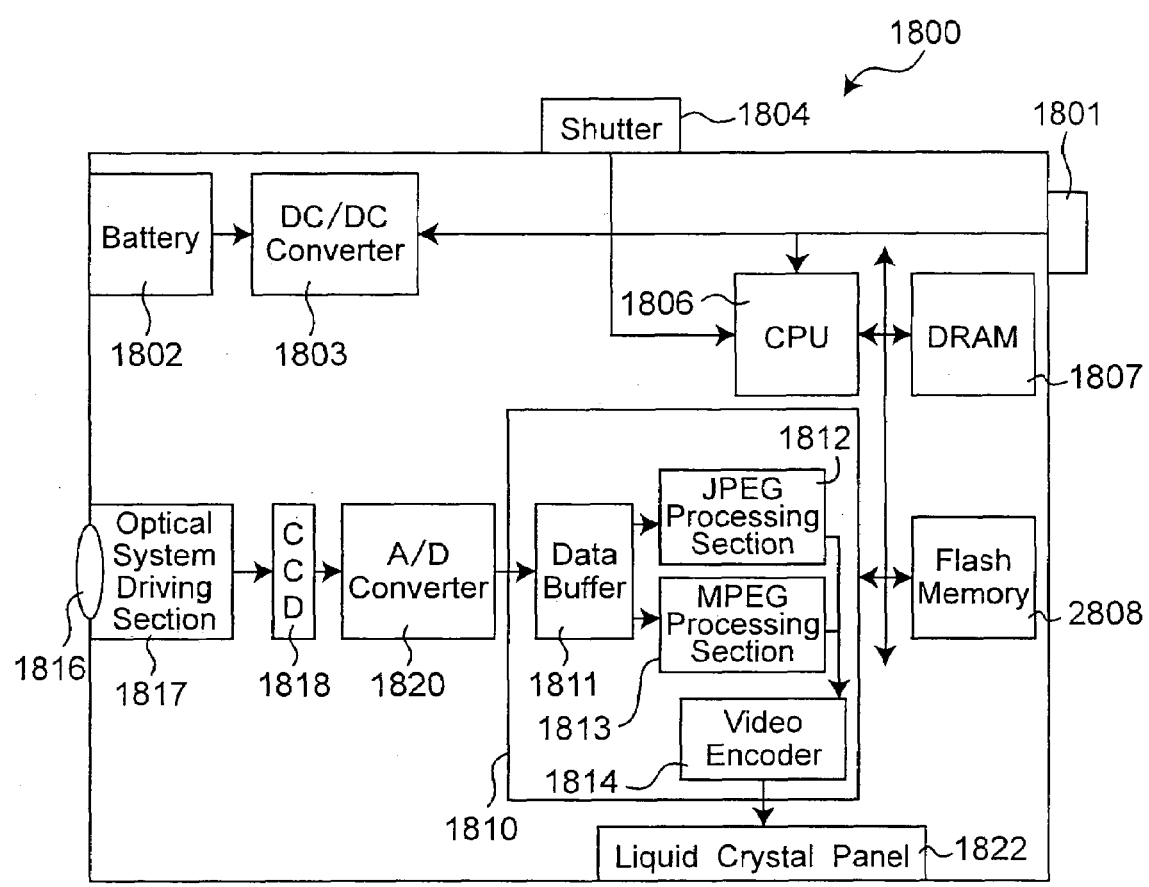
FIG. 37 is a block diagram showing a digital camera as electronic equipment of a twelfth embodiment.

FIG. 37 is a block diagram showing a digital camera as electronic equipment of a twelfth embodiment of the present invention. The digital camera has a flash memory 2808 as a semiconductor memory device according to the present invention, in which captured images are stored. Since the basic configuration excluding the flash memory is the same as that of the digital camera in FIG. 26, the same reference notations as those used in FIG. 26 are used for the components other than the flash memory 2808 in FIG. 37 and the detailed description thereof is omitted.

Since the flash memory 2808 has a capacity large enough to store image information, voice information, etc. having a large amount of information, bulk data write, read, and erasure are performed. In the flash memory 2808 consisting of a semiconductor memory device according to the present invention, when data in memory cells connected with one word line are read by a series of accesses, time required for the first access, which is an access time until the leading data is output, is longer than that in an ordinary DRAM by the order of about 100 ns to a few micro seconds. This is because, time for setting thresholds for identifying binary or multilevel (i.e., multivalued) information based on count values is required. However, in the second and subsequent accesses of the series of accesses, the thresholds based on the count values have already been decided, so that count values read from the memory cells can be output while being converted to binary or multilevel values. Thus, in the second and subsequent accesses, information can be output within an access time period (about 10 ns to a few tens of ns)

similar to that of the DRAM. As a result of this, since the first access time is relatively short as compared with the total access time of the second and subsequent accesses, the memory can be accessed within a time period nearly equal to that of the DRAM, in terms of the average access time of one memory cell. For example, when the time required for the first access is 1 μs, the time required for the second or subsequent access of one memory is 30 ns, and 256 memory cells are read per word line by the series of accesses, (1 μs+30 ns×255)/256≈34 ns is the average access time of one memory cell. As described above, by applying the present invention to electronic equipment in particular in which a relatively large amount of data such as image data is read, high speed access similar to that for a DRAM can be realized for a flash memory, and thus electronic equipment operating at high speed can be obtained.

In addition, it is required to reduce the chip area of the flash memory 2808 of the above digital camera in order to lower the cost per bit of it, and it is required to lower the power consumption in order to reduce the size of the battery 1802 and elongate the continuous operation time of it. In addition, since the quality of image stored in the flash memory 2808 deteriorates due to an error of only one pixel, the reliability of data during data write must be increased. In addition, the reliability of data during long storage of it must be also increased. Furthermore, when image data is stored in the flash memory of other electronic equipment such as a mobile telephone, communication protocols are stored along with the image data, and therefore high reliability is required of the flash memory.

In the flash memory 2808 of this embodiment, neither conventional reference cells nor a circuit for adjusting the cell currents of the reference cells is required, and thereby the chip area and the power consumption can be reduced. Furthermore, even if cell currents vary between word lines or vary with time, information in the memory cells can be correctly read. Consequently, with respect to electronic equipment comprising a semiconductor memory device according to the present invention, cost-reduction, downsizing, and high reliability can be achieved. The electronic equipment is not limited to a digital camera or a mobile telephone, and may be any electronic equipment such as a digital voice recorder, music recording and reproducing equipment, or the like. A semiconductor memory device provided in the electronic equipment may be of a type reading the information stored in the memory cells using bit line potentials detected by A/D converters instead of count values detected by counters.

The data writing methods and specific configurations for implementing them described in the first to ninth embodiments, and the data reading methods and specific configurations for implementing them described in the tenth to twelfth embodiments may be used in appropriate combination.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor memory device, comprising:
   a memory cell array in which a plurality of nonvolatile memory cells are arranged, the nonvolatile memory cells each having input and output terminals and a control terminal;
   bit lines connected with the input and output terminals of the plurality of memory cells by a virtual grounding scheme;
   word lines connected with the control terminals of the memory cells;
   a word line selecting circuit selecting one of the word lines;
   a write voltage applying circuit applying voltages to the bit lines associated with the memory cells; and
   a write voltage control circuit controlling the write voltage applying circuit such that for each of memory cells, to which writing is to be carried out at the same time, of all the memory cells connected with the word line selected by the word line selecting circuit, different voltages are applied to two bit lines associated with the memory cell, while for each of other memory cells, to which writing is not to be carried out, a same voltage is applied to two bit lines associated with the memory cell.

2. A semiconductor memory device as claimed in claim 1, wherein the memory cells of the memory cell array are asymmetrical memory cells, and the semiconductor memory device further comprising:
   a conversion section converting, under the control of the write voltage control circuit, input information to two or more pieces of conversion information capable of being written into the memory cells which are connected with the word line selected by the word line selecting circuit and to which writing is to be carried out at the same time.

3. A semiconductor memory device as claimed in claim 2, wherein the memory cells are side-wall memory cells.

4. A semiconductor memory device as claimed in claim 2, further comprising:
   a write detection circuit detecting completion of writing to memory cells; and
   a conversion information renewal circuit instructing the conversion section, when the write detection circuit detects the completion of writing to a memory cell, to output the conversion information which does not allow writing to the memory cell to which writing has been completed, while continuously allowing writing to memory cells to which writing has not been completed.

5. A semiconductor memory device as claimed in claim 2, wherein conversion information obtained by conversion in the conversion section defines that the number of memory cells to which writing is carried out at the same time by the write voltage control circuit is two or less.

6. A semiconductor memory device as claimed in claim 2, wherein the memory cell array includes redundancy memory cells, the memory device further comprising:
   a redundancy added information output section identifying the input information converted to a predetermined number of pieces of the conversion information or more by the conversion section and outputting, with respect to the input information, identification information converted to less than a predetermined number of pieces of conversion data by the conversion section and redundancy data indicating the existence of the identification information,
   the redundancy information being to be written into the redundancy memory cells.

7. A semiconductor memory device as claimed in claim 6, wherein the predetermined number is an integer nearest n/2 when the input information is n-bit information, where n is a natural number of 4 or more.

8. A semiconductor memory device as claimed in claim 7, wherein the redundancy added information output section has a table in which the input information and the identification information are stored in association with each other.

9. A semiconductor memory device as claimed in claim 2, wherein the conversion section has a table in which the input information and the conversion information are stored in association with each other.

10. A semiconductor memory device as claimed in claim 1, further comprising:
a write detection circuit detecting completion of writing to memory cells; and
a voltage reset circuit instructing the write voltage control circuit, when the write detection circuit detects the completion of writing to a memory cell, to reset a voltage to be applied to the memory cell to which writing has completed, to a voltage which does not allow writing.

11. Electronic equipment, comprising the semiconductor memory device as claimed in claim 1.

12. A semiconductor memory device, comprising:
a memory cell array in which a plurality of nonvolatile memory cells are arranged, the nonvolatile memory cells each having input and output terminals and a control terminal;
word lines connected with the control terminals of the memory cells;
bit lines connected with the input and output terminals of the memory cells;
a cell current related value read circuit reading values related to currents flowing through a predetermined number of memory cells in the memory cell array;
a threshold producing circuit producing a threshold to identify information stored in the memory cells, based on distribution of the values read by the cell current related value read circuit; and
an information determining circuit determining the information stored in the predetermined number of memory cells using the threshold produced by the threshold producing circuit.

13. A semiconductor memory device as claimed in claim 12, further comprising:
a word line selecting circuit selecting a word line; and
a bit line charging and discharging circuit charging or discharging the bit lines, wherein
the cell current related value read circuit comprises an A/D converter which is connected with the bit lines and outputs the potentials of the bit lines.

14. A semiconductor memory device as claimed in claim 13, wherein bits of the A/D converter are larger in number than bits of the information stored in the memory cells.

15. A semiconductor memory device as claimed in claim 13, wherein the threshold producing circuit produces the threshold based on adjacent bit line voltage values that have a largest gap therebetween, of all adjacent bit line voltage values of bit lines connected with the plurality of memory cells measured by the A/D converter.

16. A semiconductor memory device as claimed in claim 13, wherein the threshold producing circuit produces the threshold based on values at ends of distributions of continuous bit line voltage values of bit lines connected with the plurality of memory cells.

17. A semiconductor memory device as claimed in claim 13, wherein the bit line charging and discharging circuit includes a resistive element having a resistance between a maximum resistance and a minimum resistance, inclusive, of the memory cells when turned on.

18. A semiconductor memory device as claimed in claim 12, further comprising:
a word line selecting circuit selecting a word line; and
a bit line charging and discharging circuit charging or discharging the bit lines, wherein
the cell current related value read circuit includes:
a comparator which is connected with the bit lines and compares the potentials of the bit lines and a reference value; and
a counter performing counting, based on the output from the comparator, to generate count values indicating discharging periods or charging periods during which the potentials of the bit lines become a predetermined potential.

19. A semiconductor memory device as claimed in claim 18, wherein bits of the counter are larger in number than bits of information stored in the memory cells.

20. A semiconductor memory device as claimed in claim 18, wherein the threshold producing circuit produces the threshold based on adjacent count values that have a largest gap therebetween, of all adjacent count values of the plurality of memory cells counted by the counter.

21. A semiconductor memory device as claimed in claim 18, wherein the threshold producing circuit produces the threshold based on values at ends of distributions of continuous count values of the plurality of memory cells counted by the counter.

22. A semiconductor memory device as claimed in claim 18, wherein an operation of starting comparison between the potential of a bit line and a reference value by the comparator and an operation of starting generating the count value by the counter are synchronized.

23. A semiconductor memory device as claimed in claim 18, wherein an operation of inverting the output of the comparator and stopping of the counting of the counter are synchronized.

24. A semiconductor memory device as claimed in claim 18, wherein the bit line charging and discharging circuit includes a resistive element having a resistance between a maximum resistance and a minimum resistance, inclusive, of the memory cells when turned on.

25. A semiconductor memory device as claimed in claim 12, wherein capacitive elements are connected with the bit lines.

26. A semiconductor memory device as claimed in claim 12, wherein resistive elements having resistances between a maximum resistance and a minimum resistance, inclusive, of the memory cells when turned on are connected with the bit lines.

27. A semiconductor memory device as claimed in claim 12, wherein the memory cells include side-wall memory cells.

28. Electronic equipment, comprising the semiconductor memory device as claimed in claim 12.

* * * * *